US010211592B1

(12) United States Patent
Villeneuve et al.

(10) Patent No.: US 10,211,592 B1
(45) Date of Patent: *Feb. 19, 2019

(54) FIBER LASER WITH FREE-SPACE COMPONENTS

(71) Applicant: LUMINAR TECHNOLOGIES, INC., Orlando, FL (US)

(72) Inventors: Alain Villeneuve, Mont-Royal (CA); Jason M. Eichenholz, Orlando, FL (US); Laurance S. Lingvay, Orlando, FL (US)

(73) Assignee: LUMINAR TECHNOLOGIES, INC., Orlando, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/985,486

(22) Filed: May 21, 2018

Related U.S. Application Data

(63) Continuation of application No. 15/828,236, filed on Nov. 30, 2017, now Pat. No. 10,003,168.

(Continued)

(51) Int. Cl.
| | | |
|---|---|---|
| *H01S 3/09* | (2006.01) | |
| *H01S 3/094* | (2006.01) | |
| *G01S 7/48* | (2006.01) | |
| *H01S 5/00* | (2006.01) | |
| *G02B 27/09* | (2006.01) | |
| *H01S 3/08* | (2006.01) | |
| *H01S 3/00* | (2006.01) | |
| *H01S 3/067* | (2006.01) | |

(Continued)

(52) U.S. Cl.
CPC ...... *H01S 3/094042* (2013.01); *G01S 7/4804* (2013.01); *G01S 7/4865* (2013.01); *G01S 17/10* (2013.01); *G02B 27/0927* (2013.01); *H01S 3/0078* (2013.01); *H01S 3/067* (2013.01); *H01S 3/08077* (2013.01); *H01S 3/094003* (2013.01); *H01S 5/0057* (2013.01)

(58) Field of Classification Search
CPC .. H01S 3/094042; H01S 3/0078; H01S 3/067; H01S 3/08077; H01S 3/094003; H01S 3/0057; G01S 7/4804; G01S 7/4865; G01S 17/10; G02B 27/0927
See application file for complete search history.

(56) References Cited

U.S. PATENT DOCUMENTS 5,006,721 A    4/1991  Cameron et al.
6,377,386 B1 *  4/2002  Korn ................. G02B 6/29359
                                                        356/519

(Continued)

*Primary Examiner* — Armando Rodriguez
(74) *Attorney, Agent, or Firm* — Marshall, Gerstein & Borun LLP

(57) ABSTRACT

In one embodiment, a laser system includes a seed laser diode configured to produce a free-space seed-laser beam. The laser system also includes a pump laser diode configured to produce a free-space pump-laser beam. The laser system further includes an optical-beam combiner configured to combine the seed-laser and pump-laser beams into a combined free-space beam and a focusing lens configured to focus the combined beam. The laser system also includes an optical gain fiber that includes an input end configured to receive the focused beam. The laser system also includes a mounting platform, where one or more of the optical-beam combiner, the focusing lens, and the input end of the gain fiber are mechanically attached to the platform.

29 Claims, 19 Drawing Sheets

Related U.S. Application Data

(60) Provisional application No. 62/574,046, filed on Oct. 18, 2017.

(51) Int. Cl.
  *G01S 17/10* (2006.01)
  *G01S 7/486* (2006.01)

(56) References Cited

U.S. PATENT DOCUMENTS

| | | |
|---|---|---|
| 6,449,384 B2 | 9/2002 | Laumeyer et al. |
| 6,710,324 B2 | 3/2004 | Hipp |
| 6,723,975 B2 | 4/2004 | Saccomanno |
| 6,747,747 B2 | 6/2004 | Hipp |
| 6,759,649 B2 | 7/2004 | Hipp |
| 7,092,548 B2 | 8/2006 | Laumeyer et al. |
| 7,209,221 B2 | 4/2007 | Breed et al. |
| 7,345,271 B2 | 3/2008 | Boehlau et al. |
| 7,397,828 B2 | 7/2008 | DePriest et al. |
| 7,443,903 B2 | 10/2008 | Leonardo et al. |
| 7,532,311 B2 | 5/2009 | Henderson et al. |
| 7,570,793 B2 | 8/2009 | Lages et al. |
| 7,583,364 B1 | 9/2009 | Mayor et al. |
| 7,649,920 B2 | 1/2010 | Welford |
| 7,652,752 B2 | 1/2010 | Fetzer et al. |
| 7,872,794 B1 | 1/2011 | Minelly et al. |
| 7,902,570 B2 | 3/2011 | Itzler et al. |
| 7,945,408 B2 | 5/2011 | Dimsdale et al. |
| 7,969,558 B2 | 6/2011 | Hall |
| 7,995,796 B2 | 8/2011 | Retterath et al. |
| 8,059,263 B2 | 11/2011 | Haberer et al. |
| 8,072,663 B2 | 12/2011 | O'Neill et al. |
| 8,081,301 B2 | 12/2011 | Stann et al. |
| 8,138,849 B2 | 3/2012 | West et al. |
| 8,279,420 B2 | 10/2012 | Ludwig et al. |
| 8,280,623 B2 | 10/2012 | Trepagnier et al. |
| 8,346,480 B2 | 1/2013 | Trepagnier et al. |
| 8,364,334 B2 | 1/2013 | Au et al. |
| 8,452,561 B2 | 5/2013 | Dimsdale et al. |
| 8,548,014 B2 | 10/2013 | Fermann et al. |
| 8,625,080 B2 | 1/2014 | Heizmann et al. |
| 8,675,181 B2 | 3/2014 | Hall |
| 8,723,955 B2 | 5/2014 | Kiehn et al. |
| 8,767,190 B2 | 7/2014 | Hall |
| 8,796,605 B2 | 8/2014 | Mordarski et al. |
| 8,836,922 B1 | 9/2014 | Pennecot et al. |
| 8,880,296 B2 | 11/2014 | Breed |
| 8,896,818 B2 | 11/2014 | Walsh et al. |
| 8,934,509 B2 | 1/2015 | Savage-Leuchs et al. |
| 9,000,347 B2 | 4/2015 | Woodward et al. |
| 9,041,136 B2 | 5/2015 | Chia |
| 9,048,370 B1 | 6/2015 | Urmson et al. |
| 9,063,549 B1 | 6/2015 | Pennecot et al. |
| 9,069,060 B1 | 6/2015 | Zbrozek et al. |
| 9,074,878 B2 | 7/2015 | Steffey et al. |
| 9,086,273 B1 | 7/2015 | Gruver et al. |
| 9,086,481 B1 | 7/2015 | Dowdall et al. |
| 9,091,754 B2 | 7/2015 | d'Aligny |
| 9,103,669 B2 | 8/2015 | Giacotto et al. |
| 9,121,703 B1 | 9/2015 | Droz et al. |
| 9,160,140 B2 | 10/2015 | Gusev et al. |
| 9,170,333 B2 | 10/2015 | Mheen et al. |
| 9,199,641 B2 | 12/2015 | Ferguson et al. |
| 9,213,085 B2 | 12/2015 | Kanter |
| 9,239,260 B2 | 1/2016 | Bayha et al. |
| 9,246,041 B1 | 1/2016 | Clausen et al. |
| 9,285,464 B2 | 3/2016 | Pennecot et al. |
| 9,285,477 B1 | 3/2016 | Smith et al. |
| 9,297,901 B2 | 3/2016 | Bayha et al. |
| 9,299,731 B1 | 3/2016 | Lenius et al. |
| 9,304,154 B1 | 4/2016 | Droz et al. |
| 9,304,203 B1 | 4/2016 | Droz et al. |
| 9,304,316 B2 | 4/2016 | Weiss et al. |
| 9,310,471 B2 | 4/2016 | Sayyah et al. |
| 9,335,255 B2 | 5/2016 | Retterath et al. |
| 9,360,554 B2 | 6/2016 | Retterath et al. |
| 9,368,933 B1 | 6/2016 | Nijjar et al. |
| 9,383,201 B2 | 7/2016 | Jachman et al. |
| 9,383,445 B2 | 7/2016 | Lu et al. |
| 9,383,753 B1 | 7/2016 | Templeton et al. |
| RE46,672 E | 1/2018 | Hall |
| 2004/0240508 A1* | 12/2004 | Hu .................... H01S 3/067 |
| | | 372/70 |
| 2006/0290920 A1 | 12/2006 | Kampchen et al. |
| 2009/0141751 A1 | 6/2009 | Kakui |
| 2009/0273770 A1 | 11/2009 | Bauhahn et al. |
| 2010/0034221 A1 | 2/2010 | Dragic |
| 2012/0227263 A1 | 9/2012 | Leclair et al. |
| 2013/0033742 A1 | 2/2013 | Rogers et al. |
| 2014/0111805 A1 | 4/2014 | Albert et al. |
| 2014/0168631 A1 | 6/2014 | Haslim et al. |
| 2014/0176933 A1 | 6/2014 | Haslim et al. |
| 2014/0211194 A1 | 7/2014 | Pacala et al. |
| 2014/0293263 A1 | 10/2014 | Justice et al. |
| 2014/0293266 A1 | 10/2014 | Hsu et al. |
| 2015/0131080 A1 | 5/2015 | Retterath et al. |
| 2015/0177368 A1 | 6/2015 | Bayha et al. |
| 2015/0185244 A1 | 7/2015 | Inoue et al. |
| 2015/0185313 A1 | 7/2015 | Zhu |
| 2015/0192676 A1 | 7/2015 | Kotelnikov et al. |
| 2015/0192677 A1 | 7/2015 | Yu et al. |
| 2015/0204978 A1 | 7/2015 | Hammes et al. |
| 2015/0214690 A1 | 7/2015 | Savage-Leuchs et al. |
| 2015/0301182 A1 | 10/2015 | Geiger et al. |
| 2015/0323654 A1 | 11/2015 | Jachmann et al. |
| 2015/0378023 A1 | 12/2015 | Royo Royo et al. |
| 2015/0378241 A1 | 12/2015 | Eldada |
| 2016/0025842 A1 | 1/2016 | Anderson et al. |
| 2016/0047896 A1 | 2/2016 | Dussan |
| 2016/0047901 A1 | 2/2016 | Pacala et al. |
| 2016/0049765 A1 | 2/2016 | Eldada |
| 2016/0146939 A1 | 5/2016 | Shpunt et al. |
| 2016/0146940 A1 | 5/2016 | Koehler |
| 2016/0161600 A1 | 6/2016 | Eldada et al. |
| 2016/0245919 A1 | 8/2016 | Kalscheur et al. |
| 2018/0032042 A1 | 2/2018 | Turpin et al. |
| 2018/0109078 A1* | 4/2018 | Bernier ............... H01S 3/0092 |

\* cited by examiner

| Temperature (°C) | Current (A) for pump laser 1 | Current (A) for pump laser 2 |
|---|---|---|
| 0 | 8 | 2 |
| 10 | 8 | 3 |
| 20 | 7 | 4 |
| 30 | 6 | 5 |
| 40 | 5 | 6 |
| 50 | 4 | 7 |
| 60 | 3 | 8 |
| 70 | 2 | 8 |

FIBER LASER WITH FREE-SPACE COMPONENTS

PRIORITY

This application is a continuation of U.S. patent application Ser. No. 15/828,236, filed Nov. 30, 2017, entitled "Fiber Laser with Free-Space Components," which claims priority to U.S. Provisional Patent Application 62/574,046, filed Oct. 18, 2017, the entirety of which is incorporated herein by reference.

TECHNICAL FIELD

This disclosure generally relates to lidar systems.

BACKGROUND

Light detection and ranging (lidar) is a technology that can be used to measure distances to remote targets. Typically, a lidar system includes a light source and an optical receiver. The light source can be, for example, a laser which emits light having a particular operating wavelength. The operating wavelength of a lidar system may lie, for example, in the infrared, visible, or ultraviolet portions of the electromagnetic spectrum. The light source emits light toward a target which then scatters the light. Some of the scattered light is received back at the receiver. The system determines the distance to the target based on one or more characteristics associated with the returned light. For example, the system may determine the distance to the target based on the time of flight of a returned light pulse.

DESCRIPTION OF EXAMPLE EMBODIMENTS

Figure 1:
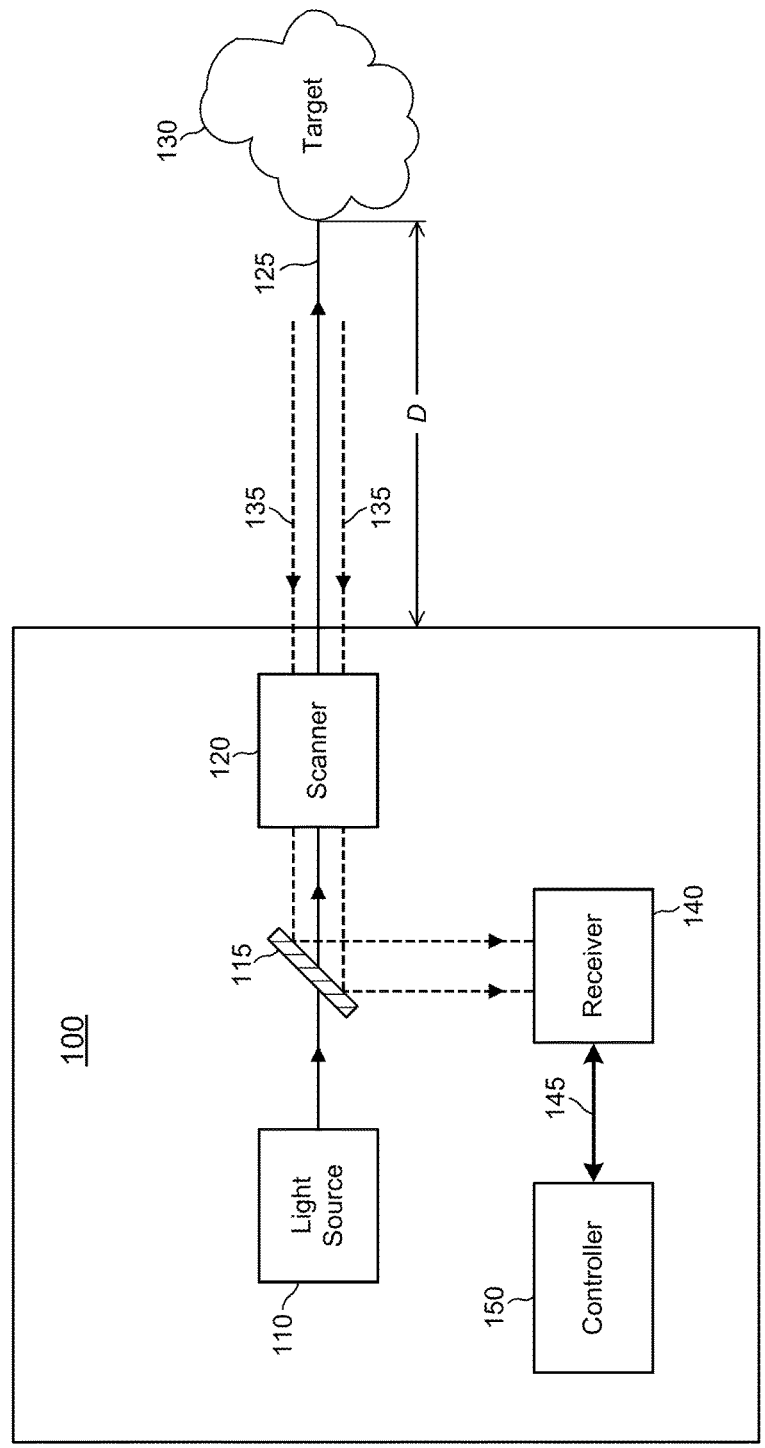
FIG. 1 illustrates an example light detection and ranging (lidar) system.

FIG. 1 illustrates an example light detection and ranging (lidar) system 100. In particular embodiments, a lidar system 100 may be referred to as a laser ranging system, a laser radar system, a LIDAR system, a lidar sensor, a laser detection and ranging (LADAR or ladar) system, a sensor, or a sensor head. In particular embodiments, a lidar system 100 may include a light source 110, mirror 115, scanner 120, receiver 140, or controller 150. The light source 110 may be, for example, a laser which emits light having a particular operating wavelength in the infrared, visible, or ultraviolet portions of the electromagnetic spectrum. As an example, light source 110 may include a laser with an operating wavelength between approximately 1.2 µm and 1.7 µm. The light source 110 emits an output beam of light 125 which may be continuous-wave, pulsed, or modulated in any suitable manner for a given application. The output beam of light 125 is directed downrange toward a remote target 130. As an example, the remote target 130 may be located a distance D of approximately 1 m to 1 km from the lidar system 100.

Once the output beam 125 reaches the downrange target 130, the target may scatter or reflect at least a portion of light from the output beam 125, and some of the scattered or reflected light may return toward the lidar system 100. In the example of FIG. 1, the scattered or reflected light is represented by input beam 135, which passes through scanner 120 and is directed by mirror 115 to receiver 140. In particular embodiments, a relatively small fraction of the light from output beam 125 may return to the lidar system 100 as input beam 135. As an example, the ratio of input beam 135 average power, peak power, or pulse energy to output beam 125 average power, peak power, or pulse energy may be approximately $10^{-1}$, $10^{-2}$, $10^{-3}$, $10^{-4}$, $10^{-5}$, $10^{-6}$, $10^{-7}$, $10^{-8}$, $10^{-9}$, $10^{-10}$, $10^{-11}$, or $10^{-12}$. As another example, if a pulse of output beam 125 has a pulse energy of 1 microjoule (µJ), then the pulse energy of a corresponding pulse of input beam 135 may have a pulse energy of approximately 10 nanojoules (nJ), 1 nJ, 100 picojoules (pJ), 10 pJ, 1 pJ, 100 femtojoules (fJ), 10 fJ, 1 fJ, 100 attojoules (aJ), 10 aJ, 1 aJ, or 0.1 aJ. In particular embodiments, output beam 125 may be referred to as a laser beam, light beam, optical beam, emitted beam, or beam. In particular embodiments, input beam 135 may be referred to as a return beam, received beam, return light, received light, input light, scattered light, or reflected light. As used herein, scattered light may refer to light that is scattered or reflected by a target 130. As an example, an input beam 135 may include: light from the output beam 125 that is scattered by target 130; light from the output beam 125 that is reflected by target 130; or a combination of scattered and reflected light from target 130.

In particular embodiments, receiver 140 may receive or detect photons from input beam 135 and generate one or more representative signals. For example, the receiver 140 may generate an output electrical signal 145 that is representative of the input beam 135. This electrical signal 145 may be sent to controller 150. In particular embodiments, controller 150 may include a processor, computing system (e.g., an ASIC or FPGA), or other suitable circuitry. A controller 150 may be configured to analyze one or more characteristics of the electrical signal 145 from the receiver 140 to determine one or more characteristics of the target 130, such as its distance downrange from the lidar system 100. This can be done, for example, by analyzing the time of flight or phase modulation for a beam of light 125 transmitted by the light source 110. If lidar system 100 measures a time of flight of T (e.g., T represents a round-trip time of flight for an emitted pulse of light to travel from the lidar system 100 to the target 130 and back to the lidar system 100), then the distance D from the target 130 to the lidar system 100 may be expressed as D=c·T/2, where c is the speed of light (approximately $3.0 \times 10^8$ m/s). As an example, if a time of flight is measured to be T=300 ns, then the distance from the target 130 to the lidar system 100 may be determined to be approximately D=45.0 m. As another example, if a time of flight is measured to be T=1.33 µs, then the distance from the target 130 to the lidar system 100 may be determined to be approximately D=199.5 m. In particular embodiments, a distance D from lidar system 100 to a target 130 may be referred to as a distance, depth, or range of target 130. As used herein, the speed of light c refers to the speed of light in any suitable medium, such as for example in air, water, or vacuum. As an example, the speed of light in vacuum is approximately $2.9979 \times 10^8$ m/s, and the speed of light in air (which has a refractive index of approximately 1.0003) is approximately $2.9970 \times 10^8$ m/s.

In particular embodiments, light source 110 may include a pulsed laser. As an example, light source 110 may be a pulsed laser configured to produce or emit pulses of light with a pulse duration or pulse width of approximately 10 picoseconds (ps) to 20 nanoseconds (ns). As another example, light source 110 may be a pulsed laser that produces pulses with a pulse duration of approximately 1-5 ns. As another example, light source 110 may be a pulsed laser that produces pulses at a pulse repetition frequency of approximately 100 kHz to 5 MHz or a pulse period (e.g., time between consecutive pulses) of approximately 200 ns to 10 µs. In particular embodiments, light source 110 may have a substantially constant pulse repetition frequency, or light source 110 may have a variable or adjustable pulse repetition frequency. As an example, light source 110 may be a pulsed laser that produces pulses at a substantially constant pulse repetition frequency of approximately 640 kHz (e.g., 640,000 pulses per second), corresponding to a pulse period of approximately 1.56 µs. As another example, light source 110 may have a pulse repetition frequency that can be varied from approximately 500 kHz to 3 MHz. As used herein, a pulse of light may be referred to as an optical pulse, a light pulse, or a pulse.

In particular embodiments, light source 110 may produce a free-space output beam 125 having any suitable average optical power, and the output beam 125 may have optical pulses with any suitable pulse energy or peak optical power. As an example, output beam 125 may have an average power of approximately 1 milliwatt (mW), 10 mW, 100 mW, 1 watt (W), 10 W, or any other suitable average power. As another example, output beam 125 may include pulses with a pulse energy of approximately 0.01 µJ, 0.1 µJ, 1 µJ, 10 µJ, 100 µJ, 1 mJ, or any other suitable pulse energy. As another example, output beam 125 may include pulses with a peak power of approximately 10 W, 100 W, 1 kW, 5 kW, 10 kW, or any other suitable peak power. The peak power ($P_{peak}$) of a pulse of light can be related to the pulse energy (E) by the expression $E=P_{peak} \cdot \Delta t$, where $\Delta t$ is the duration of the pulse, and the duration of a pulse may be defined as the full width at half maximum duration of the pulse. For example, an optical pulse with a duration of 1 ns and a pulse energy of 1 µJ has a peak power of approximately 1 kW. The average power ($P_{av}$) of an output beam 125 can be related to the pulse repetition frequency (PRF) and pulse energy by the expression $P_{av}=PRF \cdot E$. For example, if the pulse repetition frequency is 500 kHz, then the average power of an output beam 125 with 1-µJ pulses is approximately 0.5 W.

In particular embodiments, light source 110 may include a laser diode, such as for example, a Fabry-Perot laser diode, a quantum well laser, a distributed Bragg reflector (DBR) laser, a distributed feedback (DFB) laser, or a vertical-cavity surface-emitting laser (VCSEL). As an example, light source 110 may include an aluminum-gallium-arsenide (AlGaAs) laser diode, an indium-gallium-arsenide (InGaAs) laser diode, or an indium-gallium-arsenide-phosphide (InGaAsP) laser diode. In particular embodiments, light source 110 may include a pulsed laser diode with a peak emission wavelength of approximately 1400-1600 nanometers (nm). As an example, light source 110 may include a laser diode that is current modulated to produce optical pulses. In particular embodiments, light source 110 may include a pulsed laser diode followed by one or more optical-amplification stages. As an example, light source 110 may be a fiber-laser module that includes a current-modulated laser diode with a peak wavelength of approximately 1550 nm followed by a single-stage or a multi-stage erbium-doped fiber amplifier (EDFA). As another example, light source 110 may include a continuous-wave (CW) or quasi-CW laser diode followed by an external optical modulator (e.g., an electro-optic modulator), and the output of the modulator may be fed into an optical amplifier.

In particular embodiments, an output beam of light 125 emitted by light source 110 may be a collimated optical beam with any suitable beam divergence, such as for example, a divergence of approximately 0.5 to 5.0 milliradians (mrad). A divergence of output beam 125 may refer to an angular measure of an increase in beam size (e.g., a beam radius or beam diameter) as output beam 125 travels away from light source 110 or lidar system 100. In particular embodiments, output beam 125 may have a substantially circular cross section with a beam divergence characterized by a single divergence value. As an example, an output beam 125 with a circular cross section and a divergence of 2 mrad may have a beam diameter or spot size of approximately 20 cm at a distance of 100 m from lidar system 100. In particular embodiments, output beam 125 may be an astigmatic beam or may have a substantially elliptical cross section and may be characterized by two divergence values. As an example, output beam 125 may have a fast axis and a slow axis, where the fast-axis divergence is greater than the slow-axis divergence. As another example, output beam 125 may be an astigmatic beam with a fast-axis divergence of 4 mrad and a slow-axis divergence of 2 mrad.

In particular embodiments, an output beam of light 125 emitted by light source 110 may be unpolarized or randomly polarized, may have no specific or fixed polarization (e.g., the polarization may vary with time), or may have a particular polarization (e.g., output beam 125 may be linearly polarized, elliptically polarized, or circularly polarized). As an example, light source 110 may produce linearly polarized light, and lidar system 100 may include a quarter-wave plate that converts this linearly polarized light into circularly polarized light. The circularly polarized light may be transmitted as output beam 125, and lidar system 100 may receive input beam 135, which may be substantially or at least partially circularly polarized in the same manner as the output beam 125 (e.g., if output beam 125 is right-hand circularly polarized, then input beam 135 may also be right-hand circularly polarized). The input beam 135 may pass through the same quarter-wave plate (or a different quarter-wave plate) resulting in the input beam 135 being converted to linearly polarized light which is orthogonally polarized (e.g., polarized at a right angle) with respect to the linearly polarized light produced by light source 110. As another example, lidar system 100 may employ polarization-diversity detection where two polarization components are detected separately. The output beam 125 may be linearly polarized, and the lidar system 100 may split the input beam 135 into two polarization components (e.g., s-polarization and p-polarization) which are detected separately by two photodiodes (e.g., a balanced photoreceiver that includes two photodiodes).

In particular embodiments, lidar system 100 may include one or more optical components configured to condition, shape, filter, modify, steer, or direct the output beam 125 or the input beam 135. As an example, lidar system 100 may include one or more lenses, mirrors, filters (e.g., bandpass or interference filters), beam splitters, polarizers, polarizing beam splitters, wave plates (e.g., half-wave or quarter-wave plates), diffractive elements, or holographic elements. In particular embodiments, lidar system 100 may include a telescope, one or more lenses, or one or more mirrors to expand, focus, or collimate the output beam 125 to a desired beam diameter or divergence. As an example, the lidar system 100 may include one or more lenses to focus the input beam 135 onto an active region of receiver 140. As another example, the lidar system 100 may include one or more flat mirrors or curved mirrors (e.g., concave, convex, or parabolic mirrors) to steer or focus the output beam 125 or the input beam 135. For example, the lidar system 100 may include an off-axis parabolic mirror to focus the input beam 135 onto an active region of receiver 140. As illustrated in FIG. 1, the lidar system 100 may include mirror 115 (which may be a metallic or dielectric mirror), and mirror 115 may be configured so that light beam 125 passes through the mirror 115. As an example, mirror 115 (which may be referred to as an overlap mirror, superposition mirror, or beam-combiner mirror) may include a hole, slot, or aperture which output light beam 125 passes through. As another example, mirror 115 may be configured so that at least 80% of output beam 125 passes through mirror 115 and at least 80% of input beam 135 is reflected by mirror 115. In particular embodiments, mirror 115 may provide for output beam 125 and input beam 135 to be substantially coaxial so that the two beams travel along substantially the same optical path (albeit in opposite directions).

In particular embodiments, lidar system 100 may include a scanner 120 to steer the output beam 125 in one or more directions downrange. As an example, scanner 120 may include one or more scanning mirrors that are configured to rotate, oscillate, tilt, pivot, or move in an angular manner about one or more axes. In particular embodiments, a flat scanning mirror may be attached to a scanner actuator or mechanism which scans the mirror over a particular angular range. As an example, scanner 120 may include a galvanometer scanner, a resonant scanner, a piezoelectric actuator, a polygonal scanner, a rotating-prism scanner, a voice coil motor, an electric motor (e.g., a DC motor, a brushless DC motor, a synchronous electric motor, or a stepper motor), or a microelectromechanical systems (MEMS) device, or any other suitable actuator or mechanism. In particular embodiments, scanner 120 may be configured to scan the output beam 125 over a 5-degree angular range, 20-degree angular range, 30-degree angular range, 60-degree angular range, or any other suitable angular range. As an example, a scanning mirror may be configured to periodically oscillate or rotate back and forth over a 15-degree range, which results in the output beam 125 scanning across a 30-degree range (e.g., a Θ-degree rotation by a scanning mirror results in a 2Θ-degree angular scan of output beam 125). In particular embodiments, a field of regard (FOR) of a lidar system 100 may refer to an area, region, or angular range over which the lidar system 100 may be configured to scan or capture distance information. As an example, a lidar system 100 with an output beam 125 with a 30-degree scanning range may be referred to as having a 30-degree angular field of regard. As another example, a lidar system 100 with a scanning mirror that rotates over a 30-degree range may produce an output beam 125 that scans across a 60-degree range (e.g., a 60-degree FOR). In particular embodiments, lidar system 100 may have a FOR of approximately 10°, 20°, 40°, 60°, 120°, or any other suitable FOR. In particular embodiments, a FOR may be referred to as a scan region.

In particular embodiments, scanner 120 may be configured to scan the output beam 125 (which includes at least a portion of the pulses of light emitted by light source 110) across a FOR of the lidar system 100. In particular embodiments, scanner 120 may be configured to scan the output beam 125 horizontally and vertically, and lidar system 100 may have a particular FOR along the horizontal direction and another particular FOR along the vertical direction. As an example, lidar system 100 may have a horizontal FOR of 10° to 120° and a vertical FOR of 2° to 45°. In particular embodiments, scanner 120 may include a first mirror and a second mirror, where the first mirror directs the output beam 125 toward the second mirror, and the second mirror directs the output beam 125 downrange. As an example, the first mirror may scan the output beam 125 along a first direction, and the second mirror may scan the output beam 125 along a second direction that is substantially orthogonal to the first direction. As another example, the first mirror may scan the output beam 125 along a substantially horizontal direction, and the second mirror may scan the output beam 125 along a substantially vertical direction (or vice versa). In particular embodiments, scanner 120 may be referred to as a beam scanner, optical scanner, or laser scanner.

In particular embodiments, one or more scanning mirrors may be communicatively coupled to controller 150 which may control the scanning mirror(s) so as to guide the output beam 125 in a desired direction downrange or along a desired scan pattern. In particular embodiments, a scan pattern (which may be referred to as an optical scan pattern, optical scan path, or scan path) may refer to a pattern or path along which the output beam 125 is directed. As an example, scanner 120 may include two scanning mirrors configured to scan the output beam 125 across a 60° horizontal FOR and a 20° vertical FOR. The two scanner mirrors may be controlled to follow a scan path that substantially covers the 60°×20° FOR. As an example, the scan path may result in a point cloud with pixels that substantially cover the 60°×20° FOR. The pixels may be approximately evenly distributed across the 60°×20° FOR. Alternatively, the pixels may have a particular nonuniform distribution (e.g., the pixels may be distributed across all or a portion of the 60°×20° FOR, and the pixels may have a higher density in one or more particular regions of the 60°×20° FOR).

In particular embodiments, a light source 110 may emit pulses of light which are scanned by scanner 120 across a FOR of lidar system 100. One or more of the emitted pulses of light may be scattered by a target 130 located downrange from the lidar system 100, and a receiver 140 may detect at least a portion of the pulses of light scattered by the target 130. In particular embodiments, receiver 140 may be referred to as a photoreceiver, optical receiver, optical sensor, detector, photodetector, or optical detector. In particular embodiments, lidar system 100 may include a receiver 140 that receives or detects at least a portion of input beam 135 and produces an electrical signal that corresponds to input beam 135. As an example, if input beam 135 includes an optical pulse, then receiver 140 may produce an electrical current or voltage pulse that corresponds to the optical pulse detected by receiver 140. As another example, receiver 140 may include one or more avalanche photodiodes (APDs) or one or more single-photon avalanche diodes (SPADs). As another example, receiver 140 may include one or more PN photodiodes (e.g., a photodiode structure formed by a p-type semiconductor and a n-type semiconductor) or one or more PIN photodiodes (e.g., a photodiode structure formed by an undoped intrinsic semiconductor region located between p-type and n-type regions). Receiver 140 may have an active region or an avalanche-multiplication region that includes silicon, germanium, or InGaAs. The active region of receiver 140 may have any suitable size, such as for example, a diameter or width of approximately 20-500 µm.

In particular embodiments, receiver 140 may include circuitry that performs signal amplification, sampling, filtering, signal conditioning, analog-to-digital conversion, time-to-digital conversion, pulse detection, threshold detection, rising-edge detection, or falling-edge detection. As an example, receiver 140 may include a transimpedance amplifier that converts a received photocurrent (e.g., a current produced by an APD in response to a received optical signal) into a voltage signal. The voltage signal may be sent to pulse-detection circuitry that produces an analog or digital output signal 145 that corresponds to one or more characteristics (e.g., rising edge, falling edge, amplitude, or duration) of a received optical pulse. As an example, the pulse-detection circuitry may perform a time-to-digital conversion to produce a digital output signal 145. The electrical output signal 145 may be sent to controller 150 for processing or analysis (e.g., to determine a time-of-flight value corresponding to a received optical pulse).

In particular embodiments, controller 150 may be electrically coupled or communicatively coupled to light source 110, scanner 120, or receiver 140. As an example, controller 150 may receive electrical trigger pulses or edges from light source 110, where each pulse or edge corresponds to the emission of an optical pulse by light source 110. As another example, controller 150 may provide instructions, a control signal, or a trigger signal to light source 110 indicating when light source 110 should produce optical pulses. Controller 150 may send an electrical trigger signal that includes electrical pulses, where each electrical pulse results in the emission of an optical pulse by light source 110. In particular embodiments, the frequency, period, duration, pulse energy, peak power, average power, or wavelength of the optical pulses produced by light source 110 may be adjusted based on instructions, a control signal, or trigger pulses provided by controller 150. In particular embodiments, controller 150 may be coupled to light source 110 and receiver 140, and controller 150 may determine a time-of-flight value for an optical pulse based on timing information associated with when the pulse was emitted by light source 110 and when a portion of the pulse (e.g., input beam 135) was detected or received by receiver 140. In particular embodiments, controller 150 may include circuitry that performs signal amplification, sampling, filtering, signal conditioning, analog-to-digital conversion, time-to-digital conversion, pulse detection, threshold detection, rising-edge detection, or falling-edge detection.

In particular embodiments, a lidar system 100 may be used to determine the distance to one or more downrange targets 130. By scanning the lidar system 100 across a field of regard, the system can be used to map the distance to a number of points within the field of regard. Each of these depth-mapped points may be referred to as a pixel or a voxel. A collection of pixels captured in succession (which may be referred to as a depth map, a point cloud, or a frame) may be rendered as an image or may be analyzed to identify or detect objects or to determine a shape or distance of objects within the FOR. As an example, a point cloud may cover a field of regard that extends 60° horizontally and 15° vertically, and the point cloud may include a frame of 100-2000 pixels in the horizontal direction by 4-400 pixels in the vertical direction.

In particular embodiments, lidar system 100 may be configured to repeatedly capture or generate point clouds of a field of regard at any suitable frame rate between approximately 0.1 frames per second (FPS) and approximately 1,000 FPS. As an example, lidar system 100 may generate point clouds at a frame rate of approximately 0.1 FPS, 0.5 FPS, 1 FPS, 2 FPS, 5 FPS, 10 FPS, 20 FPS, 100 FPS, 500 FPS, or 1,000 FPS. As another example, lidar system 100 may be configured to produce optical pulses at a rate of $5\times10^5$ pulses/second (e.g., the system may determine 500,000 pixel distances per second) and scan a frame of 1000×50 pixels (e.g., 50,000 pixels/frame), which corresponds to a point-cloud frame rate of 10 frames per second (e.g., 10 point clouds per second). In particular embodiments, a point-cloud frame rate may be substantially fixed, or a point-cloud frame rate may be dynamically adjustable. As an example, a lidar system 100 may capture one or more point clouds at a particular frame rate (e.g., 1 Hz) and then switch to capture one or more point clouds at a different frame rate (e.g., 10 Hz). A slower frame rate (e.g., 1 Hz) may be used to capture one or more high-resolution point clouds, and a faster frame rate (e.g., 10 Hz) may be used to rapidly capture multiple lower-resolution point clouds.

In particular embodiments, a lidar system 100 may be configured to sense, identify, or determine distances to one or more targets 130 within a field of regard. As an example, a lidar system 100 may determine a distance to a target 130, where all or part of the target 130 is contained within a field of regard of the lidar system 100. All or part of a target 130 being contained within a FOR of the lidar system 100 may refer to the FOR overlapping, encompassing, or enclosing at least a portion of the target 130. In particular embodiments, target 130 may include all or part of an object that is moving or stationary relative to lidar system 100. As an example, target 130 may include all or a portion of a person, vehicle, motorcycle, truck, train, bicycle, wheelchair, pedestrian, animal, road sign, traffic light, lane marking, road-surface marking, parking space, pylon, guard rail, traffic barrier, pothole, railroad crossing, obstacle in or near a road, curb, stopped vehicle on or beside a road, utility pole, house, building, trash can, mailbox, tree, any other suitable object, or any suitable combination of all or part of two or more objects.

In particular embodiments, one or more lidar systems 100 may be integrated into a vehicle. As an example, multiple lidar systems 100 may be integrated into a car to provide a complete 360-degree horizontal FOR around the car. As another example, 4-10 lidar systems 100, each system having a 45-degree to 90-degree horizontal FOR, may be combined together to form a sensing system that provides a point cloud covering a 360-degree horizontal FOR. The lidar systems 100 may be oriented so that adjacent FORs have an amount of spatial or angular overlap to allow data from the multiple lidar systems 100 to be combined or stitched together to form a single or continuous 360-degree point cloud. As an example, the FOR of each lidar system 100 may have approximately 1-15 degrees of overlap with an adjacent FOR. In particular embodiments, a vehicle may refer to a mobile machine configured to transport people or cargo. For example, a vehicle may include, may take the form of, or may be referred to as a car, automobile, motor vehicle, truck, bus, van, trailer, off-road vehicle, farm vehicle, lawn mower, construction equipment, golf cart, motorhome, taxi, motorcycle, scooter, bicycle, skateboard, train, snowmobile, watercraft (e.g., a ship or boat), aircraft (e.g., a fixed-wing aircraft, helicopter, or dirigible), or spacecraft. In particular embodiments, a vehicle may include an internal combustion engine or an electric motor that provides propulsion for the vehicle.

In particular embodiments, one or more lidar systems 100 may be included in a vehicle as part of an advanced driver assistance system (ADAS) to assist a driver of the vehicle in the driving process. For example, a lidar system 100 may be part of an ADAS that provides information or feedback to a driver (e.g., to alert the driver to potential problems or hazards) or that automatically takes control of part of a vehicle (e.g., a braking system or a steering system) to avoid collisions or accidents. A lidar system 100 may be part of a vehicle ADAS that provides adaptive cruise control, automated braking, automated parking, collision avoidance, alerts the driver to hazards or other vehicles, maintains the vehicle in the correct lane, or provides a warning if an object or another vehicle is in a blind spot.

In particular embodiments, one or more lidar systems 100 may be integrated into a vehicle as part of an autonomous-vehicle driving system. As an example, a lidar system 100 may provide information about the surrounding environment to a driving system of an autonomous vehicle. An autonomous-vehicle driving system may include one or more computing systems that receive information from a lidar system 100 about the surrounding environment, analyze the received information, and provide control signals to the vehicle's driving systems (e.g., steering wheel, accelerator, brake, or turn signal). As an example, a lidar system 100 integrated into an autonomous vehicle may provide an autonomous-vehicle driving system with a point cloud every 0.1 seconds (e.g., the point cloud has a 10 Hz update rate, representing 10 frames per second). The autonomous-vehicle driving system may analyze the received point clouds to sense or identify targets 130 and their respective locations, distances, or speeds, and the autonomous-vehicle driving system may update control signals based on this information. As an example, if lidar system 100 detects a vehicle ahead that is slowing down or stopping, the autonomous-vehicle driving system may send instructions to release the accelerator and apply the brakes.

In particular embodiments, an autonomous vehicle may be referred to as an autonomous car, driverless car, self-driving car, robotic car, or unmanned vehicle. In particular embodiments, an autonomous vehicle may refer to a vehicle configured to sense its environment and navigate or drive with little or no human input. As an example, an autonomous vehicle may be configured to drive to any suitable location and control or perform all safety-critical functions (e.g., driving, steering, braking, parking) for the entire trip, with the driver not expected to control the vehicle at any time. As another example, an autonomous vehicle may allow a driver to safely turn their attention away from driving tasks in particular environments (e.g., on freeways), or an autonomous vehicle may provide control of a vehicle in all but a few environments, requiring little or no input or attention from the driver.

In particular embodiments, an autonomous vehicle may be configured to drive with a driver present in the vehicle, or an autonomous vehicle may be configured to operate the vehicle with no driver present. As an example, an autonomous vehicle may include a driver's seat with associated controls (e.g., steering wheel, accelerator pedal, and brake pedal), and the vehicle may be configured to drive with no one seated in the driver's seat or with little or no input from a person seated in the driver's seat. As another example, an autonomous vehicle may not include any driver's seat or associated driver's controls, and the vehicle may perform substantially all driving functions (e.g., driving, steering, braking, parking, and navigating) without human input. As another example, an autonomous vehicle may be configured to operate without a driver (e.g., the vehicle may be configured to transport human passengers or cargo without a driver present in the vehicle). As another example, an autonomous vehicle may be configured to operate without any human passengers (e.g., the vehicle may be configured for transportation of cargo without having any human passengers onboard the vehicle).

Figure 2:
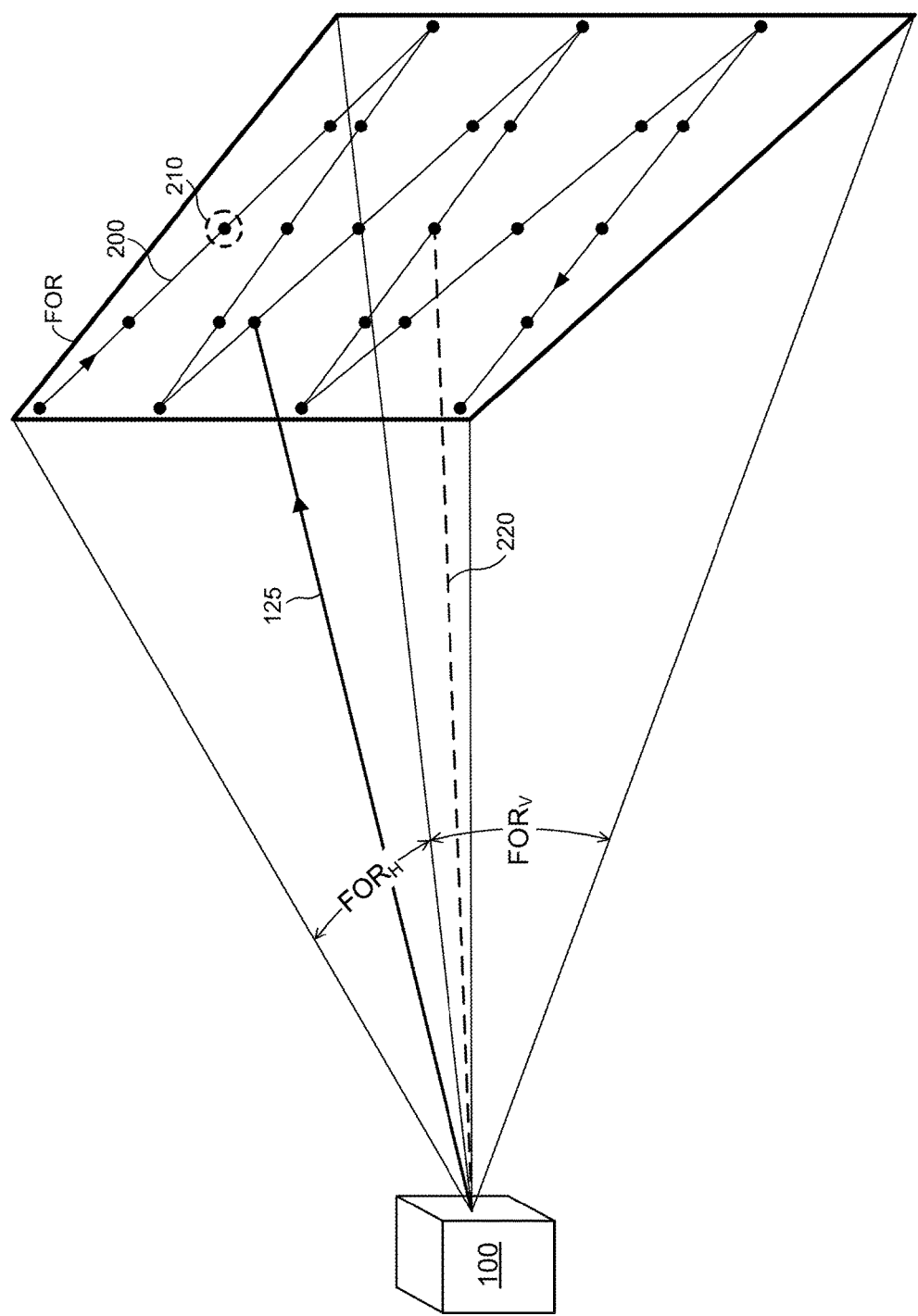
FIG. 2 illustrates an example scan pattern produced by a lidar system.

FIG. 2 illustrates an example scan pattern 200 produced by a lidar system 100. A scan pattern 200 (which may be referred to as a scan) may represent a path or course followed by output beam 125 as it is scanned across all or part of a FOR. Each traversal of a scan pattern 200 may correspond to the capture of a single frame or a single point cloud. In particular embodiments, a lidar system 100 may be configured to scan output optical beam 125 along one or more particular scan patterns 200. In particular embodiments, a scan pattern 200 may scan across any suitable field of regard (FOR) having any suitable horizontal FOR ($FOR_H$) and any suitable vertical FOR ($FOR_V$). For example, a scan pattern 200 may have a field of regard represented by angular dimensions (e.g., $FOR_H \times FOR_V$) 40°×30°, 90°×40°, or 60°×15°. As another example, a scan pattern 200 may have a $FOR_H$ greater than or equal to 10°, 25°, 30°, 40°, 60°, 90°, or 120°. As another example, a scan pattern 200 may have a $FOR_V$ greater than or equal to 2°, 5°, 10°, 15°, 20°, 30°, or 45°. In the example of FIG. 2, reference line 220 represents a center of the field of regard of scan pattern 200. In particular embodiments, reference line 220 may have any suitable orientation, such as for example, a horizontal angle of 0° (e.g., reference line 220 may be oriented straight ahead) and a vertical angle of 0° (e.g., reference line 220 may have an inclination of 0°), or reference line 220 may have a nonzero horizontal angle or a nonzero inclination (e.g., a vertical angle of +10° or −10°). In FIG. 2, if the scan pattern 200 has a 60°×15° field of regard, then scan pattern 200 covers a ±30° horizontal range with respect to reference line 220 and a ±7.5° vertical range with respect to reference line 220. Additionally, optical beam 125 in FIG. 2 has an orientation of approximately −15° horizontal and +3° vertical with respect to reference line 220. Optical beam 125 may be referred to as having an azimuth of −15° and an altitude of +3° relative to reference line 220. In particular embodiments, an azimuth (which may be referred to as an azimuth angle) may represent a horizontal angle with respect to reference line 220, and an altitude (which may be referred to as an altitude angle, elevation, or elevation angle) may represent a vertical angle with respect to reference line 220.

In particular embodiments, a scan pattern 200 may include multiple pixels 210, and each pixel 210 may be associated with one or more laser pulses and one or more corresponding distance measurements. In particular embodiments, a cycle of scan pattern 200 may include a total of $P_x \times P_y$ pixels 210 (e.g., a two-dimensional distribution of $P_x$ by $P_y$ pixels). As an example, scan pattern 200 may include a distribution with dimensions of approximately 100-2,000 pixels 210 along a horizontal direction and approximately 4-400 pixels 210 along a vertical direction. As another example, scan pattern 200 may include a distribution of 1,000 pixels 210 along the horizontal direction by 64 pixels 210 along the vertical direction (e.g., the frame size is 1000×64 pixels) for a total of 64,000 pixels per cycle of scan pattern 200. In particular embodiments, the number of pixels 210 along a horizontal direction may be referred to as a horizontal resolution of scan pattern 200, and the number of pixels 210 along a vertical direction may be referred to as a vertical resolution. As an example, scan pattern 200 may have a horizontal resolution of greater than or equal to 100 pixels 210 and a vertical resolution of greater than or equal to 4 pixels 210. As another example, scan pattern 200 may have a horizontal resolution of 100-2,000 pixels 210 and a vertical resolution of 4-400 pixels 210.

In particular embodiments, each pixel 210 may be associated with a distance (e.g., a distance to a portion of a target 130 from which an associated laser pulse was scattered) or one or more angular values. As an example, a pixel 210 may be associated with a distance value and two angular values (e.g., an azimuth and altitude) that represent the angular location of the pixel 210 with respect to the lidar system 100. A distance to a portion of target 130 may be determined based at least in part on a time-of-flight measurement for a corresponding pulse. An angular value (e.g., an azimuth or altitude) may correspond to an angle (e.g., relative to reference line 220) of output beam 125 (e.g., when a corresponding pulse is emitted from lidar system 100) or an angle of input beam 135 (e.g., when an input signal is received by lidar system 100). In particular embodiments, an angular value may be determined based at least in part on a position of a component of scanner 120. As an example, an azimuth or altitude value associated with a pixel 210 may be determined from an angular position of one or more corresponding scanning mirrors of scanner 120.

Figure 3:
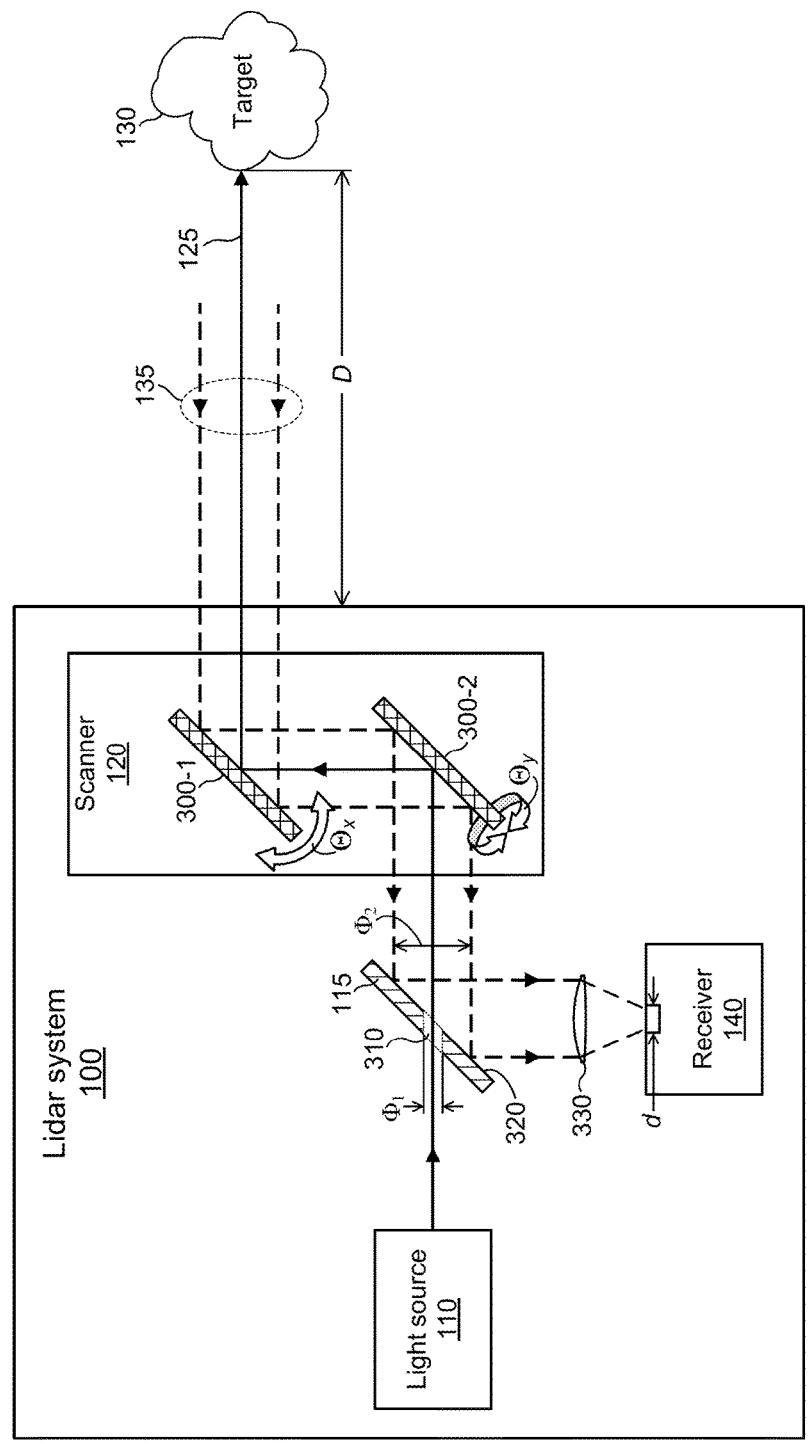
FIG. 3 illustrates an example lidar system with an example overlap mirror.

FIG. 3 illustrates an example lidar system 100 with an example overlap mirror 115. In particular embodiments, a lidar system 100 may include a light source 110 configured to emit pulses of light and a scanner 120 configured to scan at least a portion of the emitted pulses of light across a field of regard. As an example, the light source 110 may include a pulsed solid-state laser or a pulsed fiber laser, and the optical pulses produced by the light source 110 may be directed through aperture 310 of overlap mirror 115 and then coupled to scanner 120. In particular embodiments, a lidar system 100 may include a receiver 140 configured to detect at least a portion of the scanned pulses of light scattered by a target 130 located a distance D from the lidar system 100. As an example, one or more pulses of light that are directed downrange from lidar system 100 by scanner 120 (e.g., as part of output beam 125) may scatter off a target 130, and a portion of the scattered light may propagate back to the lidar system 100 (e.g., as part of input beam 135) and be detected by receiver 140.

In particular embodiments, lidar system 100 may include one or more processors (e.g., a controller 150) configured to determine a distance D from the lidar system 100 to a target 130 based at least in part on a round-trip time of flight for an emitted pulse of light to travel from the lidar system 100 to the target 130 and back to the lidar system 100. The target 130 may be at least partially contained within a field of regard of the lidar system 100 and located a distance D from the lidar system 100 that is less than or equal to a maximum range $R_{MAX}$ of the lidar system 100. In particular embodiments, a maximum range (which may be referred to as a maximum distance) of a lidar system 100 may refer to the maximum distance over which the lidar system 100 is configured to sense or identify targets 130 that appear in a field of regard of the lidar system 100. The maximum range of lidar system 100 may be any suitable distance, such as for example, 25 m, 50 m, 100 m, 200 m, 500 m, or 1 km. As an example, a lidar system 100 with a 200-m maximum range may be configured to sense or identify various targets 130 located up to 200 m away from the lidar system 100. For a lidar system 100 with a 200-m maximum range ($R_{MAX}=200$ m), the time of flight corresponding to the maximum range is approximately $2 \cdot R_{MAX}/c \cong 1.33$ µs.

In particular embodiments, light source 110, scanner 120, and receiver 140 may be packaged together within a single housing, where a housing may refer to a box, case, or enclosure that holds or contains all or part of a lidar system 100. As an example, a lidar-system enclosure may contain a light source 110, overlap mirror 115, scanner 120, and receiver 140 of a lidar system 100. Additionally, the lidar-system enclosure may include a controller 150. The lidar-system enclosure may also include one or more electrical connections for conveying electrical power or electrical signals to or from the enclosure. In particular embodiments, one or more components of a lidar system 100 may be located remotely from a lidar-system enclosure. As an example, all or part of light source 110 may be located remotely from a lidar-system enclosure, and pulses of light produced by the light source 110 may be conveyed to the enclosure via optical fiber. As another example, all or part of a controller 150 may be located remotely from a lidar-system enclosure.

In particular embodiments, light source 110 may include an eye-safe laser, or lidar system 100 may be classified as an eye-safe laser system or laser product. An eye-safe laser, laser system, or laser product may refer to a system that includes a laser with an emission wavelength, average power, peak power, peak intensity, pulse energy, beam size, beam divergence, exposure time, or scanned output beam such that emitted light from the system presents little or no possibility of causing damage to a person's eyes. As an example, light source 110 or lidar system 100 may be classified as a Class 1 laser product (as specified by the 60825-1 standard of the International Electrotechnical Commission (IEC)) or a Class I laser product (as specified by Title 21, Section 1040.10 of the United States Code of Federal Regulations (CFR)) that is safe under all conditions of normal use. In particular embodiments, lidar system 100 may be an eye-safe laser product (e.g., with a Class 1 or Class I classification) configured to operate at any suitable wavelength between approximately 1400 nm and approximately 2100 nm. As an example, lidar system 100 may include a laser with an operating wavelength between approximately 1400 nm and approximately 1600 nm, and the laser or the lidar system 100 may be operated in an eye-safe manner. As another example, lidar system 100 may be an eye-safe laser product that includes a scanned laser with an operating wavelength between approximately 1530 nm and approximately 1560 nm. As another example, lidar system 100 may be a Class 1 or Class I laser product that includes a fiber laser or solid-state laser with an operating wavelength between approximately 1400 nm and approximately 1600 nm.

In particular embodiments, scanner 120 may include one or more mirrors, where each mirror is mechanically driven by a galvanometer scanner, a resonant scanner, a MEMS device, a voice coil motor, an electric motor, or any suitable combination thereof. A galvanometer scanner (which may be referred to as a galvanometer actuator) may include a galvanometer-based scanning motor with a magnet and coil. When an electrical current is supplied to the coil, a rotational force is applied to the magnet, which causes a mirror attached to the galvanometer scanner to rotate. The electrical current supplied to the coil may be controlled to dynamically change the position of the galvanometer mirror. A resonant scanner (which may be referred to as a resonant actuator) may include a spring-like mechanism driven by an actuator to produce a periodic oscillation at a substantially fixed frequency (e.g., 1 kHz). A MEMS-based scanning device may include a mirror with a diameter between approximately 1 and 10 mm, where the mirror is rotated back and forth using electromagnetic or electrostatic actuation. A voice coil motor (which may be referred to as a voice coil actuator) may include a magnet and coil. When an electrical current is supplied to the coil, a translational force is applied to the magnet, which causes a mirror attached to the magnet to move or rotate. An electric motor, such as for example, a brushless DC motor or a synchronous electric motor, may be used to continuously rotate a mirror at a substantially fixed frequency (e.g., a rotational frequency of approximately 1 Hz, 10 Hz, 50 Hz, 100 Hz, 500 Hz, or 1,000 Hz). The mirror may be continuously rotated in one rotation direction (e.g., clockwise or counter-clockwise relative to a particular rotation axis).

In particular embodiments, a scanner 120 may include any suitable number of mirrors driven by any suitable number of mechanical actuators. As an example, a scanner 120 may include a single mirror configured to scan an output beam 125 along a single direction (e.g., a scanner 120 may be a one-dimensional scanner that scans along a horizontal or vertical direction). The mirror may be driven by one actuator (e.g., a galvanometer) or two actuators configured to drive the mirror in a push-pull configuration. As another example, a scanner 120 may include a single mirror that scans an output beam 125 along two directions (e.g., horizontal and vertical). The mirror may be driven by two actuators, where each actuator provides rotational motion along a particular direction or about a particular axis. As another example, a scanner 120 may include two mirrors, where one mirror scans an output beam 125 along a substantially horizontal direction and the other mirror scans the output beam 125 along a substantially vertical direction. In the example of FIG. 3, scanner 120 includes two mirrors, mirror 300-1 and mirror 300-2. Mirror 300-2 rotates along the $\Theta_y$ direction and scans output beam 125 along a substantially vertical direction, and mirror 300-1 rotates along the $\Theta_x$ direction and scans output beam 125 along a substantially horizontal direction.

In particular embodiments, a scanner 120 may include two mirrors, where each mirror is driven by a corresponding galvanometer scanner. As an example, scanner 120 may include a galvanometer actuator that scans mirror 300-1 along a first direction (e.g., horizontal), and scanner 120 may include another galvanometer actuator that scans mirror 300-2 along a second direction (e.g., vertical). In particular embodiments, a scanner 120 may include two mirrors, where one mirror is driven by a galvanometer actuator and the other mirror is driven by a resonant actuator. As an example, a galvanometer actuator may scan mirror 300-1 along a first direction, and a resonant actuator may scan mirror 300-2 along a second direction. The first and second scanning directions may be substantially orthogonal to one another. As an example, the first direction may be substantially vertical, and the second direction may be substantially horizontal, or vice versa. In particular embodiments, a scanner 120 may include two mirrors, where one mirror is driven by an electric motor and the other mirror is driven by a galvanometer actuator. As an example, mirror 300-1 may be a polygon mirror that is rotated about a fixed axis by an electric motor (e.g., a brushless DC motor), and mirror 300-2 may be driven by a galvanometer or MEMS actuator. In particular embodiments, a scanner 120 may include two mirrors, where both mirrors are driven by electric motors. As an example, mirror 300-2 may be a polygon mirror driven by an electric motor, and mirror 300-1 may be driven by another electric motor. In particular embodiments, a scanner 120 may include one mirror driven by two actuators which are configured to scan the mirror along two substantially orthogonal directions. As an example, one mirror may be driven along a substantially horizontal direction by a resonant actuator or a galvanometer actuator, and the mirror may also be driven along a substantially vertical direction by a galvanometer actuator. As another example, a mirror may be driven along two substantially orthogonal directions by two resonant actuators or by two electric motors.

In particular embodiments, a scanner 120 may include a mirror configured to be scanned along one direction by two actuators arranged in a push-pull configuration. Driving a mirror in a push-pull configuration may refer to a mirror that is driven in one direction by two actuators. The two actuators may be located at opposite ends or sides of the mirror, and the actuators may be driven in a cooperative manner so that when one actuator pushes on the mirror, the other actuator pulls on the mirror, and vice versa. As an example, a mirror may be driven along a horizontal or vertical direction by two voice coil actuators arranged in a push-pull configuration. In particular embodiments, a scanner 120 may include one mirror configured to be scanned along two axes, where motion along each axis is provided by two actuators arranged in a push-pull configuration. As an example, a mirror may be driven along a horizontal direction by two resonant actuators arranged in a horizontal push-pull configuration, and the mirror may be driven along a vertical direction by another two resonant actuators arranged in a vertical push-pull configuration.

In particular embodiments, a scanner 120 may include two mirrors which are driven synchronously so that the output beam 125 is directed along any suitable scan pattern 200. As an example, a galvanometer actuator may drive mirror 300-1 with a substantially linear back-and-forth motion (e.g., the galvanometer may be driven with a substantially sinusoidal or triangle-shaped waveform) that causes output beam 125 to trace a substantially horizontal back-and-forth pattern. Additionally, another galvanometer actuator may scan mirror 300-2 along a substantially vertical direction. For example, the two galvanometers may be synchronized so that for every 64 horizontal traces, the output beam 125 makes a single trace along a vertical direction. As another example, a resonant actuator may drive mirror 300-1 along a substantially horizontal direction, and a galvanometer actuator or a resonant actuator may scan mirror 300-2 along a substantially vertical direction.

In particular embodiments, a scanner 120 may include one mirror driven by two or more actuators, where the actuators are driven synchronously so that the output beam 125 is directed along a particular scan pattern 200. As an example, one mirror may be driven synchronously along two substantially orthogonal directions so that the output beam 125 follows a scan pattern 200 that includes substantially straight lines. In particular embodiments, a scanner 120 may include two mirrors driven synchronously so that the synchronously driven mirrors trace out a scan pattern 200 that includes substantially straight lines. As an example, the scan pattern 200 may include a series of substantially straight lines directed substantially horizontally, vertically, or along any other suitable direction. The straight lines may be achieved by applying a dynamically adjusted deflection along a vertical direction (e.g., with a galvanometer actuator) as an output beam 125 is scanned along a substantially horizontal direction (e.g., with a galvanometer or resonant actuator). If a vertical deflection is not applied, the output beam 125 may trace out a curved path as it scans from side to side. By applying a vertical deflection as the mirror is scanned horizontally, a scan pattern 200 that includes substantially straight lines may be achieved. In particular embodiments, a vertical actuator may be used to apply both a dynamically adjusted vertical deflection as the output beam 125 is scanned horizontally as well as a discrete vertical offset between each horizontal scan (e.g., to step the output beam 125 to a subsequent row of a scan pattern 200).

In the example of FIG. 3, lidar system 100 produces an output beam 125 and receives light from an input beam 135. The output beam 125, which includes at least a portion of the pulses of light emitted by light source 110, may be scanned across a field of regard. The input beam 135 may include at least a portion of the scanned pulses of light which are scattered by one or more targets 130 and detected by receiver 140. In particular embodiments, output beam 125 and input beam 135 may be substantially coaxial. The input and output beams being substantially coaxial may refer to the beams being at least partially overlapped or sharing a common propagation axis so that input beam 135 and output beam 125 travel along substantially the same optical path (albeit in opposite directions). As output beam 125 is scanned across a field of regard, the input beam 135 may follow along with the output beam 125 so that the coaxial relationship between the two beams is maintained.

In particular embodiments, a lidar system 100 may include an overlap mirror 115 configured to overlap the input beam 135 and output beam 125 so that they are substantially coaxial. In FIG. 3, the overlap mirror 115 includes a hole, slot, or aperture 310 which the output beam 125 passes through and a reflecting surface 320 that reflects at least a portion of the input beam 135 toward the receiver 140. The overlap mirror 115 may be oriented so that input beam 135 and output beam 125 are at least partially overlapped. In particular embodiments, input beam 135 may pass through a lens 330 which focuses the beam onto an active region of the receiver 140. The active region may refer to an area over which receiver 140 may receive or detect input light. The active region may have any suitable size or diameter d, such as for example, a diameter of approximately 25 µm, 50 µm, 80 µm, 100 µm, 200 µm, 500 µm, 1 mm, 2 mm, or 5 mm. In particular embodiments, overlap mirror 115 may have a reflecting surface 320 that is substantially flat or the reflecting surface 320 may be curved (e.g., mirror 115 may be an off-axis parabolic mirror configured to focus the input beam 135 onto an active region of the receiver 140). A reflecting surface 320 (which may be referred to as a reflective surface 320) may include a reflective metallic coating (e.g., gold, silver, or aluminum) or a reflective dielectric coating, and the reflecting surface 320 may have any suitable reflectivity R at an operating wavelength of the light source 110 (e.g., R greater than or equal to 70%, 80%, 90%, 95%, 98%, or 99%).

In particular embodiments, aperture 310 may have any suitable size or diameter $\Phi_1$, and input beam 135 may have any suitable size or diameter $\Phi_2$, where $\Phi_2$ is greater than $\Phi_1$. As an example, aperture 310 may have a diameter $\Phi_1$ of approximately 0.2 mm, 0.5 mm, 1 mm, 2 mm, 3 mm, 5 mm, or 10 mm, and input beam 135 may have a diameter $\Phi_2$ of approximately 2 mm, 5 mm, 10 mm, 15 mm, 20 mm, 30 mm, 40 mm, or 50 mm. In particular embodiments, reflective surface 320 of overlap mirror 115 may reflect greater than or equal to 70% of input beam 135 toward the receiver 140. As an example, if reflective surface 320 has a reflectivity R at an operating wavelength of the light source 110, then the fraction of input beam 135 directed toward the receiver 140 may be expressed as $R \times [1-(\Phi_1/\Phi_2)^2]$. For example, if R is 95%, $\Phi_1$ is 2 mm, and $\Phi_2$ is 10 mm, then approximately 91% of input beam 135 may be directed toward the receiver 140 by reflective surface 320.

Figure 4:
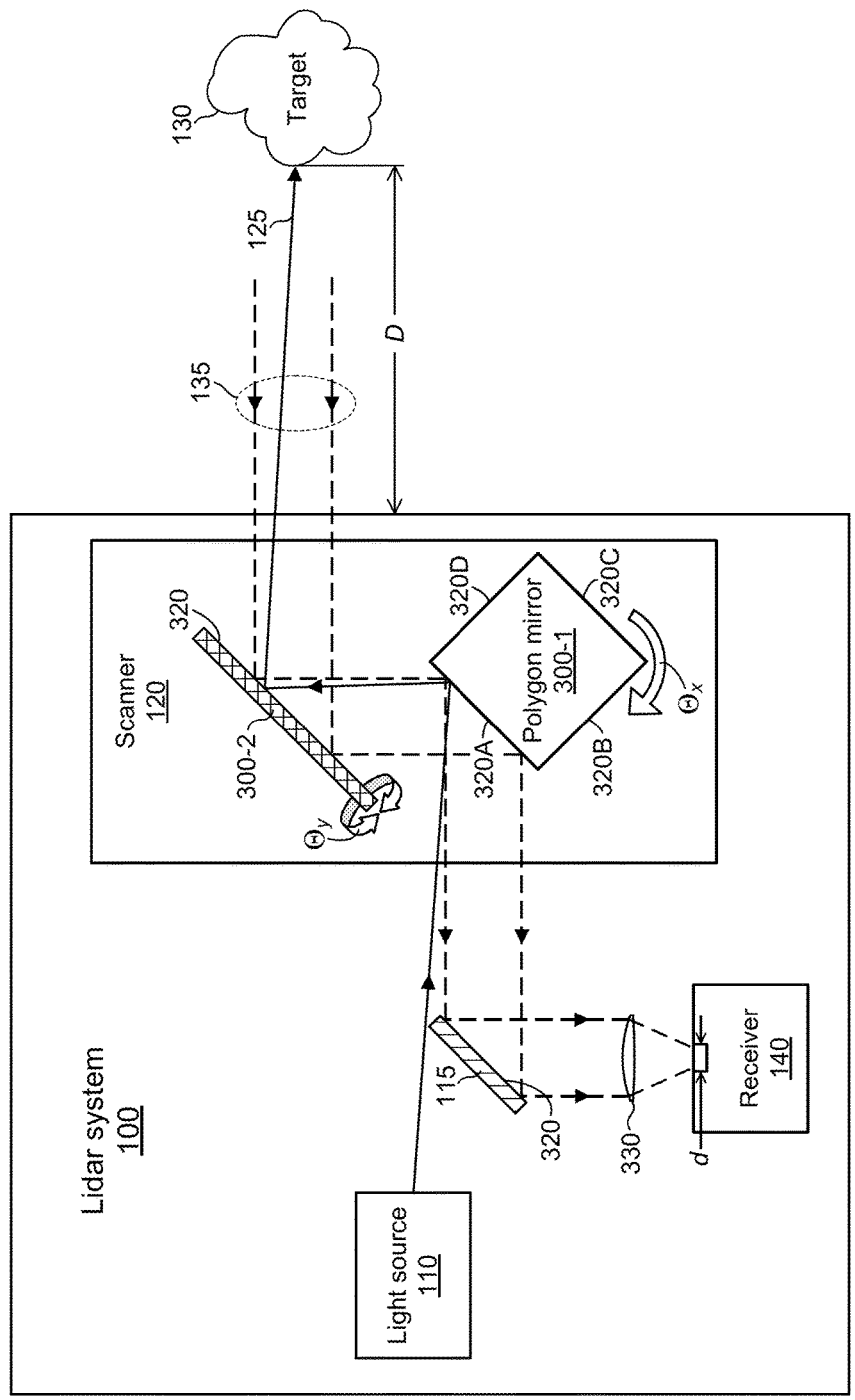
FIG. 4 illustrates an example lidar system with an example rotating polygon mirror.

FIG. 4 illustrates an example lidar system 100 with an example rotating polygon mirror 300-1. In particular embodiments, a scanner 120 may include a polygon mirror 300-1 configured to scan output beam 125 along a particular direction. In the example of FIG. 4, scanner 120 includes two scanning mirrors: (1) a polygon mirror 300-1 that rotates along the $\Theta_x$ direction and (2) a scanning mirror 300-2 that oscillates back and forth along the $\Theta_y$ direction. The output beam 125 from light source 110, which passes alongside mirror 115, is reflected by a reflecting surface (e.g., surface 320A, 320B, 320C, or 320D) of polygon mirror 300-1 and is then reflected by reflecting surface 320 of mirror 300-2. Scattered light from a target 130 returns to the lidar system 100 as input beam 135. The input beam 135 reflects from mirror 300-2, polygon mirror 300-1, and mirror 115, which directs input beam 135 through focusing lens 330 and to receiver 140.

In particular embodiments, a polygon mirror 300-1 may be configured to rotate along a $\Theta_x$ or $\Theta_y$ direction and scan output beam 125 along a substantially horizontal or vertical direction, respectively. A rotation along a $\Theta_x$ direction may refer to a rotational motion of mirror 300-1 that results in output beam 125 scanning along a substantially horizontal direction. Similarly, a rotation along a $\Theta_y$ direction may refer to a rotational motion that results in output beam 125 scanning along a substantially vertical direction. In FIG. 4, mirror 300-1 is a polygon mirror that rotates along the $\Theta_x$ direction and scans output beam 125 along a substantially horizontal direction, and mirror 300-2 rotates along the $\Theta_y$ direction and scans output beam 125 along a substantially vertical direction. In particular embodiments, a polygon mirror 300-1 may be configured to scan output beam 125 along any suitable direction. As an example, a polygon mirror 300-1 may scan output beam 125 at any suitable angle with respect to a horizontal or vertical direction, such as for example, at an angle of approximately 0°, 10°, 20°, 30°, 45°, 60°, 70°, 80°, or 90° with respect to a horizontal or vertical direction.

In particular embodiments, a polygon mirror 300-1 may refer to a multi-sided object having reflective surfaces 320 on two or more of its sides or faces. As an example, a polygon mirror may include any suitable number of reflective faces (e.g., 2, 3, 4, 5, 6, 7, 8, or 10 faces), where each face includes a reflective surface 320. A polygon mirror 300-1 may have a cross-sectional shape of any suitable polygon, such as for example, a triangle (with three reflecting surfaces 320), square (with four reflecting surfaces 320), pentagon (with five reflecting surfaces 320), hexagon (with six reflecting surfaces 320), heptagon (with seven reflecting surfaces 320), or octagon (with eight reflecting surfaces 320). In FIG. 4, the polygon mirror 300-1 has a substantially square cross-sectional shape and four reflecting surfaces (320A, 320B, 320C, and 320D). The polygon mirror 300-1 in FIG. 4 may be referred to as a square mirror, a cube mirror, or a four-sided polygon mirror. In FIG. 4, the polygon mirror 300-1 may have a shape similar to a cube, cuboid, or rectangular prism. Additionally, the polygon mirror 300-1 may have a total of six sides, where four of the sides are faces with reflective surfaces (320A, 320B, 320C, and 320D).

In particular embodiments, a polygon mirror 300-1 may be continuously rotated in a clockwise or counter-clockwise rotation direction about a rotation axis of the polygon mirror 300-1. The rotation axis may correspond to a line that is perpendicular to the plane of rotation of the polygon mirror 300-1 and that passes through the center of mass of the polygon mirror 300-1. In FIG. 4, the polygon mirror 300-1 rotates in the plane of the drawing, and the rotation axis of the polygon mirror 300-1 is perpendicular to the plane of the drawing. An electric motor may be configured to rotate a polygon mirror 300-1 at a substantially fixed frequency (e.g., a rotational frequency of approximately 1 Hz (or 1 revolution per second), 10 Hz, 50 Hz, 100 Hz, 500 Hz, or 1,000 Hz). As an example, a polygon mirror 300-1 may be mechanically coupled to an electric motor (e.g., a brushless DC motor or a synchronous electric motor) which is configured to spin the polygon mirror 300-1 at a rotational speed of approximately 160 Hz (or, 9600 revolutions per minute (RPM)).

In particular embodiments, output beam 125 may be reflected sequentially from the reflective surfaces (320A, 320B, 320C, and 320D) as the polygon mirror 300-1 is rotated. This results in the output beam 125 being scanned along a particular scan axis (e.g., a horizontal or vertical scan axis) to produce a sequence of scan lines, where each scan line corresponds to a reflection of the output beam 125 from one of the reflective surfaces of the polygon mirror 300-1. In FIG. 4, the output beam 125 reflects off of reflective surface 320A to produce one scan line. Then, as the polygon mirror 300-1 rotates, the output beam 125 reflects off of reflective surfaces 320B, 320C, and 320D to produce a second, third, and fourth respective scan line.

In particular embodiments, output beam 125 may be directed to pass by a side of mirror 115 rather than passing through mirror 115. As an example, mirror 115 may not include an aperture 310, and the output beam 125 may be directed to pass along a side of mirror 115. In the example of FIG. 3, lidar system includes an overlap mirror 115 with an aperture 310 that output beam 125 passes through. In the example of FIG. 4, output beam 125 from light source 110 is directed to pass by mirror 115 (which does not include an aperture 310) and then to polygon mirror 300-1.

Figure 5:
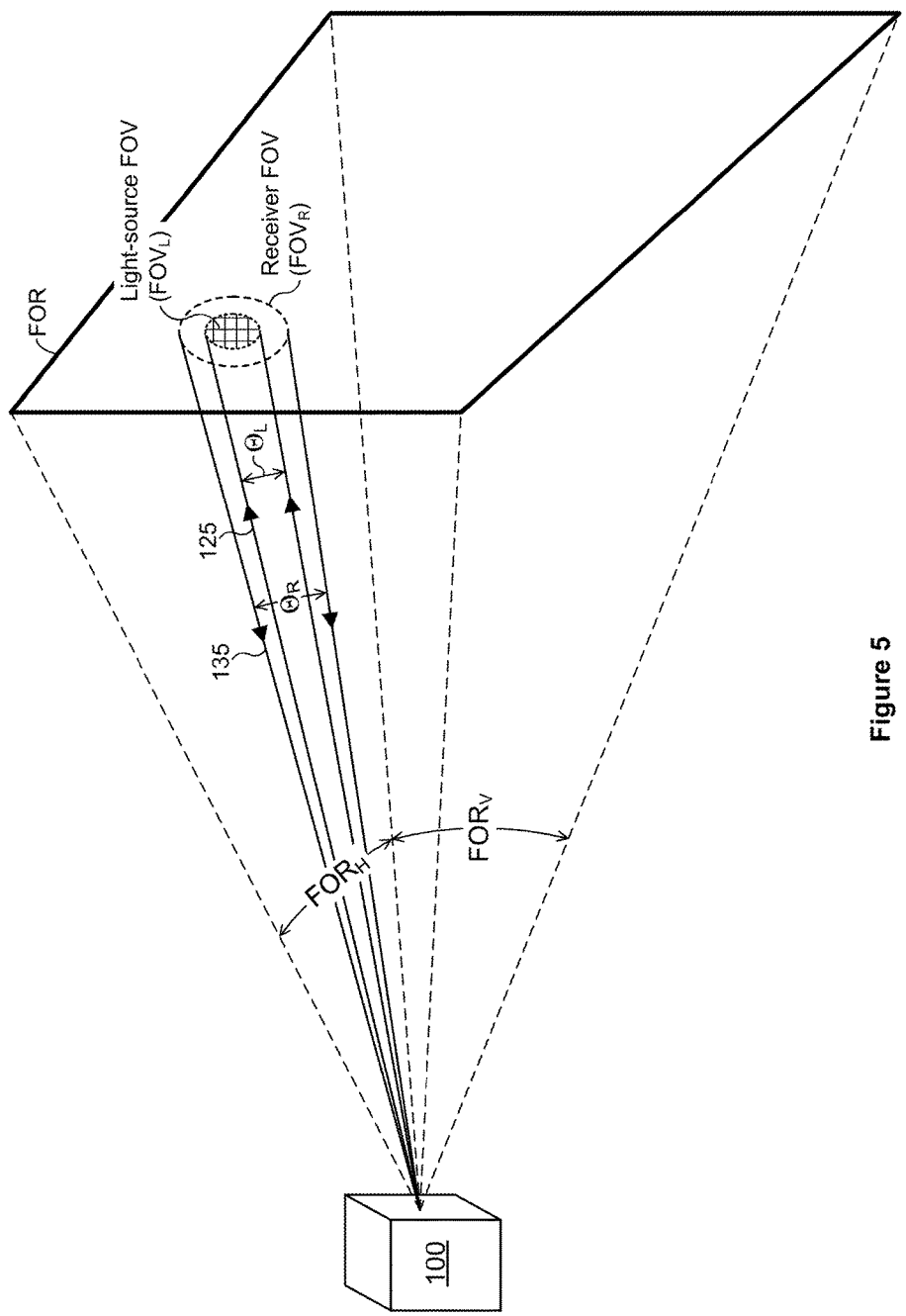
FIG. 5 illustrates an example light-source field of view and receiver field of view for a lidar system.

FIG. 5 illustrates an example light-source field of view ($FOV_L$) and receiver field of view ($FOV_R$) for a lidar system 100. A light source 110 of lidar system 100 may emit pulses of light as the $FOV_L$ and $FOV_R$ are scanned by scanner 120 across a field of regard (FOR). In particular embodiments, a light-source field of view may refer to an angular cone illuminated by the light source 110 at a particular instant of time. Similarly, a receiver field of view may refer to an angular cone over which the receiver 140 may receive or detect light at a particular instant of time, and any light outside the receiver field of view may not be received or detected. As an example, as the light-source field of view is scanned across a field of regard, a portion of a pulse of light emitted by the light source 110 may be sent downrange from lidar system 100, and the pulse of light may be sent in the direction that the $FOV_L$ is pointing at the time the pulse is emitted. The pulse of light may scatter off a target 130, and the receiver 140 may receive and detect a portion of the scattered light that is directed along or contained within the $FOV_R$.

In particular embodiments, scanner 120 may be configured to scan both a light-source field of view and a receiver field of view across a field of regard of the lidar system 100. Multiple pulses of light may be emitted and detected as the scanner 120 scans the $FOV_L$ and $FOV_R$ across the field of regard of the lidar system 100 while tracing out a scan pattern 200. In particular embodiments, the light-source field of view and the receiver field of view may be scanned synchronously with respect to one another, so that as the $FOV_L$ is scanned across a scan pattern 200, the $FOV_R$ follows substantially the same path at the same scanning speed. Additionally, the $FOV_L$ and $FOV_R$ may maintain the same relative position to one another as they are scanned across the field of regard. As an example, the $FOV_L$ may be substantially overlapped with or centered inside the $FOV_R$ (as illustrated in FIG. 5), and this relative positioning between $FOV_L$ and $FOV_R$ may be maintained throughout a scan. As another example, the $FOV_R$ may lag behind the $FOV_L$ by a particular, fixed amount throughout a scan (e.g., the $FOV_R$ may be offset from the $FOV_L$ in a direction opposite the scan direction).

In particular embodiments, the $FOV_L$ may have an angular size or extent $\Theta_L$ that is substantially the same as or that corresponds to the divergence of the output beam 125, and the $FOV_R$ may have an angular size or extent $\Theta_R$ that corresponds to an angle over which the receiver 140 may receive and detect light. In particular embodiments, the receiver field of view may be any suitable size relative to the light-source field of view. As an example, the receiver field of view may be smaller than, substantially the same size as, or larger than the angular extent of the light-source field of view. In particular embodiments, the light-source field of view may have an angular extent of less than or equal to 50 milliradians, and the receiver field of view may have an angular extent of less than or equal to 50 milliradians. The $FOV_L$ may have any suitable angular extent $\Theta_L$, such as for example, approximately 0.1 mrad, 0.2 mrad, 0.5 mrad, 1 mrad, 1.5 mrad, 2 mrad, 3 mrad, 5 mrad, 10 mrad, 20 mrad, 40 mrad, or 50 mrad. Similarly, the $FOV_R$ may have any suitable angular extent $\Theta_R$, such as for example, approximately 0.1 mrad, 0.2 mrad, 0.5 mrad, 1 mrad, 1.5 mrad, 2 mrad, 3 mrad, 5 mrad, 10 mrad, 20 mrad, 40 mrad, or 50 mrad. In particular embodiments, the light-source field of view and the receiver field of view may have approximately equal angular extents. As an example, $\Theta_L$ and $\Theta_R$ may both be approximately equal to 1 mrad, 2 mrad, or 4 mrad. In particular embodiments, the receiver field of view may be larger than the light-source field of view, or the light-source field of view may be larger than the receiver field of view. As an example, $\Theta_L$ may be approximately equal to 3 mrad, and $\Theta_R$ may be approximately equal to 4 mrad. As another example, $\Theta_R$ may be approximately L times larger than $\Theta_L$, where L is any suitable factor, such as for example, 1.1, 1.2, 1.5, 2, 3, 5, or 10.

In particular embodiments, a pixel 210 may represent or may correspond to a light-source field of view or a receiver field of view. As the output beam 125 propagates from the light source 110, the diameter of the output beam 125 (as well as the size of the corresponding pixel 210) may increase according to the beam divergence $\Theta_L$. As an example, if the output beam 125 has a $\Theta_L$ of 2 mrad, then at a distance of 100 m from the lidar system 100, the output beam 125 may have a size or diameter of approximately 20 cm, and a corresponding pixel 210 may also have a corresponding size or diameter of approximately 20 cm. At a distance of 200 m from the lidar system 100, the output beam 125 and the corresponding pixel 210 may each have a diameter of approximately 40 cm.

Figure 6:
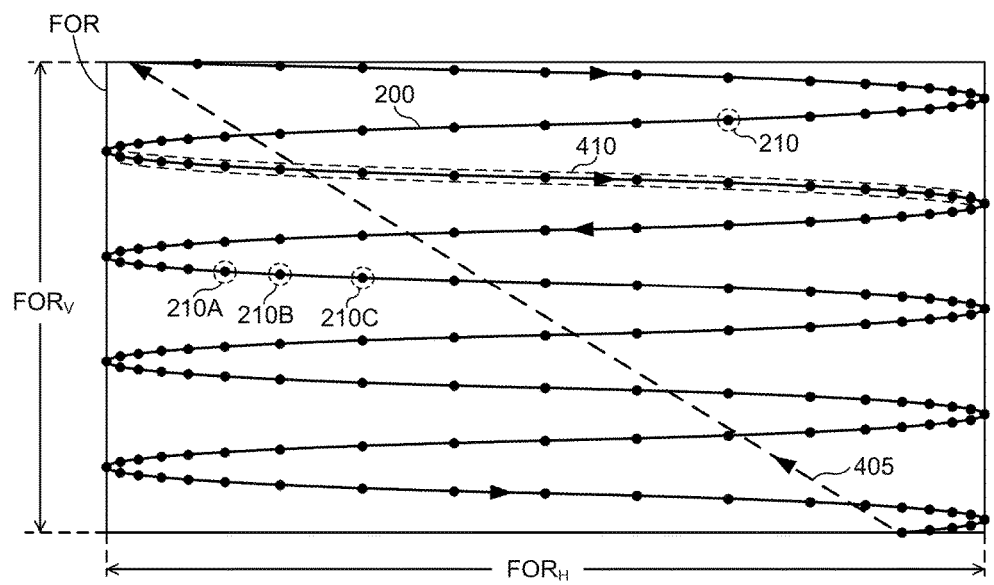
FIG. 6 illustrates an example scan pattern that includes multiple scan lines and multiple pixels.

FIG. 6 illustrates an example scan pattern 200 that includes multiple scan lines 410 and multiple pixels 210. In particular embodiments, scan pattern 200 may include any suitable number of scan lines 410 (e.g., approximately 1, 2, 5, 10, 20, 50, 100, 500, or 1,000 scan lines 410), and each scan line 410 of a scan pattern 200 may include any suitable number of pixels (e.g., 1, 2, 5, 10, 20, 50, 100, 200, 500, 1,000, 2,000, or 5,000 pixels 210). The scan pattern 200 illustrated in FIG. 6 includes approximately nine scan lines 410, and each scan line 410 includes approximately 18 pixels 210. In particular embodiments, each scan line 410 of a scan pattern 200 may include approximately the same number of pixels 210. As an example, each scan line 410 of a scan pattern 200 may include between approximately 950 and approximately 1,050 pixels 210. In particular embodiments, a scan pattern 200 where the scan lines 410 are scanned in two directions may be referred to as a bidirectional scan pattern 200, and a scan pattern 200 where the scan lines 410 are scanned in the same direction may be referred to as a unidirectional scan pattern 200. The scan pattern 200 in FIG. 6 may be referred to as a bidirectional scan pattern 200 where the scan lines 410 alternate between scanning from right to left and scanning from left to right. A bidirectional scan pattern 200 may be produced by a scanner 120 that includes a scanning mirror that oscillates in a back-and-forth motion corresponding to the bidirectional scan pattern 200.

In particular embodiments, a scan pattern 200 may include a retrace 405 where a scanner 120 resets from an end point of a scan 200 back to a starting point of the scan 200. The scan pattern 200 illustrated in FIG. 6 starts at the upper-left portion of the FOR and ends at the lower-right portion. In FIG. 6, the scan pattern 200 includes retrace 405 represented by a dashed diagonal line that connects the end of scan pattern 200 to the beginning. In particular embodiments, lidar system 100 may not send out pulses or acquire distance data during a retrace 405, or lidar system 100 may acquire distance data during a retrace 405 (e.g., a retrace path may include one or more pixels 210).

In particular embodiments, the pixels 210 of a scan pattern 200 may be substantially evenly spaced with respect to time or angle. As an example, each pixel 210 (and its associated pulse) may be separated from an immediately preceding or following pixel 210 by any suitable time interval, such as for example a time interval of approximately 0.5 µs, 1.0 µs, 1.4 µs, or 2.0 µs. In FIG. 6, pixels 210A, 210B, and 210C may be associated with pulses that were emitted with a 1.6 µs fixed time interval between the pulses. As another example, each pixel 210 (and its associated pulse) may be separated from an immediately preceding or following pixel 210 by any suitable angle, such as for example an angle of approximately 0.01°, 0.02°, 0.05°, 0.1°, 0.2°, 0.3°, 0.5°, or 1°. In FIG. 6, pixels 210A and 210B may have an angular separation of approximately 0.1° (e.g., pixels 210A and 210B may each be associated with optical beams separated by an angle of 0.1°). In particular embodiments, the pixels 210 of a scan pattern 200 may have an adjustable spacing with respect to time or angle. As an example, a time interval or angle separating two successive pixels 210 may be dynamically varied during a scan or from one scan to a subsequent scan.

In particular embodiments, lidar system 100 may include a scanner 120 configured to direct output beam 125 along any suitable scan pattern 200. As an example, all or part of scan pattern 200 may follow a substantially sinusoidal path, triangle-wave path, square-wave path, sawtooth path, piecewise linear path, periodic-function path, or any other suitable path or combination of paths. In the example of FIG. 6, scan pattern 200 corresponds to an approximately sinusoidal path, where pixels 210 are arranged along a sinusoidal curve.

In particular embodiments, pixels 210 may be substantially evenly distributed across scan pattern 200, or pixels 210 may have a distribution or density that varies across a FOR of scan pattern 200. In the example of FIG. 6, pixels 210 have a greater density toward the left and right edges of the FOR, and the pixel density in the middle region of the FOR is lower compared to the edges. As an example, pixels 210 may be distributed so that ≥40% of the pixels 210 are located in the left 25% of the FOR, ≥40% of the pixels 210 are located in the right 25% of the FOR, and the remaining <20% of the pixels 210 are located in the middle 50% of the FOR. In particular embodiments, a time interval or angle between pixels 210 may be dynamically adjusted during a scan so that a scan pattern 200 has a particular distribution of pixels 210 (e.g., a higher density of pixels 210 in one or more particular regions). As an example, a scan pattern 200 may be configured to have a higher density of pixels 210 in a middle or central region of scan 200 or toward one or more edges of scan 200 (e.g., a middle region or a left, right, upper, or lower edge that includes approximately 5%, 10%, 20%, 30%, or any other suitable percentage of the FOR of scan pattern 200). For example, pixels 210 may be distributed so that ≥50% of the pixels 210 are located in a central, left, or right region of scan pattern 200 with the remaining <50% of the pixels 210 distributed throughout the rest of scan pattern 200. As another example, a scan pattern 200 may have a higher density of pixels along a right edge of the scan pattern 200 than along a left edge of the scan pattern 200.

In particular embodiments, a distribution of pixels 210 in a scan pattern 200 may be determined, at least in part, by a pulse period of light source 110, a scanning speed provided by scanner 120, or a shape or path followed by scan pattern 200. As an example, the pulse period of light source 110 may be a substantially fixed value, or the pulse period may be adjusted dynamically during a scan to vary the density of pixels 210 across the scan region. As another example, an angular speed with which a mirror (e.g., mirror 300-1 or mirror 300-2) of scanner 120 rotates may be substantially fixed or may vary during a scan. As another example, a scan pattern 200 may provide for a varying distribution of pixels 210 based on a shape of the pattern. For example, a triangle-wave scan pattern 200 (combined with a substantially constant pulse period and angular speed) may provide a substantially uniform distribution of pixels 210 along the horizontal direction, while a sinusoidal scan pattern 200 may result in a higher density of pixels 210 along the left and right edges and a lower density of pixels 210 in the middle region. Additionally, two or more scan parameters may be selected or adjusted to optimize or adjust the density of pixels 210 in a scan pattern 200. As an example, a sinusoidal scan pattern 200 may be combined with a dynamically adjusted pulse period of light source 100 to provide for a higher density of pixels 210 along the right edge and a lower density of pixels 210 in the middle region and along the left edge.

In particular embodiments, a particular scan pattern 200 may be repeated from one scan to the next, or one or more parameters of a scan pattern 200 may be adjusted or varied within a scan or from one scan to another. As an example, a time interval or angle between pixels 210 may be varied from one scan to another scan. A relatively long time interval may be applied in an initial scan to produce a moderate-density point cloud, and a relatively short time interval may be applied in a subsequent scan to produce a high-density point cloud. As another example, a time interval or angle between pixels 210 may be varied within a particular scan pattern 200. For a particular region of a scan pattern 200, a time interval may be decreased to produce a higher density of pixels 210 within that particular region.

Figure 7:
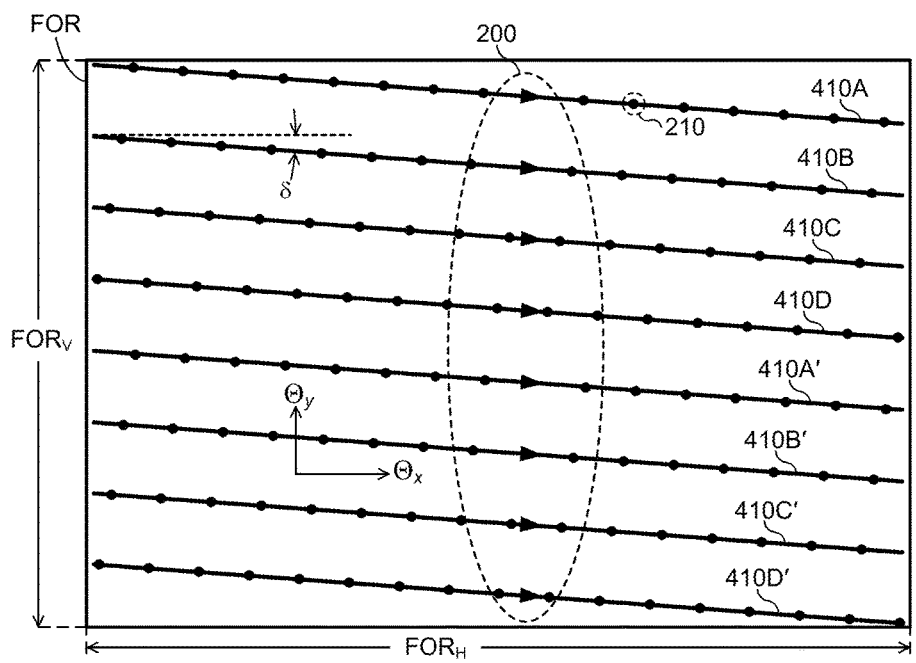
FIG. 7 illustrates an example unidirectional scan pattern 200.

FIG. 7 illustrates an example unidirectional scan pattern 200. Each scan line 410 in FIG. 7 travels across the FOR in substantially the same direction (e.g., from left to right). In particular embodiments, scan lines 410 of a unidirectional scan pattern 200 may be directed across a FOR in any suitable direction, such as for example, from left to right, from right to left, from top to bottom, from bottom to top, or at any suitable angle (e.g., at a 5°, 10°, 30°, or 45° angle) with respect to a horizontal or vertical axis. In particular embodiments, each scan line 410 in a unidirectional scan pattern 200 may be a separate line that is not directly connected to a previous or subsequent scan line 410.

In particular embodiments, a unidirectional scan pattern 200 may be produced by a scanner 120 that includes a polygon mirror (e.g., polygon mirror 300-1 of FIG. 4), where each scan line 410 is associated with a particular reflective surface 320 of the polygon mirror. As an example, reflective surface 320A of polygon mirror 300-1 in FIG. 4 may produce scan line 410A in FIG. 7. Similarly, as the polygon mirror 300-1 rotates, reflective surfaces 320B, 320C, and 320D may successively produce scan lines 410B, 410C, and 410D, respectively. Additionally, for a subsequent revolution of the polygon mirror 300-1, the scan lines 410A', 410B', 410C', and 410D' may be successively produced by reflections of the output beam 125 from reflective surfaces 320A, 320B, 320C, and 320D, respectively. In particular embodiments, N successive scan lines 410 of a unidirectional scan pattern 200 may correspond to one full revolution of a N-sided polygon mirror. As an example, the four scan lines 410A, 410B, 410C, and 410D in FIG. 7 may correspond to one full revolution of the four-sided polygon mirror 300-1 in FIG. 4. Additionally, a subsequent revolution of the polygon mirror 300-1 may produce the next four scan lines 410A', 410B', 410C', and 410D' in FIG. 7.

In particular embodiments, during at least a portion of a scan, light source 110 may be configured to emit pulses of light at a substantially constant pulse repetition frequency, or light source 110 may be configured to vary the pulse repetition frequency. Additionally, a scanning mirror of scanner 120 may scan output beam 125 (which includes at least a portion of the pulses of light emitted by the light source 110) at a substantially constant angular scanning speed. As an example, polygon mirror 300-1 in FIG. 4 may rotate at a substantially constant rotation speed, and the output beam 125 may scan across the FOR (e.g., along scan axis $\Theta_x$) at a corresponding constant angular scanning speed. If a polygon mirror 300-1 has a rotation speed of R (e.g., in units of revolutions per second or degrees per second), then the output beam 125 may scan across the FOR at an angular scanning speed of approximately 2R, since a $\Theta$-degree rotation of polygon mirror 300-1 results in a 2$\Theta$-degree angular motion of output beam 125. For example, if the polygon mirror 300-1 has a rotation speed of 10,000 degrees per second, then the output beam 125 may scan across the FOR at an angular scanning speed of approximately 20,000 degrees per second. In particular embodiments, the number of scan lines 410 per second produced by a polygon mirror 300-1 with N reflective surfaces 320 and a rotation speed R may be expressed as R×N, where R has units of revolutions per second. As an example, if the 4-sided polygon mirror 300-1 in FIG. 4 has a rotation speed of 150 revolutions per second, then the lidar system 100 may produce approximately 600 scan lines 410 per second.

In particular embodiments, the angular scanning speed $\omega_x$ (in units of deg/s) of the output beam 125 along scan axis $\Theta_x$ may be expressed as $\omega_x=2\times R\times 360$, where R has units of revolutions per second. For example, if polygon mirror 300-1 rotates at 100 revolutions per second (which corresponds to an angular rotation rate of approximately 36,000 degrees per second, or 628 radians per second), then the output beam 125 may scan along scan axis $\Theta_x$ at an angular scanning speed of approximately 72,000 degrees per second (or approximately 1,257 radians per second). The expression $FOR_H/(2\times R\times 360)$ represents the time for the output beam 125 to make a single scan across $FOR_H$ (along scan axis $\Theta_x$) and produce a single scan line 410. As an example, for a $FOR_H$ of 60° and a 100-Hz rotation speed (100 revolutions per second), one scan line 410 may be traced across the $FOR_H$ in approximately 0.83 ms. In particular embodiments, each scan line 410 of a scan pattern 200 may include approximately the same number of pixels 210. As an example, if the light-source pulse repetition frequency (PRF) is substantially constant and the rotation speed R of polygon mirror 300-1 is substantially constant, then each scan line 410 may include approximately the same number of pixels 210. As another example, each of the scan lines 410 in FIG. 7 may include approximately 1,000 pixels 210. The approximate number of pixels 210 in one scan line 410 may be found from the expression $P=(PRF\times FOR_H)/(2\times R\times 360)$. For example, if the rotation speed R is 100 revolutions per second, the $FOR_H$ is 60° degrees, and the PRF is 600 kHz, then each scan line 410 includes approximately P=500 pixels 210.

In particular embodiments, the output beam 125 may have any suitable angular scan rate along the $\Theta_y$ scan axis, such as for example an angular scan rate of approximately 1, 2, 5, 10, 20, 50, 100, 300, or 1,000 degrees per second. In particular embodiments, an angular scan rate may be referred to as a scan rate, a scan speed, an angular scan speed, a scanning speed, or an angular scanning speed. The angular scanning speed along scan axis $\Theta_y$ may be expressed as $\omega_y = \Delta\Theta_y/\tau_y$, where $\Delta\Theta_y$ is an angular range of the scan pattern 200 along the $\Theta_y$ scan axis, and $\tau_y$ is a time for the output beam 125 to travel across $\Delta\Theta_y$ and trace out a single scan pattern 200 from a starting point to an end point (not including the time to perform a retrace 405). As an example, if $\Delta\Theta_y$ is 30° and $\tau_y$ is 100 ms, then the angular scanning speed along scan axis $\Theta_y$ is approximately 300 degrees per second. As another example, if $\Delta\Theta_y$ is 2° and $\tau_y$ is 40 ms, then the angular scanning speed along scan axis $\Theta_y$ is approximately 50 degrees per second. In FIG. 7, the angular scan range along the $\Theta_y$ scan axis is approximately equal to $FOR_V$. The scan time $\tau_y$ may be related to the frame rate F at which the lidar system 100 scans by the expression $F = 1/(\tau_y + \tau_{retrace})$, where $\tau_{retrace}$ is a time for the output beam 125 to traverse the retrace path 405. Based on this, the angular scanning speed along scan axis $\Theta_y$ may be expressed as $\omega_y = (\Delta\Theta_y \times F)/(1 - F \times \tau_{retrace})$. As an example, for a 10-Hz frame rate over a 30° range with a 10 ms retrace time, the scanning speed $\omega_y$ is approximately 333 degrees per second. As another example, for a 1-Hz scan rate over a 5° range with a 20 ms retrace time, the scanning speed $\omega_y$ is approximately 5.1 degrees per second.

In particular embodiments, a scan line 410 may have an incline angle δ with respect to the $\Theta_x$ axis. The incline angle δ may have any suitable value, such as for example, approximately 0°, 0.1°, 0.2°, 0.5°, 1°, 2°, 5°, or 10°. The incline angle δ may be oriented upward or downward according to the direction the output beam 125 is scanned along the $\Theta_y$ scan axis. In FIG. 7, the output beam is scanned along the $\Theta_y$ scan axis from top to bottom, and each scan line 410 is angled downward (with respect to the $\Theta_x$ axis) at an incline angle δ of approximately 4°. In particular embodiments, the incline angle δ may depend on the angular scanning speeds along the scan axes $\Theta_x$ and $\Theta_y$ and may be expressed as $\delta = \arctan(\omega_y/\omega_x)$. As an example, if the output beam 125 is scanned along scan axis $\Theta_x$ at an angular scanning speed $\omega_x$ of 72,000 degrees per second and along scan axis $\Theta_y$ at an angular scanning speed $\omega_y$ of 300 degrees per second, then scan lines 410 may have an incline angle δ of approximately 4.2 mrad (or, approximately 0.24°). As another example, if $\omega_x$ is 10,000 degrees per second and $\omega_y$ is 350 degrees per second, then scan lines 410 may have an incline angle δ of approximately 2°, and each scan line 410 may be oriented downward at 2° with respect to the $\Theta_x$ axis.

Figure 8:
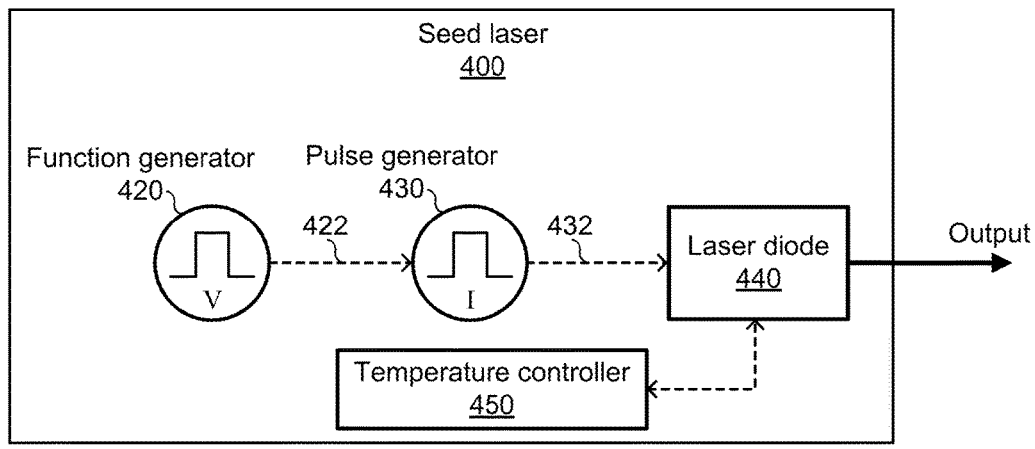
FIG. 8 illustrates an example seed laser that includes a laser diode driven by a pulse generator.

FIG. 8 illustrates an example seed laser 400 that includes a laser diode 440 driven by a pulse generator 430. In particular embodiments, a seed laser 400 may include a function generator 420, a pulse generator 430, a laser diode 440, or a temperature controller 450. In the example of FIG. 8, seed laser 400 includes function generator 420 coupled to pulse generator 430, which is in turn coupled to laser diode 440. Additionally, temperature controller 450 is coupled to laser diode 440. In particular embodiments, all or part of function generator 420, pulse generator 430, or temperature controller 450 may be included in seed laser 400 or may be located remote from seed laser 400. As an example, all or part of function generator 420, pulse generator 430, or temperature controller 450 may be included in controller 150. In particular embodiments, a seed laser 400 or a laser diode 440 may be referred to as a pulsed laser, a pulsed laser diode, a seed laser diode, a seed laser, or a seed.

In particular embodiments, seed laser 400 may produce optical seed pulses, which are emitted at the seed-laser output (which may be a free-space output or a fiber-optic output). In particular embodiments, the optical seed pulses may have a pulse repetition frequency of less than or equal to 100 MHz (e.g., approximately 500 kHz, 640 kHz, 750 kHz, 1 MHz, 2 MHz, 4 MHz, 5 MHz, 10 MHz, 20 MHz, 50 MHz, or 100 MHz), a pulse duration of less than or equal to 100 nanoseconds (e.g., approximately 200 ps, 400 ps, 500 ps, 800 ps, 1 ns, 2 ns, 4 ns, 8 ns, 10 ns, 20 ns, 50 ns, or 100 ns), a duty cycle of less than or equal to 10% (e.g., approximately 0.01%, 0.02%, 0.05%, 0.1%, 0.2%, 0.5%, 1%, 2%, 5%, or 10%), or an operating wavelength of between 1400 nm and 2050 nm. As an example, the seed pulses may have a pulse repetition frequency of 500-750 kHz, a pulse duration of less than or equal to 2 ns, and a duty cycle of less than or equal to 0.1%. As another example, the seed pulses may have a pulse repetition frequency of approximately 640 kHz and a pulse duration of approximately 1 ns (which corresponds to a duty cycle of approximately 0.064%). As another example, the seed pulses may have a pulse repetition frequency of approximately 750 kHz and a pulse duration of approximately 20 ns (which corresponds to a duty cycle of approximately 1.5%). A duty cycle may be determined from the ratio of pulse duration to pulse period or from the product of pulse duration and pulse repetition frequency. The laser diode 440 may have any suitable operating wavelength, such as for example, an operating wavelength of approximately 1400 nm, 1500 nm, 1550 nm, 1600 nm, or 2000 nm. In particular embodiments, the seed pulses may be relatively low-power optical pulses, and the seed-laser output may be coupled to one or more optical amplifiers configured to amplify the low-power pulses to produce amplified pulses of light which are emitted by light source 110. As an example, the seed pulses may have an average power of greater than or equal to 1 µW. As another example, the seed pulses may have an average power of between approximately 0.1 µW and 10 µW.

In particular embodiments, seed laser 400 may include a laser diode 440 that is electrically driven by pulse generator 430 to produce optical seed pulses. In the example of FIG. 8, function generator 420 supplies a voltage signal 422 to pulse generator 430, and pulse generator 430 drives laser diode 440 with a current signal 432. As an example, function generator 420 may produce a pulsed voltage signal with a pulse repetition frequency of between approximately 0.5 and 2 MHz and a pulse duration of approximately 1-2 ns. Pulse generator 430 may drive laser diode 440 with a pulsed current signal 432 that corresponds to the voltage signal 422 received from function generator 420. In particular embodiments, voltage signal 422 may include voltage pulses having any suitable shape, such as for example, square-shaped pulses, triangle-shaped pulses, Gaussian-shaped pulses, or pulses having an arbitrary shape or a combination of shapes. In particular embodiments, current signal 432 may have a DC offset or may include current pulses having any suitable shape, such as for example, square-shaped pulses, triangle-shaped pulses, Gaussian-shaped pulses, or pulses having an arbitrary shape or a combination of shapes. The pulses of current signal 432 may have a shape or duration similar to that of voltage signal 422. Additionally, laser diode 440 may emit optical pulses with a shape (e.g., square, triangle, Gaussian, or arbitrary) or duration that at least approximately corresponds to the shape or duration of the current pulses supplied by pulse generator 430.

In particular embodiments, laser diode 440 may be a Fabry-Perot laser diode, a DFB laser, or a DBR laser. As an example, laser diode 440 may be a DFB laser coupled to an optical fiber or a DFB laser configured to emit a free-space output beam. Additionally, the light emitted by laser diode 440 may pass through an optical isolator that reduces the amount of back-reflected light that may be coupled back into the laser diode 440. In particular embodiments, seed laser 400 may include a single laser diode 440 having a substantially fixed operating wavelength. As an example, laser diode 440 may be a single-wavelength laser configured to operate at a particular operating wavelength with limited wavelength tunability. As another example, laser diode 440 may include a DFB laser with an operating wavelength between approximately 1400 nm and 1600 nm, and the DFB laser may be wavelength tunable over a range of approximately 4 nm (e.g., by adjusting the operating temperature of the laser diode 440).

In particular embodiments, laser diode 440 may operate without temperature control, or seed laser 400 may include a temperature controller 450 to stabilize the operating temperature of laser diode 440. As an example, the package or the semiconductor substrate of laser diode 440 may be thermally coupled to a thermoelectric cooler (TEC) driven by temperature controller 450 to adjust or stabilize the laser-diode operating temperature. The laser-diode operating temperature may be stabilized to within any suitable range of a target temperature set point, such as for example, within approximately ±0.01° C., ±0.05° C., ±0.1° C., ±0.5° C., or ±1° C. of a target temperature. Stabilization of the temperature of laser diode 440 may provide for the laser-diode operating wavelength to be substantially stable (e.g., the peak wavelength of laser diode 440 may vary by less than any suitable value, such as for example, less than approximately 0.1 nm, 0.5 nm, 1 nm, or 2 nm). If lidar system 100 includes a narrow-band optical filter, then the laser diode 440 may be temperature stabilized so as to match the laser-diode operating wavelength to the passband of the optical filter. In particular embodiments, the temperature controller 450 may be used to adjust the operating wavelength of laser diode 440 by adjusting the laser-diode set-point temperature. As an example, the laser diode 440 may include a DFB laser with an operating wavelength that may be temperature tuned from approximately 1548 nm to approximately 1552 nm by adjusting the temperature set-point of the laser.

In particular embodiments, seed laser 400 may include a wavelength-tunable laser configured to produce light at multiple wavelengths. As an example, a wavelength-tunable laser may produce optical pulses at multiple wavelengths of light which are sent to multiple respective sensor heads of a lidar system 100. In particular embodiments, laser diode 440 may be a wavelength-tunable laser. As an example, laser diode 440 may have an operating wavelength that may be tunable over any suitable wavelength range, such as for example, 1 nm, 10 nm, 20 nm, 50 nm, or 100 nm. As another example, laser diode 440 may be tunable from approximately 1400 nm to approximately 1440 nm or from approximately 1530 nm to approximately 1560 nm. In particular embodiments, laser diode 440 may be an external-cavity diode laser which includes a laser diode and a wavelength-selective element, such as for example, an external diffraction grating or a grating structure integrated within the semiconductor structure of the laser diode. In particular embodiments, laser diode 440 may be configured to produce optical pulses at multiple wavelengths. As an example, laser diode 440 may produce sequences of pulses having N different wavelengths. The pulses may be amplified and each pulse may be conveyed to one or more particular sensor heads based on the wavelength of the pulse.

Figure 9:
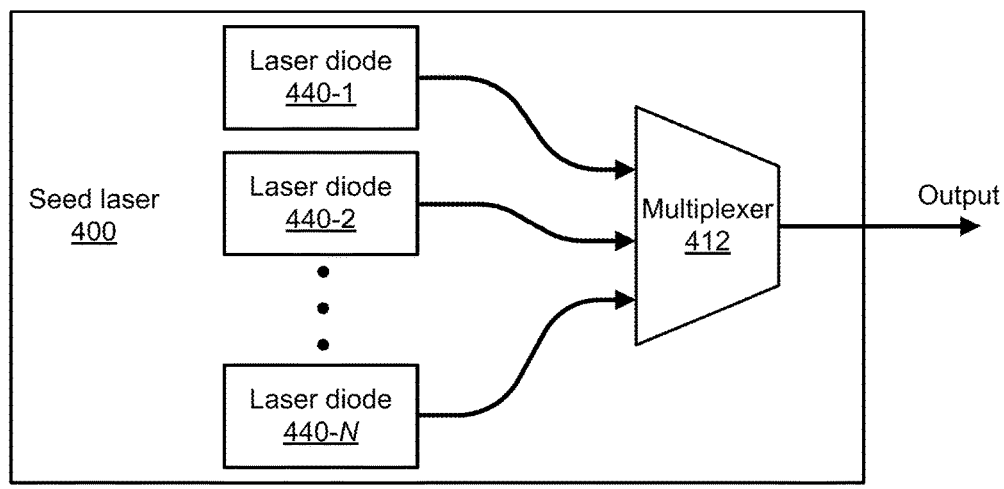
FIG. 9 illustrates an example seed laser with multiple laser diodes that are combined together by a multiplexer.

FIG. 9 illustrates an example seed laser 400 with multiple laser diodes (440-1, 440-2, ..., 440-N) that are combined together by a multiplexer 412. In particular embodiments, seed laser 400 may include multiple laser diodes 440 configured to operate at multiple different wavelengths and an optical multiplexer 412 configured to combine the light produced by each laser diode 440 into a single output optical fiber. As an example, seed laser 400 may include N laser diodes 440 configured to operate at N different wavelengths. In particular embodiments, each laser diode 440 may be a pulsed laser diode driven by a separate pulse generator 430 (not illustrated in FIG. 9). As an example, N separate pulse generators 430 may each be driven or triggered by a separate function generator 420 (not illustrated in FIG. 9). The function generators 420 may operate independently or may be synchronized with respect to one another so that the pulses can be emitted with a particular time delay between successive pulses. As another example, the N pulse generators 430 may be driven by a single function generator 420 that has N trigger-signal outputs. Additionally, the function generator 420 may have N−1 electrical delays so that the pulses from each laser diode 440 can be synchronized or time-delayed with respect to one another. In particular embodiments, any suitable number of function generators 420, pulse generators 430, or electrical delays may be integrated together into a single device.

In particular embodiments, multiplexer 412 may be referred to as a wavelength combiner, a mux, or a wavelength-division multiplexer (WDM). In particular embodiments, multiplexer 412 may include an optical-power splitter, an optical switch, a wavelength multiplexer configured to combine different wavelengths of light, or any suitable combination thereof. Multiplexer 412 may have N input ports coupled to N laser diodes 440, and multiplexer 412 may combine light from the input ports together into a single output port. In particular embodiments, a N×1 multiplexer 412 may perform wavelength combining using a prism, diffraction grating, holographic grating, arrayed waveguide grating, or one or more dichroic filters. In particular embodiments, seed laser 400 may include N optical amplifiers (not illustrated in FIG. 9). As an example, each laser diode 440 may be coupled to an optical amplifier located between the laser diode and the multiplexer 412. The optical amplifiers may be configured to amplify the light from each laser diode 440 separately prior to combining in multiplexer 412.

In particular embodiments, the N laser diodes 440 may produce optical pulses at N respective wavelengths, and each laser diode 440 may produce pulses at a pulse repetition frequency f. Additionally, the pulses produced by each of the laser diodes 440 may be synchronized so that after being combined together by multiplexer 412 the output seed pulses include N sets of time-interleaved pulses which are substantially evenly spaced in time. As an example, each laser diode 440 may emit pulses that are delayed with respect to pulses from a preceding laser diode 440 by a time delay of $1/(f \times N)$. The pulses from the N laser diodes 440 may be combined by the N×1 multiplexer 412, resulting in an output seed-laser repetition frequency of f×N. As an example, seed laser 400 may include N=8 laser diodes 440, and each laser diode 440 may produce pulses at a f=640-kHz pulse repetition frequency with a time delay relative to pulses emitted by a preceding laser diode 440 of $1/(640\text{ kHz} \times 8) \cong 195$ ns. This results in an output seed-laser repetition frequency of approximately 5.12 MHz with a pulse period of approximately 195 ns. In particular embodiments, the output seed-laser pulses may be sent to a fiber-optic amplifier for amplification. A fiber-optic amplifier may exhibit improved performance (e.g., reduced amplified spontaneous emission) when amplifying the output seed-laser pulses due to the higher pulse repetition frequency and higher duty cycle provided by combining pulses from multiple laser diodes 440 into a single pulse stream for amplification. Additionally, undesirable nonlinear effects in optical fiber may be reduced or avoided by interleaving the pulses in a time-synchronized manner so that the pulses do not overlap in time.

Figure 10:
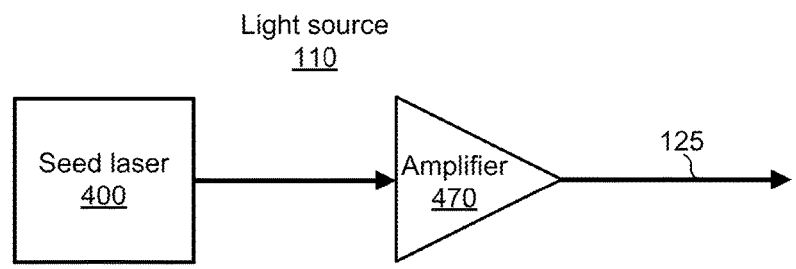
FIG. 10 illustrates an example light source that includes a seed laser and an amplifier.

FIG. 10 illustrates an example light source 110 that includes a seed laser 400 and an amplifier 470. In particular embodiments, a light source 110 may include one or more seed lasers 400 or one or more amplifiers 470. In particular embodiments, seed laser 400 may include (1) a laser diode (e.g., a DFB laser) driven by a pulse generator 430, (2) a wavelength-tunable laser configured to produce light at multiple wavelengths, (3) multiple laser diodes 440 configured to produce light at multiple respective wavelengths, or (4) any other suitable laser source. In particular embodiments, seed laser 400 may produce low-power optical pulses, and one or more optical amplifiers 470 may be configured to amplify the low-power pulses to produce amplified pulses of light. The amplified pulses of light may be emitted as output beam 125. As an example, amplifier 470 may receive optical seed pulses having an average power of greater than or equal to 1 microwatt, and the amplified output pulses from the amplifier 470 may have an average power of greater than or equal to 1 mW. As another example, amplifier 470 may receive optical seed pulses having a pulse energy of greater than or equal to 1 pJ, and the amplified output pulses from the amplifier 470 may have a pulse energy of greater than or equal to 0.1 µJ.

In particular embodiments, an amplifier 470 may be referred to as a fiber amplifier, optical amplifier, fiber-optic amplifier, optical amp, or amp. In particular embodiments, all or part of an amplifier 470 may be included in light source 110. In particular embodiments, an amplifier 470 may include any suitable number of optical-amplification stages. As an example, an amplifier 470 of a lidar system 100 may include 1, 2, 3, 4, or 5 optical-amplification stages. In particular embodiments, amplifier 470 may include a single-pass amplifier in which light makes one pass through the amplifier 470. In particular embodiments, amplifier 470 may include a double-pass amplifier in which light makes two passes through the amplifier gain medium. In particular embodiments, amplifier 470 may act as a preamplifier (e.g., an amplifier that amplifies seed pulses from a laser diode 440 or a seed laser 400), a mid-stage amplifier (e.g., an amplifier that amplifies light from another amplifier), or a booster amplifier (e.g., an amplifier that sends a free-space output beam 125 to a scanner 120). A preamplifier may refer to the first amplifier in a series of two or more amplifiers, a booster amplifier may refer to the last amplifier in a series of amplifiers, or a mid-stage amplifier may refer to any amplifier located between a preamplifier and a booster amplifier.

In particular embodiments, amplifier 470 may provide any suitable amount of optical power gain, such as for example, a gain of approximately 5 dB, 10 dB, 20 dB, 30 dB, 40 dB, 50 dB, 60 dB, or 70 dB. As an example, amplifier 470 (which may include two or more separate amplification stages) may receive pulses with a 1-µW average power and produce amplified pulses with a 5-W average power, corresponding to an optical power gain of approximately 67 dB. As another example, amplifier 470 may include two or more amplification stages each having a gain of greater than or equal to 20 dB, corresponding to an overall gain of greater than or equal to 40 dB. As another example, amplifier may include three amplification stages (e.g., a preamplifier, a mid-stage amplifier, and a booster amplifier) having gains of approximately 30 dB, 20 dB, and 10 dB, respectively, corresponding to an overall gain of approximately 60 dB.

In particular embodiments, an optical fiber, which may convey, carry, transport, or transmit light from one optical component to another, may be referred to as a fiber-optic cable, a fiber, an optical link, a fiber-optic link, or a fiber link. An optical fiber may include single-mode (SM) fiber, large-mode-area (LMA) fiber, multi-mode (MM) fiber, polarization-maintaining (PM) fiber, photonic-crystal or photonic-bandgap fiber, gain fiber (e.g., rare-earth-doped optical fiber for use in an optical amplifier), multi-clad fiber (e.g., a double-clad fiber having a core, inner cladding, and outer cladding), or any other suitable optical fiber, or any suitable combination thereof. As an example, an optical fiber may include a glass SM fiber with a core diameter of approximately 8 µm and a cladding diameter of approximately 125 µm. As another example, an optical fiber may include a photonic-crystal fiber or a photonic-bandgap fiber in which light is confined or guided by an arrangement of holes distributed along the length of a glass fiber. In particular embodiments, one end of an optical fiber may be coupled to, attached to, or terminated at an output collimator. An output collimator may include a lens, a GRIN lens, or a fiber-optic collimator that receives light from a fiber-optic cable and produces a free-space optical beam 125. In FIG. 10, an optical fiber may convey optical pulses amplified by amplifier 470 to an output collimator that produces a free-space optical beam 125.

Figure 11:
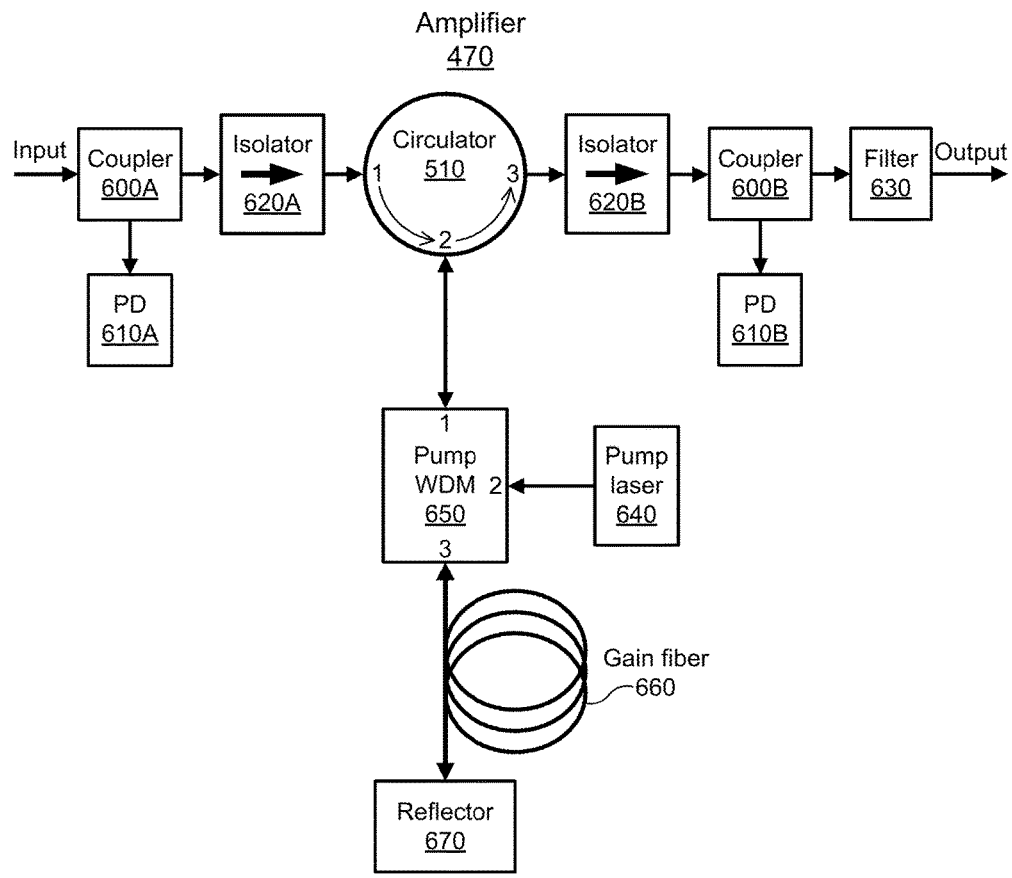
FIG. 11 illustrates an example double-pass fiber-optic amplifier.

FIG. 11 illustrates an example double-pass fiber-optic amplifier 470. In particular embodiments, an optical amplifier 470 may receive light at its input, amplify the input light, and send the amplified light to an output. The received input light may include optical pulses from a seed laser 400 or from a previous amplification stage (e.g., two or more amplifiers 470 may be coupled together in series). The amplified output light may be sent to another amplifier 470 (e.g., to provide another stage of amplification), a demultiplexer (e.g., for distribution to multiple optical links or multiple sensor heads), an optical link (e.g., a fiber-optic cable), a sensor head, or a scanner 120. In particular embodiments, an amplifier 470 may be part of a master oscillator power amplifier (MOPA) or master oscillator fiber amplifier (MOFA) in which a master oscillator (e.g., a seed laser 400) sends relatively low-power optical pulses to one or more optical amplifiers 470 for amplification. As an example, an amplifier 470 may receive pulses with an input pulse energy ($E_{in}$) of approximately 10 pJ and produce amplified pulses with an output pulse energy ($E_{out}$) of approximately 10 nJ. The optical gain (G) of the amplifier 470 in decibels, which may be determined from the expression G=10 log($E_{out}/E_{in}$), is approximately 30 dB. As another example, an amplifier 470 may receive input pulses with a peak power ($P_{in}$) of approximately 10 W and produce amplified output pulses with a peak power ($P_{out}$) of approximately 1 kW. The optical gain (G) of the amplifier 470, which may be determined from the expression G=10 log($P_{out}/P_{in}$) is approximately 20 dB.

In particular embodiments, an optical amplifier 470 may include one or more circulators 510, one or more couplers (600A, 600B), one or more photodiodes (PD 610A, PD 610B), one or more isolators (620A, 620B), one or more filters 630, one or more pump lasers 640, one or more pump WDMs 650, one or more gain fibers 660, or one or more reflectors 670. The double-pass amplifier 470 illustrated in FIG. 11 includes an input coupler 600A and photodiode (PD) 610A, an input isolator 620A, a circulator 510, a pump laser 640 and pump WDM 650, a gain fiber 660, a reflector 670, an output isolator 620B, an output coupler 600B and PD 610B, and an output filter 630. In particular embodiments, circulator 510 may be a three-port fiber-optic component that directs light that enters at one port out to another port. In FIG. 11, light entering at port 1 of the circulator 510 is directed to port 2, and light entering at port 2 is directed to port 3. In the example of FIG. 11, after passing through the coupler 600A and isolator 620A, the input light is directed from port 1 to port 2 of circulator 510 and then travels through pump WDM 650 and gain fiber 660. The light is reflected by reflector 670 and travels back through gain fiber 660 and pump WDM 650. During the two passes through the gain fiber 660, the input light undergoes amplification through a process of stimulated emission. The amplified light is directed from port 2 to port 3 of the circulator where it then travels through isolator 620B, coupler 600B, and filter 630. The amplified light is directed to the output of amplifier 470, at which point the amplified output light may be sent to another amplifier 470, a demultiplexer, an optical link, a sensor head, or a scanner 120.

In particular embodiments, a fiber-optic amplifier 470 may include a gain fiber 660 that is optically pumped (e.g., provided with energy) by a pump laser 640. The optically pumped gain fiber 660 provides optical gain to particular wavelengths of light traveling through the gain fiber 660. The pump light and the light to be amplified may both propagate substantially through the core of the gain fiber 660. The gain fiber 660 (which may be referred to as optical gain fiber) may be an optical fiber doped with rare-earth ions, such as for example erbium ($Er^{3+}$), neodymium ($Nd^{3+}$), ytterbium ($Yb^{3+}$), praseodymium ($Pr^{3+}$), holmium ($Ho^{3+}$), thulium ($Tm^{3+}$), or any other suitable rare-earth element, or any suitable combination thereof. The rare-earth dopants (which may be referred to as gain material) absorb light from the pump laser 640 and are "pumped" or promoted into excited states that provide amplification to particular wavelengths of light through stimulated emission. The rare-earth ions in excited states may also emit photons through spontaneous emission, resulting in the production of amplified spontaneous emission (ASE) light by amplifier 470. In particular embodiments, an amplifier 470 with erbium-doped gain fiber 660 may be referred to as an erbium-doped fiber amplifier (EDFA) and may be used to amplify light having wavelengths between approximately 1520 nm and approximately 1600 nm. In particular embodiments, a gain fiber 660 may be doped with a combination of erbium and ytterbium dopants and may be referred to as a Er:Yb co-doped fiber, Er:Yb:glass fiber, Er:Yb fiber, Er:Yb-doped fiber, erbium/ytterbium-doped fiber, or Er/Yb gain fiber. An amplifier 470 with Er:Yb co-doped gain fiber may be referred to as an erbium/ytterbium-doped fiber amplifier (EYDFA). An EYDFA may be used to amplify light having wavelengths between approximately 1520 nm and approximately 1620 nm. In particular embodiments, a gain fiber 660 doped with ytterbium may be part of a ytterbium-doped fiber amplifier (YDFA). A YDFA may be used to amplify light having wavelengths between approximately 1000 nm and approximately 1130 nm. In particular embodiments, a gain fiber 660 doped with thulium may be part of a thulium-doped fiber amplifier (TDFA). A TDFA may be used to amplify light having wavelengths between approximately 1900 nm and approximately 2100 nm.

In particular embodiments, a fiber-optic amplifier 470 may refer to an amplifier where light is amplified while propagating through a gain fiber 660 (e.g., the light is not amplified while propagating as a free-space beam). In particular embodiments, an amplifier 470 where the light being amplified makes one pass through a gain fiber 660 may be referred to as a single-pass amplifier 470 (as described below), and an amplifier 470 where the light being amplified makes two passes through a gain fiber 660 (as illustrated in FIG. 11) may be referred to as a double-pass amplifier 470. In particular embodiments, the length of gain fiber 660 in an amplifier 470 may be 0.5 m, 1 m, 2 m, 4 m, 6 m, 10 m, 20 m, or any other suitable gain-fiber length. In particular embodiments, gain fiber 660 may be a single-mode, large-mode-area, or multi-clad optical fiber with a core diameter of approximately 7 μm, 8 μm, 9 μm, 10 μm, 12 μm, 20 μm, 25 μm, or any other suitable core diameter. The numerical aperture (NA), composition, or refractive indices of the components of an optical fiber may be configured so that the optical fiber remains in single-mode operation for at least some of the wavelengths of light propagating through the fiber. In the example of FIG. 11 (as well as some of the other figures described herein), a line or an arrow between two optical components may represent a fiber-optic cable. As an example, coupler 600A and isolator 620A may be coupled together by a fiber-optic cable represented by the arrow that connects the two components. As another example, the input and output ports illustrated in FIG. 11 may each represent a fiber-optic cable.

In particular embodiments, pump laser 640 may produce light at any wavelength suitable to provide optical excitation to the dopants of gain fiber 660. As an example, pump laser 640 may be a fiber-coupled or free-space laser diode with an operating wavelength of approximately 910 nm, 915 nm, 940 nm, 960 nm, 976 nm, 980 nm, 1050 nm, 1064 nm, 1450 nm, or 1480 nm. As another example, an erbium-doped gain fiber 660 may be pumped with a 976-nm laser diode. As another example, an erbium/ytterbium-doped gain fiber 660 may be pumped with a laser diode having an operating wavelength between approximately 915 nm and approximately 970 nm. In particular embodiments, pump laser 640 may be operated as a CW light source and may produce any suitable amount of average optical pump power, such as for example, approximately 100 mW, 500 mW, 1 W, 2 W, 5 W, 10 W, 15 W, or 20 W of pump power. In particular embodiments, a pump laser diode may be referred to as a pump diode laser, a pump laser, a pump diode, or a pump.

In particular embodiments, light from pump laser 640 may be coupled into gain fiber 660 via a pump wavelength-division multiplexer (WDM) 650. A pump WDM 650, which may be referred to as a pump-signal combiner, a pump combiner, a wavelength combiner, or a WDM may be used to combine pump light with input light that is to be amplified. In particular embodiments, a pump WDM 650 may be a three-port or a four-port device. For example, a pump WDM 650 may be a four-port device that combines input light received at a first port with light from two pump lasers 640 (received at second and third ports, respectively), and sends the combined light out a fourth port (which may be coupled to gain fiber 660). In FIG. 11, the pump WDM 650 is a three-port device that combines input light at port 1 having a particular wavelength with pump light at port 2 having a different wavelength and sends the combined light out port 3. As an example, the input light may have a wavelength of approximately 1530-1565 nm and may be combined by pump WDM 650 with pump-laser light having a wavelength of approximately 915-970 nm. The combined light is then coupled to gain fiber 660, where the pump-laser light pumps the gain fiber 660, and the input light is amplified. The input light makes a first pass through the gain fiber, is reflected by reflector 670, and then makes a second pass through the gain fiber 660. The amplified light then passes through pump WDM 650 and back to port 2 of the circulator 510 where it is sent to port 3.

In particular embodiments, a fiber Bragg grating (FBG) may refer to a fiber-optic component that includes a periodic variation in the refractive index of the fiber core or cladding. The periodic refractive-index variation may act as a wavelength-dependent reflector or filter and may include a distributed Bragg reflector, an apodized grating, or a chirped fiber Bragg grating. A FBG may be configured to reflect an operating wavelength (e.g., 1550 nm) of the lidar system 100 and transmit other wavelengths, or a FBG may be configured to transmit the lidar-system operating wavelength and reflect other wavelengths. For example, filter 630 may include a FBG that transmits light (e.g., amplified optical pulses from amplifier 470) over a 1548-1552 nm wavelength range and reflects light (e.g., ASE produced by gain fiber 660) outside this wavelength range.

In particular embodiments, reflector 670 may include a mirror or a FBG. As an example, reflector 670 may include a metallic or dielectric mirror configured to receive light from gain fiber 660 and reflect the received light back into the gain fiber 660. As another example, reflector 670 may include one or more FBGs configured to reflect light corresponding to one or more operating wavelengths of lidar system 100 and transmit or attenuate light that is away from the reflected wavelengths. For example, reflector 670 may include a FBG that reflects light from approximately 1540 nm to approximately 1560 nm and transmits light over the wavelength ranges of approximately 1400-1540 nm and approximately 1560-1650 nm. In particular embodiments, a double-pass amplifier 470 may include a circulator 510, a gain fiber 660 having a first end and a second end, and a FBG, where the first end of the gain fiber 660 is coupled to the circulator 510 and the second end is coupled to the FBG. In FIG. 11, the upper end of gain fiber 660 is coupled to port 2 of circulator 510 via pump WDM 650, and the lower end of gain fiber 660 is coupled to reflector 670, which may include one or more FBGs.

In particular embodiments, reflector 670 may include a FBG that reflects light at a wavelength of the input light that is received and amplified by amplifier 470. As an example, amplifier 470 may receive and amplify pulses of light having a wavelength of approximately 1552 nm, and reflector 670 may include a FBG configured to reflect light at 1552 nm. In particular embodiments, a FBG may have any suitable reflectively (e.g., reflectivity greater than or equal to 50%, 75%, 90%, 95%, 99%, or 99.9%) over any suitable bandwidth $\Delta\lambda$, (e.g., $\Delta\lambda$, may be approximately 0.1 nm, 0.2 nm, 0.5 nm, 1 nm, 5 nm, 10 nm, 20 nm, or 50 nm). As an example, reflector 670 may include a FBG with a reflectivity of greater than or equal to 99% over a 2-nm bandwidth centered at 1552 nm. As another example, reflector 670 may include a FBG with a reflectivity of greater than or equal to 90% over a 10-nm bandwidth centered at 1550 nm. In particular embodiments, a reflector 670 may include a FBG with a relatively narrow reflectivity range (e.g., the bandwidth $\Delta\lambda$, may be less than or equal to 0.1 nm, 0.2 nm, 0.5 nm, 1 nm, or 2 nm), and lidar system 100 may include a laser diode 440 that is temperature stabilized so that its operating wavelength is maintained within the reflectivity range of the FBG.

In particular embodiments, reflector 670 may include a FBG that reflects light at one or more operating wavelengths and transmits or attenuates light that is away from the one or more operating wavelengths. As an example, the FBG may reflect light from approximately 1555 nm to approximately 1560 nm, and the FBG may transmit light at wavelengths outside that range. In particular embodiments, outside of its range of reflectivity, a FBG may have a reflectivity of less than or equal to 50%, 20%, 10%, 5%, 2%, 1%, 0.5%, or less than any other suitable reflectivity value. As an example, a FBG with a reflectivity range of 1555-1560 nm may have a reflectivity of less than or equal to 50% (or, a transmission of greater than or equal to 50%) over the ranges of approximately 1455-1555 nm and approximately 1560-1660 nm. In particular embodiments, out-of-band light (e.g., light that is outside the reflectivity range of a FBG) may be substantially transmitted through the FBG. In FIG. 11, a reflector 670 that includes a FBG may transmit out-of-band light (e.g., optical noise, such as for example, ASE produced in gain fiber 660) so that the light is dumped out of the reflector 670 and is not reflected back into the gain fiber 660. In particular embodiments, a reflector 670 that includes a FBG may act as a spectral filter by removing greater than or equal to 50%, 60%, 80%, 90%, 95%, or 99% of the out-of-band light received by the reflector 670. As an example, greater than or equal to 90% of ASE light that is produced in the gain fiber 660 and that propagates to reflector 670 may be transmitted through the reflector 670 and effectively removed from the amplifier 470. In particular embodiments, reflector 670 may include a FBG that reflects light at a pump-laser wavelength (e.g., 976 nm). Light from pump laser 640 that is not absorbed in the gain fiber 660 may be reflected by reflector 670 to make a second pass through the gain fiber 660. This may result in an improvement in pumping efficiency since a greater fraction of pump-laser light may be absorbed by configuring the pump light to make two passes through the gain fiber 660.

In particular embodiments, coupler 600A may be a fiber-optic splitter or tap coupler that splits off a portion of input light and sends it to PD 610A. The remaining light that is not split-off propagates on to isolator 620A. Similarly, coupler 600B may be a tap coupler that splits off a portion of output light and sends it to PD 610B with the remaining light proceeding to filter 630. The tap coupler 600A or 600B may couple approximately 0.5%, 1%, 2%, 3%, 5%, 10%, or any other suitable percentage of light to PD 610A or PD 610B, respectively. As an example, input coupler 600A may split off approximately 10% of the input light and direct it to PD 610A and send the remaining approximately 90% of input light on to the isolator 620A. As another example, output coupler 600B may split off approximately 1% of the amplified light and direct it to PD 610B and send the remaining approximately 99% of the amplified light on to the filter 630. In particular embodiments, an amplifier 470 may include an input coupler 600A or an output coupler 600B.

In particular embodiments, PD 610A or 610B may be a silicon, germanium, or InGaAs PN or PIN photodiode. In particular embodiments, coupler 600A and PD 610A may be used to monitor the input light coming into the amplifier 470, and coupler 600B and PD 610B may be used to monitor the light after amplification. As an example, PD 610A may receive the split-off input light from coupler 600A, and PD 610A may generate an electrical signal based on the received light. Similarly, PD 610B may receive the split-off output light from coupler 600B, and PD 610B may generate an electrical signal based on the output light. The electrical signal from PD 610A or PD 610B may be sent to a processor or controller 150 for monitoring the status of the input or output light, respectively. If a voltage or current of the electrical signal from PD 610A drops below a particular predetermined threshold level, then a processor or controller 150 may determine that there is insufficient light coming into the amplifier 470. The amplifier 470 may be shut down or disabled (e.g., the pump laser 640 may be turned off or the amount of light it produces may be reduced) to avoid possible damage to the amplifier 470. If a voltage or current of the electrical signal from PD 610B drops below a particular predetermined threshold level, then a processor or controller 150 may determine that there is a problem with amplifier 470 (e.g., there may be a broken optical fiber, pump laser 640 may be failing, or one of the other components in amplifier 470 may be failing). In particular embodiments, signals from PD 610A or PD 610B may be used to adjust or monitor the gain or output power of amplifier 470. As an example, a ratio of signals from PDs 610A and 610B may be used to determine the gain of amplifier 470, and the amplifier gain may be adjusted by changing the pump-laser current (which changes the amount of pump power provided by pump laser 640). As another example, a signal from PD 610B may be used to determine the output power of amplifier 470, and the amplifier output power may be adjusted by changing the current supplied to pump laser 640.

In particular embodiments, amplifier 470 may include an input optical isolator 620A or an output optical isolator 620B. An optical isolator 620 may include a Faraday rotator, and the operation of an optical isolator may be based on the Faraday effect where the polarization of light traveling through the isolator is rotated in the same direction regardless of the direction of travel of the light. In particular embodiments, an optical isolator 620 may be a free-space optical component or a fiber-coupled component configured to reduce or attenuate backward-propagating light. Backward-propagating light may originate from ASE light from a gain fiber 660 or from optical reflections at one or more optical interfaces of the components in amplifier 470, and the backward-propagating light may destabilize or cause damage to a seed laser 400, laser diode 440 or amplifier 470. Isolators 620A and 620B in FIG. 11 are configured to allow light to pass in the direction of the arrow drawn in the isolator and block light propagating in the reverse direction. In FIG. 11, a laser diode 440 may provide the input light to amplifier 470, and isolator 620A may significantly reduce the amount of backward-propagating light that travels back to the laser diode 440. The output of amplifier 470 in FIG. 11 may be coupled to a second amplifier, and isolator 620B may reduce the amount of light from the second amplifier that propagates back into the amplifier 470.

In FIG. 11, input isolator 620A may allow light to propagate from coupler 600A to port 1 of circulator 510, but any light propagating in the reverse direction may be attenuated. As an example, back-reflected light propagating from port 1 of circulator 510 to isolator 620A may be attenuated by greater than or equal to 5 dB, 10 dB, 20 dB, 30 dB, 40 dB, 50 dB, or any other suitable attenuation value. As another example, if isolator 620A attenuates back-reflected light by greater than or equal to 30 dB, then less than or equal to 0.1% of light propagating from port 1 of circulator 510 may be transmitted through the isolator 620A and to coupler 600A. In particular embodiments, circulator 510 may perform an optical isolation function. As an example, isolator 620A or 620B may not be included in amplifier 470, and circulator 510 may include one or more optical elements that act as an input or output optical isolator.

In particular embodiments, an amplifier 470 may include an optical filter 630 located at the amplifier input, an optical filter 630 located at the amplifier output, or optical filters 630 located at both the input and output of amplifier 470. An input optical filter 630 may reduce the amount of optical noise (e.g., ASE from a previous amplifier stage) at the input to an amplifier 470. An output optical filter 630 may reduce the amount of optical noise accompanying the amplified optical pulses that propagate out of amplifier 470. In the example of FIG. 11, amplifier 470 includes an optical filter 630 located at the output of amplifier 470. The output optical filter 630 in FIG. 11 may be configured to remove greater than or equal to 80% of the optical noise (e.g., ASE produced by the gain fiber 660) from the output of amplifier 470.

Figure 12:
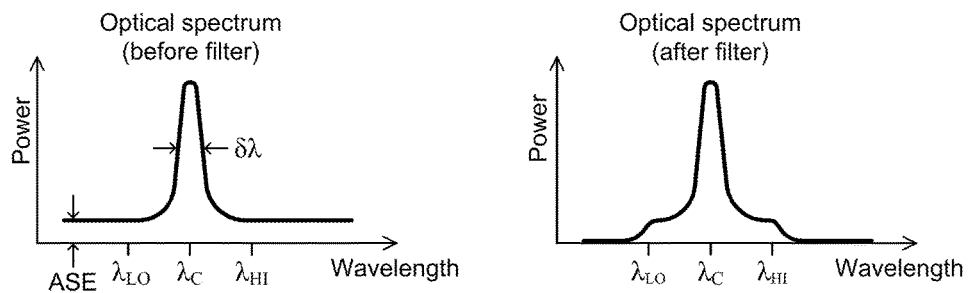
FIG. 12 illustrates an example spectrum of an optical signal before and after passing through a filter.

FIG. 12 illustrates an example spectrum of an optical signal before and after passing through a filter 630. In particular embodiments, a filter 630 (which may be referred to as an optical filter, a spectral filter, or an ASE filter) may include an absorptive filter, dichroic filter, long-pass filter, short-pass filter, bandpass filter, or FBG. In particular embodiments, a filter 630 may be substantially transmissive to light over a particular range of wavelengths (e.g., a pass-band) and may substantially block (e.g., through absorption or reflection) the transmission of light outside of the pass-band range. As an example, a filter 630 may include a dichroic filter (which may be referred to as a reflective, thin-film, or interference filter) which includes a substantially transparent optical substrate (e.g., glass or fused silica) with a series of thin-film optical coatings configured to transmit light over a particular wavelength range and reflect other wavelengths of light. As another example, a filter 630 may include a FBG configured to transmit light over a particular pass-band and substantially block light outside of the pass-band. In the example of FIG. 12, the filter is a bandpass filter with a center wavelength of $\lambda_C$ and a pass-band from $\lambda_{LO}$ to $\lambda_{HI}$, which corresponds to a filter bandwidth of $\Delta\lambda = \lambda_{HI} - \lambda_{LO}$.

In particular embodiments, a filter 630 may have an optical transmission (within a pass-band) of greater than or equal to 50%, 70%, 80%, 90%, 95%, 99%, or any other suitable transmission value. Additionally, a filter 630 may have an optical transmission of less than or equal to 50%, 20%, 10%, 1%, 0.5%, 0.1%, or any other suitable transmission value for wavelengths outside the pass-band. The optical transmission outside the pass-band may also be expressed in terms of decibels (dB) of attenuation. For example, the filter attenuation for wavelengths outside the pass-band may be greater than or equal to 3 dB, 10 dB, 15 dB, 20 dB, 30 dB, or any other suitable attenuation value. An attenuation value of 20 dB corresponds to blocking approximately 99% of the incident light power and transmission of approximately 1% of incident light. In particular embodiments, a filter 630 may transmit light at one or more operating wavelengths of a lidar system 100 and block or attenuate light away from the transmitted wavelengths by greater than or equal to 3 dB, 10 dB, 15 dB, 20 dB, 30 dB, or any other suitable attenuation value. The light that is away from the transmitted wavelengths may refer to light with a wavelength outside of a pass-band of the filter 630. As an example, a filter 630 may transmit greater than or equal to 90% of incident light within a filter pass-band and may block or attenuate light outside of the pass-band by 20 dB. As another example, a filter 630 may have a filter attenuation of greater than or equal to 20 dB for wavelengths between approximately $[\lambda_{LO} - 100$ nm$]$ and $\lambda_{LO}$ and wavelengths between approximately $\lambda_{HI}$ and $[\lambda_{HI} + 100$ nm$]$.

In particular embodiments, a filter 630 may have any suitable filter bandwidth Δλ, such as for example, a filter bandwidth of 0.1 nm, 0.2 nm, 0.5 nm, 1 nm, 2 nm, 5 nm, or 10 nm. As an example, a filter 630 may have a pass-band with a 1-nm bandwidth that is centered about center wavelength 1554.9 nm. In particular embodiments, a filter 630 may have a relatively narrow pass-band (e.g., a filter bandwidth Δλ, of less than or equal to 0.05 nm, 0.1 nm, 0.2 nm, 0.5 nm, or 1 nm), and a laser diode 440 of the lidar system 100 may be temperature stabilized so that the laser-diode operating wavelength is matched to the filter pass-band. In particular embodiments, a filter 630 may have a relatively broad pass-band (e.g., a filter bandwidth Δλ, of greater than or equal to 1 nm, 2 nm, 5 nm, 10 nm, 20 nm, or 50 nm), and a laser diode 440 may not require temperature stabilization to maintain its operating wavelength within the filter pass-band.

In particular embodiments, an optical spectrum before passing through a filter 630 may include a signal spectrum along with background optical noise, which may include amplified spontaneous emission (ASE) originating from an amplifier 470. In FIG. 12, the signal spectrum, which may represent the spectrum for a series of optical pulses, is centered at wavelength $\lambda_C$ and has a bandwidth of $\delta\lambda$. The signal spectrum is contained within the pass-band of the filter and passes through the filter with little or no attenuation (e.g., ≤10% attenuation). Similarly, the optical pulses associated with the signal spectrum may pass through the filter with little or no attenuation or distortion to their shape. In FIG. 12, the optical spectrum before passing through the filter includes a broadband offset associated with ASE. In particular embodiments, an ASE spectrum may extend over a wavelength range of approximately 20 nm, 40 nm, 60 nm, or 80 nm (e.g., from approximately 1510 nm to approximately 1590 nm). The portion of the ASE that falls outside the filter pass-band may be substantially attenuated, as indicated by the after-filter spectrum illustrated in FIG. 12 where wavelengths less than $\lambda_{LO}$ and greater than $\lambda_{HI}$ are attenuated after passing through the filter. In particular embodiments, a filter 630 may be used to reduce or substantially remove unwanted optical signals or noise (e.g., ASE) from a light source 110, seed laser 400, or amplifier 470 of a lidar system 100. As an example, a filter 630 may be located at or near an output of an optical amplifier 470, and the filter may be configured to remove any suitable amount of the ASE from the amplifier output 470, such as for example, 50%, 60%, 80%, 90%, 95%, or 99% of the ASE. As another example, a filter with a 1-nm bandwidth that receives a signal with background optical noise that extends over approximately 50 nm may remove approximately 94% to 98% of the background noise from the signal.

In particular embodiments, a filter 630 may have a single pass-band (e.g., 1550-1552 nm) or two or more distinct pass-bands (e.g., 1550-1552 nm and 1555-1557 nm). As an example, for a lidar system 100 with N operating wavelengths, a filter may have N pass-bands corresponding to each of the N operating wavelengths. In particular embodiments, the center wavelength $\lambda_C$ or the bandwidth $\delta\lambda$ of a filter may be substantially fixed. In particular embodiments, a filter 630 may have an adjustable center wavelength $\lambda_C$ or an adjustable bandwidth $\delta\lambda$. As an example, the center wavelength of a filter may be dynamically changed to match the changing wavelength of a wavelength-tunable seed laser 400 or laser diode 440.

Figure 13:
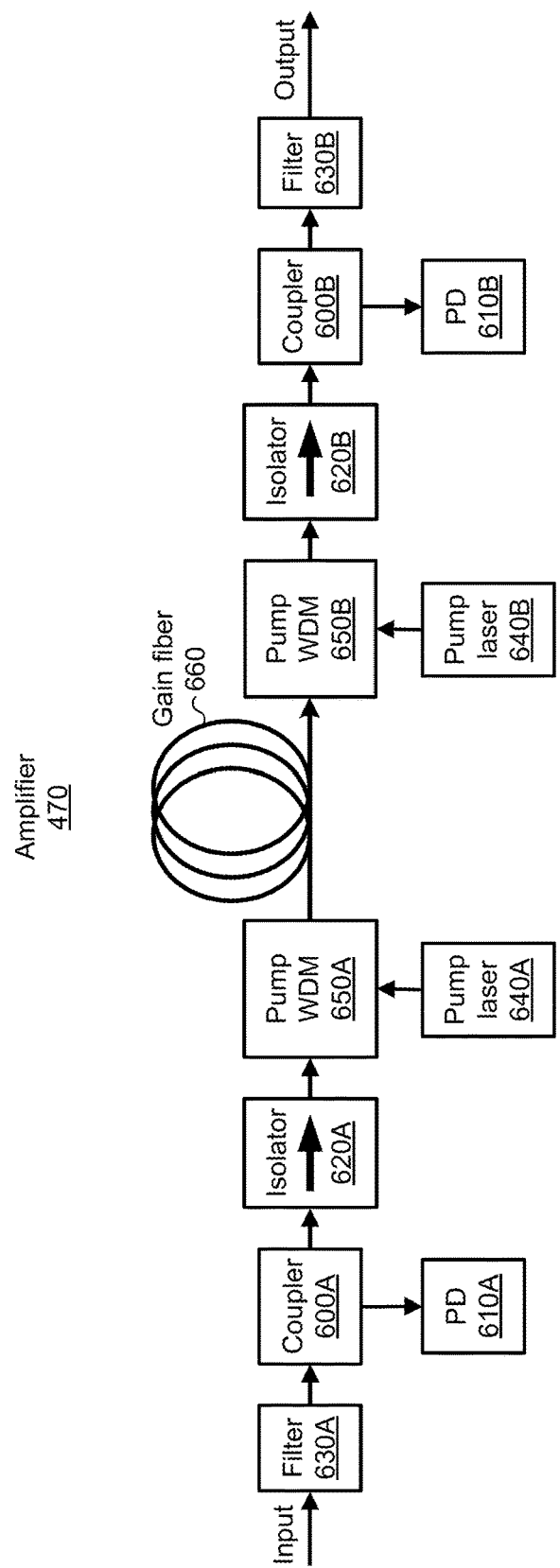
FIG. 13 illustrates an example single-pass fiber-optic amplifier.

FIG. 13 illustrates an example single-pass fiber-optic amplifier 470. In FIG. 13, input light makes a single pass through the gain fiber 660, and after passing through the output of amplifier 470, the amplified output light may be sent to another amplifier 470, a demultiplexer, an optical link, a sensor head, or a scanner 120. In particular embodiments, a single-pass amplifier 470 may include one or more optical filters (e.g., 630A or 630B), couplers (e.g., 600A or 600B), photodiodes (e.g., 610A or 610B), isolators (e.g., 620A or 620B), gain fibers 660, pump lasers (e.g., 640A or 640B), or pump WDMs (e.g., 650A or 650B). The single-pass amplifier 470 illustrated in FIG. 13 has an input that includes an input filter 630A, an input coupler 600A and PD 610A, and an input isolator 620A. The optical gain for the amplifier 470 is provided by pump lasers 640A and 640B which are coupled to gain fiber 660 through pump WDMs 650A and 650B, respectively. The gain fiber 660 in FIG. 13 may be an erbium-doped or erbium/ytterbium-doped gain fiber 660. The single-pass amplifier 470 illustrated in FIG. 13 has an output that includes an output isolator 620B, an output coupler 600B and PD 610B, and an output filter 630B.

In particular embodiments, an amplifier 470 may include 1, 2, 3, or any other suitable number of pump lasers 640. The double-pass amplifier 470 in FIG. 11 includes one pump laser 640, and the single-pass amplifier 470 in FIG. 13 includes two pump lasers (640A, 640B). In particular embodiments, a double-pass amplifier 470 may include one pump laser 640 (as illustrated in FIG. 11), or a double-pass amplifier 470 may include two pump lasers 640 (e.g., one pump laser coupled to each end of the gain fiber 660). In particular embodiments, a single-pass amplifier 470 may have one pump laser (e.g., pump laser 640A or 640B), or a single-pass amplifier 470 may have two pump lasers (e.g., pump lasers 640A and 640B). In particular embodiments, a pump laser may be co-propagating or counter-propagating with respect to the light that is amplified by an amplifier 470. In FIG. 13, pump laser 640A is a co-propagating pump laser (e.g., the pump-laser light propagates in the same direction as the light that is amplified by the amplifier 470), and pump laser 640B is a counter-propagating pump laser (e.g., the pump-laser light propagates in the opposite direction to the light that is amplified). In particular embodiments, one pump laser may be used to provide pump light to both ends of a gain fiber 660. As an example, pump laser 640A in FIG. 13 may be split (e.g., with a 3-dB fiber-optic power splitter) into two fibers, where one fiber is coupled to pump WDM 650A and the other fiber is coupled to pump WDM 650B.

Figure 14:
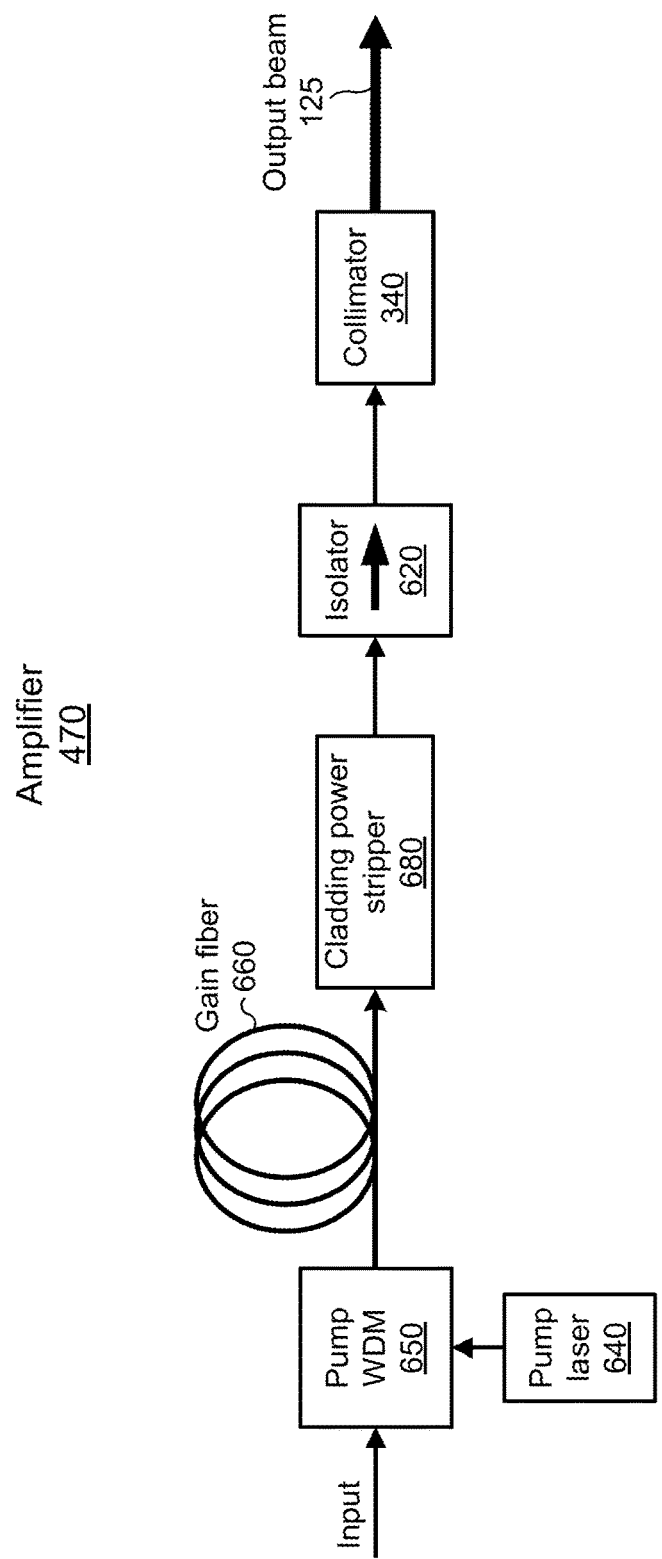
FIG. 14 illustrates an example booster amplifier that produces a free-space output beam.

FIG. 14 illustrates an example booster amplifier 470 that produces a free-space output beam 125. In particular embodiments, a booster amplifier 470 may refer to an amplifier that sends an output beam 125 to a scanner 120 or a sensor head, or a booster amplifier 470 may refer to an amplifier that provides an intermediate or final amplification stage in a series of two or more amplifiers. As an example, booster amplifier 470 in FIG. 14 may receive optical pulses that have been amplified by one or more previous amplifiers (e.g., a single-stage amplifier 470 or a double-stage amplifier 470). A booster amplifier 470 may send amplified light to another booster amplifier 470 for further amplification, or a booster amplifier 470 may produce a free-space output beam 125 that is directed to a scanner 120 or a sensor head. As another example, booster amplifier 470 may receive unamplified optical pulses (e.g., from a pulsed laser diode), and booster amplifier 470 may provide a single stage of optical amplification prior to sending a free-space output beam 125 to a scanner 120. As another example, two booster amplifiers 470 may be coupled in series where the first amplifier amplifies input light (e.g., from a pulsed laser diode or from a previous amplifier stage) and sends it to the second amplifier, and the second amplifier further amplifies the light and produces a free-space output beam 125. In particular embodiments, a booster amplifier 470 may include an output collimator 340 configured to receive amplified optical pulses produced in gain fiber 660 and produce a free-space optical beam 125 that includes the amplified optical pulses. As an example, the booster amplifier 470 in FIG. 14 may be a fiber-optic amplifier that is terminated at output collimator 340, and output collimator 340 may produce a free-space output beam 125.

In particular embodiments, a booster amplifier 470 may provide any suitable amount of optical power gain, such as for example, a gain of approximately 3 dB, 5 dB, 7 dB, 10 dB, 15 dB, 20 dB, or 30 dB. As an example, a booster amplifier 470 may receive pulses with a 100-mW average power and produce amplified pulses with a 1-W average power, corresponding to an optical gain of approximately 10 dB. In particular embodiments, a booster amplifier 470 may include a single pump laser 640 (e.g., a co-propagating or counter-propagating pump laser) or two or more pump lasers 640 (e.g., two co-propagating pump lasers, or a co-propagating pump and a counter-propagating pump). As an example, a booster amplifier 470 may include a counter-propagating pump laser 640 located on the output side of the amplifier 470. In FIG. 14, the booster amplifier 470 includes a co-propagating pump laser 640 (along with a pump WDM 650) located on the input side of the amplifier 470.

In particular embodiments, a booster amplifier 470 may include a multi-clad gain fiber 660 that includes two or more cladding layers (e.g., a double-clad gain fiber 660 or a triple-clad gain fiber 660). In particular embodiments, a double-clad gain fiber 660 may include a core, inner cladding, and outer cladding, where the core is doped with a rare-earth material. As an example, the core may be doped with erbium, or the double-clad gain fiber 660 may be a Er:Yb co-doped fiber where the core is doped with a combination of erbium and ytterbium. The refractive indices of the core, inner cladding, and outer cladding may be configured so that the pump-laser light is confined to propagate primarily in the inner cladding, and the amplified light is confined to propagate primarily in the core. In particular embodiments, a double-clad gain fiber 660 may have a core with any suitable diameter, such as for example, a diameter of approximately 7 µm, 8 µm, 9 µm, 10 µm, 12 µm, 20 µm, or 25 µm. In particular embodiments, gain fiber 660 may be a double-clad photonic-crystal fiber that includes a core doped with rare-earth material where the core is surrounded by an arrangement of holes that extend along the length of the gain fiber 660.

In particular embodiments, amplifier 470 may include a cladding power stripper 680, which may also be referred to as a cladding mode stripper. A cladding power stripper 680 may be used to absorb or remove light from the inner cladding or outer cladding in a double-clad gain fiber 660. As an example, cladding power stripper 680 may be located on the opposite side of the gain fiber 660 from the pump laser 640, and the cladding power stripper 680 may remove residual, unabsorbed pump-laser light that propagates through the gain fiber 660 without being absorbed in the gain fiber 660. As an example, the residual pump-laser light may be removed from the inner cladding of the gain fiber 660 to prevent the residual pump light from accompanying the amplified pulses as they exit the amplifier 470. Additionally, the cladding power stripper 680 may remove ASE produced by the gain fiber 660 that propagates in the inner or outer cladding.

Figure 15:
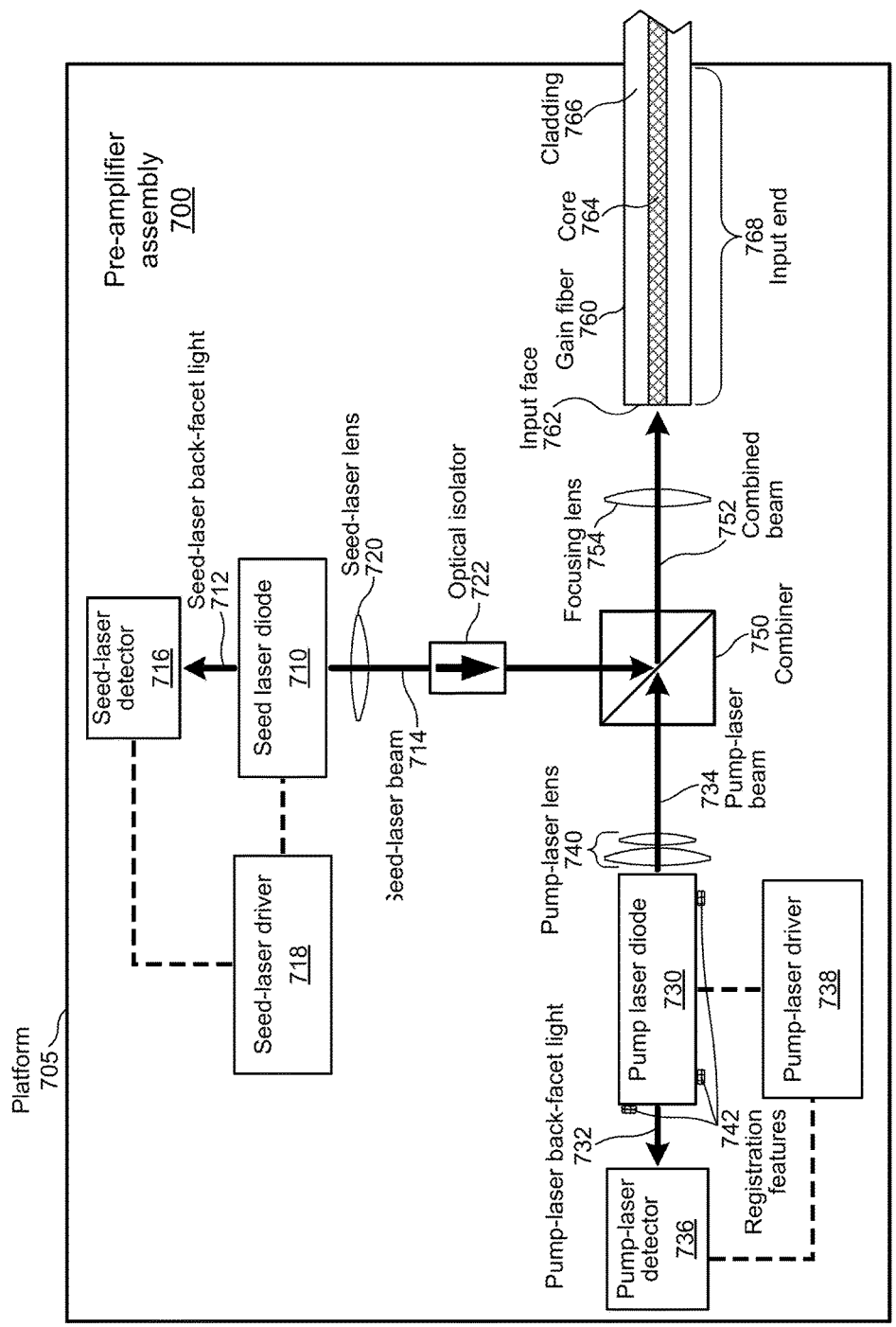
FIG. 15 illustrates a top view of an example free-space pre-amplifier assembly.

FIG. 15 illustrates a top view of an example free-space pre-amplifier assembly 700. The pre-amplifier assembly 700 illustrated in FIG. 15 may be referred to as a fiber laser, fiber laser with free-space components, free-space amplifier, pre-amplifier, laser system, laser, or light source and may be part of a light source 110 of a lidar system 100. In the example of FIG. 15 (as well as some of the other figures described herein), a line or an arrow between two optical components may represent a free-space optical beam. As an example, the arrow that extends from seed laser diode 710 to combiner 750 (and through seed-laser lens 720 and optical isolator 722) represents a free-space optical beam emitted by the seed laser diode 710. Similarly, the arrow that extends from pump laser diode 730 to combiner 750 (and through pump-laser lens 740) represents a free-space optical beam emitted by the pump laser diode 730.

As used herein, a free-space optical beam may refer to an optical beam that propagates in a non-confined or unguided manner. For example, a free-space optical beam (which may be referred to as a beam or a free-space beam) may propagate through air (or some other gas or a vacuum), and a free-space beam may not be confined to propagate in a waveguide or an optical fiber. A free-space component may refer to an optical component (e.g., lens, isolator, filter, detector, or diode laser) configured to receive or transmit a free-space beam. A free-space component, which may be referred to as a free-space optical component, a bulk component, a bulk optic, or a bulk optical component, may not include a fiber-optic cable. In FIG. 15, seed-laser beam 714, pump-laser beam 734, and combined beam 752 may each be a free-space optical beam. Additionally, seed-laser lens 720, optical isolator 722, pump-laser lens 740, combiner 750, and focusing lens 754 may each be a free-space optical component.

In particular embodiments, a pre-amplifier assembly 700 may include a seed laser diode 710 configured to produce a free-space seed-laser beam 714. The seed laser diode 710 in FIG. 15 may be any suitable type of laser diode, such as for example a Fabry-Perot laser diode, a quantum well laser, a DBR laser, a DFB laser, a VCSEL, or a wavelength-tunable laser diode. The seed laser diode 710 may be configured to produce light at any suitable wavelength, such as for example, at one or more wavelengths between approximately 1400 nm and approximately 1600 nm. As an example, the seed laser diode 710 may have an operating wavelength of approximately 1550 nm. The seed laser diode 710 in FIG. 15 may be similar to laser diode 440 in FIG. 8. Rather than being packaged in a fiber-pigtailed assembly where the seed-laser beam is coupled into an optical fiber, the seed laser diode 710 in FIG. 15 may include a laser-diode chip that directly emits a free-space optical beam (e.g., seed-laser beam 714). As an example, the seed laser diode 710 may be mounted to a chip carrier, and the seed-laser beam 714 may be directly emitted from a front facet of the seed laser diode 710.

In particular embodiments, a pre-amplifier assembly 700 may include a pump laser diode 730 configured to produce a free-space pump-laser beam 734. The pump laser diode 730 in FIG. 15 may be any suitable type of laser diode configured to produce light at a wavelength between approximately 900 nm and approximately 1000 nm or between approximately 1470 nm and approximately 1490 nm. For example, the pump laser diode 730 may be configured to provide optical excitation to the dopants of gain fiber 760 and may have an operating wavelength of approximately 910 nm, 915 nm, 940 nm, 960 nm, 976 nm, 980 nm, or 1480 nm. The pump laser diode 730 may be operated as a CW light source and may produce any suitable amount of average optical pump power, such as for example, approximately 100 mW, 500 mW, 1 W, 2 W, 5 W, 10 W, 15 W, or 20 W of pump power. The pump laser diode 730 in FIG. 15 may be similar to pump laser 640, 640A, or 640B described herein. Rather than being packaged in a fiber-pigtailed package where the pump-laser beam is coupled into an optical fiber, the pump laser diode 730 in FIG. 15 may include a laser-diode chip that directly emits a free-space optical beam (e.g., pump-laser beam 734) from a front facet of the pump laser diode 730. The seed laser diode 710 and the pump laser diode 730 may each be referred to as a free-space laser diode or a direct-emitter laser diode.

In particular embodiments, a pre-amplifier assembly 700 may include a seed-laser lens 720 configured to collect, collimate, or focus a free-space seed-laser beam 714 emitted by seed laser diode 710. As an example, the seed laser 710 may emit light that diverges into an elliptical cone shape, and the seed-laser lens 720 may collect the light emitted by the seed laser 710 and produce a collimated optical beam. In particular embodiments, a pre-amplifier assembly 700 may include a pump-laser lens 740 configured to collect, collimate, or focus a free-space pump-laser beam 734 emitted by pump laser diode 730. In particular embodiments, seed-laser lens 720 and pump-laser lens 740 may each include any suitable type of lens, such as for example, a spherical lens (e.g., a lens having one or more concave, convex, or planar surfaces), a cylindrical lens, an aspheric lens, a gradient-index (GRIN) lens (which may be referred to as a graded-index lens), or any suitable combination thereof. As an example, the seed-laser lens 720 may include a spherical lens or an aspheric lens configured to produce a collimated seed-laser beam 714 having a substantially circular or elliptical shape. The seed-laser lens 720 and pump-laser lens 740 may each include a lens having any suitable size or diameter, such as for example, a diameter of approximately 1 µm, 10 µm, 100 µm, 200 µm, 0.5 mm, 1 mm, 2 mm, 5 mm, or 10 mm.

In particular embodiments, due to the rectangular shape of the active area from which the beam is emitted, the output beam from seed laser diode 710 or pump laser diode 730 may have a substantially elliptical shape with different divergence angles along two directions. For example, the pump laser diode 730 may emit light having a 5°-10° divergence along a horizontal axis and a 20°-40° divergence along a vertical axis. The axis with the larger divergence may be referred to as the "fast axis," and the axis with the smaller divergence may be referred to as the "slow axis." In particular embodiments, seed-laser lens 720 or pump-laser lens 740 may be referred to as a lens assembly and may include one, two, three, or any other suitable number of lenses. As an example, the pump-laser lens 740 in FIG. 15 may include two lenses, such as for example: a spherical lens and a cylindrical lens; two cylindrical lenses; or a fast-axis collimating lens and a slow-axis collimating lens. The two lenses may be packaged together into a single lens assembly that is installed or aligned as one unit, or the two lenses may be discrete elements that are installed or aligned separately. The pump-laser lens 740 may include a first cylindrical lens that collimates the pump-laser beam 734 along the fast axis followed by a second cylindrical lens that collimates the pump-laser beam 734 along the slow axis. The first cylindrical lens may be referred to as a fast-axis collimating lens, and the second cylindrical lens may be referred to as a slow-axis collimating lens.

In particular embodiments, seed-laser lens 720 or pump-laser lens 740 may include a micro-optic lens incorporated into or attached to the front facet of the seed laser diode 710 or the pump laser diode 730, respectively. For example, a small cylindrical lens epoxied to the front facet of the seed laser diode 710 may be configured to act as a fast-axis collimating lens by collimating the seed-laser beam 714 along the fast axis. A second lens may be located external to the seed laser diode 710 and may be configured to act as a slow-axis collimating lens.

In particular embodiments, a pre-amplifier assembly 700 may include an optical isolator 722 configured to transmit light traveling in one direction and block light from propagating back through the isolator 722. As an example, an optical isolator 722 may be used to prevent back-reflected light from propagating back to a seed laser 710, a pump laser 730, or a gain fiber 760. In FIG. 15, the free-space optical isolator 722 transmits the collimated seed-laser beam 714 and prevents light from propagating back toward the seed laser diode 710. The optical isolator 722 in FIG. 15 may be a free-space optical isolator that operates in a manner similar to a fiber-optic isolator 620 described above.

In particular embodiments, a pre-amplifier assembly 700 may include an optical-beam combiner 750 configured to combine the collimated seed-laser beam 714 and pump-laser beam 734 into a combined free-space beam 752. An optical-beam combiner 750 may be referred to as a beam combiner, a wavelength combiner, a combiner, a wavelength multiplexer, a pump-signal combiner, a pump combiner, a dichroic combiner, or a WDM. An optical-beam combiner 750 may be a free-space optical component that combines two beams having two different wavelengths (e.g., a free-space seed-laser beam 714 and a free-space pump beam 734), and an optical-beam combiner 750 may operate in a manner similar to a pump WDM 650 described above.

In particular embodiments, combiner 750 may be a dichroic beam splitter cube or dichroic beam splitter plate. As an example, the combiner 750 may be a dichroic beam splitter configured to reflect light from the seed laser 710 and transmit light from the pump laser 730 (or vice versa). In FIG. 15, the combiner 750 is a dichroic beam splitter cube that reflects the free-space seed-laser beam 714 and transmits the free-space pump-laser beam 734 to produce the combined free-space beam 752. For example, the combiner 750 may reflect light at approximately 1530-1560 nm and transmit light at approximately 920-980 nm. As another example, the combiner 750 may reflect light at approximately 1545-1555 nm and transmit pump-laser light at approximately 1480 nm. The combined beam 752 includes most or all of the light from the seed-laser beam 714 and most or all of the light from the pump-laser beam 734, and the two beams may be combined or overlapped so that they are substantially coaxial or coaligned (e.g., the two beams propagate along substantially the same propagation axis). The combiner 750 may have any suitable size or shape, such as for example, a cuboid shape with a side length of approximately 0.5 mm, 1 mm, 2 mm, 5 mm, or 10 mm. As another example, the combiner 750 may have a disk or plate shape with a diameter or side length of approximately 0.5 mm, 1 mm, 2 mm, 5 mm, or 10 mm and a thickness of approximately 0.1 mm, 1 mm, 2 mm, or 5 mm. In particular embodiments, in addition to combining optical beams, a combiner 750 may also act as an optical filter to prevent back-propagating light from reaching the seed laser diode 710 or the pump laser diode 730. As an example, ASE produced in the gain fiber 760 may propagate back towards the combiner 750. The combiner 750 may reflect most of the ASE, which prevents the back-propagating ASE from reaching the pump laser diode 730.

In particular embodiments, a pre-amplifier assembly 700 may include a focusing lens 754 configured to focus a combined beam 752. Additionally, a pre-amplifier assembly 700 may include an optical gain fiber 760 having an input end 768 configured to receive a focused beam. As an example, the focusing lens 754 may receive the combined beam 752 from the combiner 750 and may focus the combined beam 752 onto the input face 762 of the gain fiber 760. The input face 762 of the gain fiber 760 may be configured to receive a focused beam produced by the focusing lens 754. The focused beam may be coupled into the gain fiber 760 through the input face 762 and may then propagate through the gain fiber 760. The light received by the input face 762 that propagates through the gain fiber 760 may include light from the pump-laser beam 734 and light from the seed-laser beam 714.

In particular embodiments, the input face 762 may be a cleaved or polished surface of the gain fiber 760. The input face 762 may be cleaved or polished so that it is substantially normal to the combined beam 752, or the input face 762 may be cleaved or polished at an angle so that it is angled with respect to the combined beam 752. In particular embodiments, the input face 762 may include an anti-reflection (AR) coating having a low optical reflectivity at a wavelength of seed laser 710 or pump laser 730. As an example, the input face 762 may be cleaved or polished, and then a dielectric coating may be deposited onto the surface of the input face 762. The dielectric coating may be an AR coating with a low optical reflectivity (e.g., R<1%) at the seed-laser wavelength (e.g., 1545-1555 nm) or at the pump-laser wavelength (e.g., 940-980 nm). Angling the input face 762 or applying an AR coating to the input face 762 may reduce the amount of reflected light from the input face 762 that propagates back to the seed laser diode 710 or the pump laser diode 730. Additionally, applying an AR coating to the input face 762 may increase the amount of light from the seed laser 710 or pump laser 730 that is coupled into the gain fiber 760.

In particular embodiments, the focusing lens 754 may include one or more lenses (e.g., one or more spherical lenses or aspheric lenses) having any suitable size or diameter, such as for example, a diameter of approximately 1 μm, 10 μm, 100 μm, 200 μm, 0.5 mm, 1 mm, 2 mm, 5 mm, or 10 mm. The focusing lens 754 may be similar to seed-laser lens 720 or pump-laser lens 740. The focusing lens 754 may be a discrete optical element located some distance (e.g., 1 mm, 2 mm, 5 mm, or 10 mm) from the input face 762 of gain fiber 760. In particular embodiments, all or part of the focusing lens 754 may be combined with or attached to the input face 762. As an example, the focusing lens 754 may include a GRIN lens connected or attached to the input face 762, and the GRIN lens may receive the collimated combined beam 752 and focus it into the gain fiber 760. As another example, the input end 768 of gain fiber 760 may be a lensed fiber (e.g., at least part of the focusing lens 754 is integrated into the input face 762) where the input face 762 is shaped, tapered, or rounded to act as a lens so that the combined beam 752 is received and focused into the gain fiber 760.

In particular embodiments, a pre-amplifier assembly 700 may include an optical gain fiber 760 having an input end 768, an input face 762, a core 764, and a cladding 766. The input end 768 of the gain fiber 760 may refer to a length of the end of the gain fiber 760 that is part of, attached to, located above, or contained within a platform 705 of the pre-amplifier assembly 700. As an example, the gain fiber 760 may include a 2-6 meter length of optical fiber, and a 1-100 mm end portion of the gain fiber 760 may be attached to the platform 705 and may be referred to as the input end 768 of the gain fiber 760. The input end 768 of the gain fiber 760 may be attached to or located on or above the platform 705, and the remaining length of the gain fiber 760 may be located outside of or beyond the boundaries of the platform 705. In particular embodiments, gain fiber 760 of a pre-amplifier assembly 700 may include any suitable type of gain fiber. As an example, the gain fiber 760 may be a single-clad gain fiber (as illustrated in FIG. 15) where light from the seed-laser beam 714 and light from the pump-laser beam 734 both propagate substantially along the core 764. As another example, the gain fiber 760 may be a multi-clad gain fiber (as described below), such as for example, a double-clad gain fiber or a triple-clad gain fiber, where light from the seed-laser beam 714 propagates substantially along the core 764 and light from the pump-laser beam 734 propagates substantially along a cladding layer.

In particular embodiments, gain fiber 760 may include a section of relay fiber that is spliced to the gain fiber. The relay fiber may be a length of standard optical fiber (e.g., optical fiber that is not doped with gain material) that receives the light from the combined beam 752 and conveys that light to the gain-fiber section of the gain fiber 760. As used herein, a gain fiber 760 may refer to a length of optical fiber doped with gain material, or a gain fiber 760 may refer to a combination of relay fiber and gain fiber (e.g., a length of relay fiber that is spliced to a length of optical fiber doped with gain material). The undoped relay fiber and the doped fiber together may be referred to as a gain fiber 760. As an example, the relay fiber may include the input face 762 and the input end 768 that is attached to or located on or above the platform, and the relay fiber may be spliced the gain-fiber section. The relay fiber may have any suitable length, such as for example, a length of approximately 0.1 m, 0.5 m, 1 m, 2 m, or 5 m, and the gain fiber 760 may have any suitable length, such as for example, a length of approximately 1 m, 2 m, 3 m, 5 m, or 10 m.

In particular embodiments, gain fiber 760 may include a fiber Bragg grating (FBG) configured to reflect a portion of pump-laser light back to the pump laser diode 730. As an example, the FBG may be located approximately 1 meter from the input face 762 in the relay-fiber portion or the gain-fiber portion of gain fiber 760. The FBG may be configured to stabilize the wavelength of the pump laser diode 730 by reflecting back a portion (e.g., approximately 0.1%, 1%, 2%, 5%, or 10%) of the pump-laser light at a specific wavelength. For example, the FBG may reflect light at 976 nm±0.5 nm, which acts to stabilize the pump-laser wavelength to within this same wavelength range. Additionally, the FBG may be substantially transparent to the light produced by the seed laser diode 710 and may reflect little or none of the seed-laser light.

In particular embodiments, gain fiber 760 may be configured to absorb at least part of the light from the pump-laser beam 734 and amplify the light from the seed-laser beam 714. As the light from the pump-laser beam 734 propagates through the gain fiber 760, most of it may be absorbed by the gain material (e.g., rare-earth dopants) located primarily in the core 764 of the gain fiber 760. The excited gain material then amplifies the light from the seed-laser beam 714 as it propagates through the gain fiber 760. In particular embodiments, the seed laser diode 710 may be operated in a pulsed mode. For example, the seed-laser beam 714 may include optical pulses having a pulse duration less than or equal to 100 ns and a duty cycle less than or equal to 10%, and the amplified optical pulses produced after propagating through the gain fiber 760 may have substantially the same pulse duration and duty cycle. As another example, the seed laser 710 may produce pulses with a pulse duration of approximately 4 ns at a pulse repetition frequency of approximately 600 kHz (corresponding to a duty cycle of approximately 0.24%). The optical pulses produced by the seed laser diode 710 may be amplified in gain fiber 760 by any suitable amount of optical power gain (e.g., a gain of approximately 10 dB, 20 dB, 30 dB, or 40 dB). For example, the seed-laser pulses may have a pulse energy of approximately 0.1 nJ, and after propagating through the gain fiber 760, the pulses may have a pulse energy of approximately 0.1 µJ (corresponding to a 30-dB gain).

In particular embodiments, a pre-amplifier assembly 700 may include one seed laser diode 710 (as illustrated in FIG. 15), or a pre-amplifier assembly 700 may include two or more seed laser diodes 710. As an example, the pre-amplifier assembly 700 may include two seed laser diodes 710 having two different operating wavelengths. The seed laser diodes may operate at 1548 nm and 1552 nm, for example, and a free-space wavelength combiner (similar to combiner 750) may be used to combine the light from the two seed lasers. In particular embodiments, the multiple seed lasers of a pre-amplifier assembly 700 may be configured to produce time-interleaved optical pulses. For example, two seed lasers may each produce pulses at a 500-kHz pulse repetition frequency, and the pulses may be interleaved to form a seed-laser beam 714 with a 1-MHz pulse repetition frequency.

In particular embodiments, a pre-amplifier assembly 700 may include one or more optical filters. For example, a pre-amplifier assembly 700 may include a bandpass filter that transmits the seed-laser beam 714 and reflects or attenuates light at other wavelengths. The seed laser diode 710 may operate at approximately 1550 nm, and a bandpass filter with a 1548-1552 nm pass-band may be located between the seed laser diode 710 and the combiner 750. The bandpass filter may reduce the amount of potentially destabilizing or damaging light (e.g., stray light from the pump laser diode 730 or ASE from the gain fiber 760) that is coupled to the seed laser diode 710. As another example, a pre-amplifier assembly 700 may include a bandpass filter that transmits the pump-laser beam 734 and reflects or attenuates light at other wavelengths. The pump laser diode 730 may operate at approximately 960 nm, and a bandpass filter with 950-970 nm pass-band may be located between the pump laser diode 730 and the combiner 750. As another example, a pre-amplifier assembly 700 may include a band-pass filter located between the combiner 750 and the input face 762 and configured to transmit light at the seed-laser wavelength and light at the pump-laser wavelength.

In particular embodiments, a pre-amplifier assembly 700 may include an electronic seed-laser driver 718 configured to supply electrical current to a seed laser diode 710. For example, the seed-laser driver 718 may drive the seed laser diode 710 with current pulses, and each pulse of electrical current may result in the emission of a pulse of light by the seed laser diode 710. Additionally, the seed-laser driver 718 may provide temperature control or stabilization for the seed laser diode 710. For example, the seed laser diode 710 may be mounted on or thermally coupled to a TEC that is driven or controlled by the seed-laser driver 718. The seed-laser driver 718 may receive an indication of the temperature of the seed laser diode 710 from a temperature sensor and may supply current to the TEC to stabilize the seed-laser temperature. In particular embodiments, a pre-amplifier assembly 700 may include an electronic pump-laser driver 738 configured to supply electrical current to a pump laser diode 730. For example, the pump-laser driver 738 may drive the pump laser diode 730 with a substantially constant current (e.g., a direct current, or a DC current). Additionally, the pump-laser driver 738 may provide temperature control for the pump laser diode 730 (e.g., the pump-laser driver 738 may be coupled to a temperature sensor and TEC for the pump laser diode 730).

In particular embodiments, the seed-laser driver 718 and the pump-laser driver 738 may be included in separate circuits or circuit boards, or the two drivers may be combined together into a single circuit or circuit board. In particular embodiments, the seed-laser driver 718 or pump-laser driver 738 may be located external to the pre-amplifier assembly 700 and may be electrically coupled to the pre-amplifier assembly 700 by one or more wires, cables, traces on a printed circuit board (PCB), wire bonds, or any suitable combination thereof. In particular embodiments, the seed-laser driver 718 or pump-laser driver 738 may be part of the pre-amplifier assembly 700. For example, the seed-laser driver 718 or the pump-laser driver 738 may be mounted or attached to the platform 705. As another example, the pump-laser driver 738 may be in thermal contact with the platform 705 so that excess heat produced by the pump-laser driver 738 flows into the platform 705. The seed-laser driver 718 or the pump-laser driver 738 may be electrically coupled to the seed laser diode 710 or the pump laser diode 730 by one or more wires, cables, PCB traces, wire bonds, or any suitable combination thereof.

In particular embodiments, the seed-laser driver 718 may be combined or integrated with the seed laser diode 710, or the pump-laser driver 738 may be combined or integrated with the pump laser diode 730. For example, the seed-laser driver 718 may be flip-chip mounted to the platform 705, and the seed laser diode 710 may be mounted to the top surface of the flip-chip package containing the seed-laser driver 718. The top surface of the flip-chip package may include an InP-based material which the seed laser diode 710 may be mounted to, and the InP-based material may have a coefficient of thermal expansion (CTE) that substantially matches the CTE of the InGaAsP-based seed laser diode 710. Similarly, the top surface of the pump-laser driver 738 may include a GaAs-based material which the AlGaAs-based pump laser diode 730 may be mounted to.

In particular embodiments, a pre-amplifier assembly 700 may include a seed-laser detector 716 configured to receive light emitted from a back facet of the seed laser diode 710. The seed-laser detector 716 (which may be referred to as a back-facet detector or a back-facet monitor) may be positioned directly behind the seed laser diode 710 (e.g., approximately 0.1 mm, 1 mm, 2 mm, 5 mm, or 10 mm from the back facet) to receive at least part of the seed-laser back-facet light 712. In particular embodiments, a pre-amplifier assembly 700 may include a pump-laser detector 736 configured to receive light emitted from a back facet of the pump laser diode 730. The pump-laser detector 736 (which may be referred to as a back-facet detector or a back-facet monitor) may be positioned directly behind the pump laser diode 730 to receive at least part of the pump-laser back-facet light 732. A seed laser diode 710 or a pump laser diode 730 may include a semiconductor structure with two cleaved surfaces (referred to as a front facet and a back facet) from which laser light is emitted. The front facet or back facet may have a dielectric coating that configures the seed laser diode 710 or pump laser diode 730 to emit most of the light from the front facet. For example, the back facet of the pump laser diode 730 may include a high-reflectivity coating (e.g., R≥90%) that reflects most of the pump-laser light. The pump-laser beam 734 may include ≥90% of the total optical power emitted by the pump laser diode 730, and the pump-laser back-facet light 732 may include ≤10% of the total optical power.

The seed-laser detector 716 or the pump-laser detector 736 may include a PN or PIN photodiode (e.g., an InGaAs PIN photodiode). The seed-laser detector 716 may be a separate component, or the seed-laser detector 716 may be combined with the seed laser diode 710 into a single assembly (e.g., the seed-laser detector 716 and the seed laser diode 710 may be mounted onto the same chip carrier). Similarly, the pump-laser detector 736 may be a separate component, or the pump-laser detector 736 may be combined with the pump laser diode 730 into a single assembly. The seed-laser detector 716 may receive some or all of the light emitted by the seed laser diode 710 from the back facet, and the seed-laser detector 716 may produce an electrical signal (e.g., a current or a voltage) corresponding to the received seed-laser back-facet light 712. Similarly, the pump-laser detector 736 may receive some or all of the light emitted by the pump laser diode 730 from the back facet, and the pump-laser detector 736 may produce an electrical signal corresponding to the received pump-laser back-facet light 732.

In particular embodiments, the seed-laser detector 716 may be used to monitor the performance of the seed laser diode 710. Similarly, the pump-laser detector 736 may be used to monitor the performance of the pump laser diode 730. As an example, the performance of the pump laser diode 730 may degrade over time (e.g., the output optical power produced by the pump laser diode 730 may gradually decrease over tens, hundreds, or thousands of hours of operation). The amount of optical power in the pump-laser beam 734 may be proportional to the amount of power in the pump-laser back-facet light 732 (e.g., the pump-laser back-facet light 732 may have approximately 1% of the power of the pump-laser beam 734). As the amount of optical power in the pump-laser beam 734 drops, the corresponding electrical signal produced by the pump-laser detector 736 may also decrease. The pump-laser driver 738 may receive the signal produced by the pump-laser detector 736, and in response to detecting a decrease in the signal, the pump-laser driver 738 may increase the drive current supplied to the pump laser diode 730. Increasing the pump-laser drive current may stabilize or maintain the power of the pump-laser beam 734 at a particular level (e.g., 8 watts). If the performance of the pump laser diode 730 continues to degrade, the pump-laser driver 738 may send a notification (e.g., to controller 150) indicating that the pump laser diode 730 is degrading or may be close to failure. For example, if the current required to maintain the power of the pump-laser beam 734 exceeds a particular threshold value (e.g., 10 amps), then the pump-laser driver 738 may send a message or set a flag indicating the status of the pump laser diode 730. The controller 150 may send a notification indicating that the pump laser diode 730 is degrading or may soon fail and the lidar system 100 should be taken in for service (e.g., to replace the pump laser diode 730 or to replace the pre-amplifier assembly 700).

In particular embodiments, two or more components of a pre-amplifier assembly 700 may be combined together into an integrated optical assembly. As an example, two lenses may be combined together into a single lens assembly to form a seed-laser lens 720, pump-laser lens 740, or focusing lens 754. Rather than separately positioning and attaching the two lenses to the platform 705, the two lenses may first be installed into a mechanical lens holder, and then the lens assembly may be positioned and attached to the platform 705 as a single optical unit. As another example, the combiner 750 and the focusing lens 754 may be combined together into a single optical assembly, which may be aligned and attached to the platform 705 as a single unit. As another example, the optical isolator 722, combiner 750, and focusing lens 754 may be combined together into a single optical assembly. The isolator-combiner-lens assembly may be built using a manufacturing station that is separate from the pre-amplifier assembly 700, and then the combined assembly may be aligned and attached to the platform 705 as a single unit. As another example, the pump-laser lens 740, the combiner 750, and the focusing lens 754 may first be aligned and packaged together into a single optical assembly, and then the optical assembly may be aligned and installed onto the platform 705 as a single optical unit.

In particular embodiments, a pre-amplifier assembly 700 may include a platform 705 (which may be referred to as a mounting platform, a micro-bench, an optical bench, a micro-optical bench, or a silicon optical bench), where one or more optical components are mechanically attached to the platform 705. In the example of FIG. 15, one or more of the following free-space optical components may be mechanically attached to the platform 705: seed laser diode 710, seed-laser lens 720, pump laser diode 730, pump-laser lens 740, optical-beam combiner 750, focusing lens 754, optical isolator 722, seed-laser detector 716, pump-laser detector 736, and the input end 768 of optical gain fiber 760. Additionally, an optical filter or an optical assembly (e.g., a combination of two or more optical components) may be attached to a platform 705.

In particular embodiments, an optical component being attached or mechanically attached to a mounting platform 705 may refer to an optical component being epoxied, bonded, welded, soldered, or mechanically fastened to the mounting platform 705. An optical component may be mechanically attached to a mounting platform 705 by any suitable attachment technique, such as for example, by bonding with an adhesive or epoxy (e.g., using an ultraviolet-cure (UV-cure) adhesive, a two-part epoxy, a thermally conductive epoxy, or an electrically conductive epoxy), welding, brazing, soldering, mechanical fastening (e.g., with one or more screws), or any suitable combination thereof. As an example, a seed laser diode 710 may be attached to a chip carrier with solder or epoxy, and the chip carrier may be attached to the platform 705 with solder or thermally conductive epoxy. As another example, a combiner 750 may be directly attached to the platform 705 by a UV-cure adhesive, or a combiner 750 may be directly attached to the platform 705 by a combination of UV-cure adhesive and epoxy. The combiner 750 may first be aligned and temporarily attached to the platform 705 using a rapidly curing UV-cure adhesive (e.g., the adhesive may cure in less than one minute), and then the combiner 750 may be permanently attached to the platform using an epoxy (which may require 1-24 hours of cure time). As another example, a combiner 750 may first be attached to a carrier (e.g., an aluminum block or mount that the combiner 750 is epoxied to) and then the carrier may be attached to the platform 705 by epoxy, solder, or one or more mechanical fasteners.

In particular embodiments, being attached or mechanically attached to a mounting platform 705 may refer to an optical component being directly or indirectly attached, coupled, or secured to the mounting platform 705. As an example, a seed laser diode 710 may be directly attached to the platform 705, or a seed laser diode 710 may be attached in an indirect manner (e.g., the seed laser diode 710 may be attached to a chip carrier, thermoelectric cooler, or other intermediate component which in turn is directly mounted to the platform 705). As another example, a seed-laser lens 720 may be directly attached to the platform 705, or a seed-laser lens 720 may be installed into a mechanical lens holder which in turn is directly attached to the platform. As another example, the input end 768 of the gain fiber 760 may be inserted into a sleeve assembly (e.g., a mechanical block or tube with a small hole that the input end 768 is inserted into) and affixed to the sleeve assembly, and then the sleeve assembly may be directly attached to the platform 705.

In particular embodiments, a platform 705 may be made from or may include any suitable material, such as for example, glass (e.g., borosilicate or fused silica), a ceramic material (e.g., aluminum oxide or a lithium-aluminosilicate glass-ceramic), a semiconductor material (e.g., silicon or polysilicon), metal (e.g., aluminum, copper, or a nickel-iron alloy, such as for example Invar), carbon fiber, or any suitable combination thereof. In particular embodiments, the material for a platform 705 may be selected to have a relatively low coefficient of thermal expansion (CTE) or a relatively high thermal conductivity. For example, the platform 705 may be made from a material having a CTE of less than $4 \times 10^{-6}$ $K^{-1}$, such as for example, a glass material, a lithium-aluminosilicate glass-ceramic, Invar, or a silicon-based material. Having a relatively low CTE may allow the optical components mounted to the platform 705 to maintain optical alignment in the presence of environmental temperature variations. As a result, the overall performance of the pre-amplifier assembly 700 may remain substantially constant (e.g., less than 1%, 5%, or 10% variation in optical power produced at the output end of the gain fiber 760) as the environmental temperature changes. As another example, the platform 705 may be made from a material with a thermal conductivity of greater than 5 $W \cdot m^{-1} \cdot K^{-1}$, such as for example, aluminum, copper, or aluminum oxide ($Al_2O_3$). Having a relatively high thermal conductivity may allow the platform 705 to dissipate or remove heat produced by some of the electrical components mounted to the platform 705, such as for example, the seed laser diode 710, the pump laser diode 730, the seed-laser driver 718, or the pump-laser driver 738. The platform 705 may be in thermal contact with a second material (e.g., a heat sink, heat pipe, heat spreader, another thermally conductive material, a TEC, or forced air from a fan) so that the excess heat flows from the electrical components to the platform 705, and then to the second material away from the platform 705. As another example, the platform 705 may be made from a material having both a relatively low CTE and a relatively high thermal conductivity, such as for example, silicon or polysilicon. Additionally, a silicon or polysilicon material may be doped to provide an increased amount of thermal conductivity.

Figure 16:
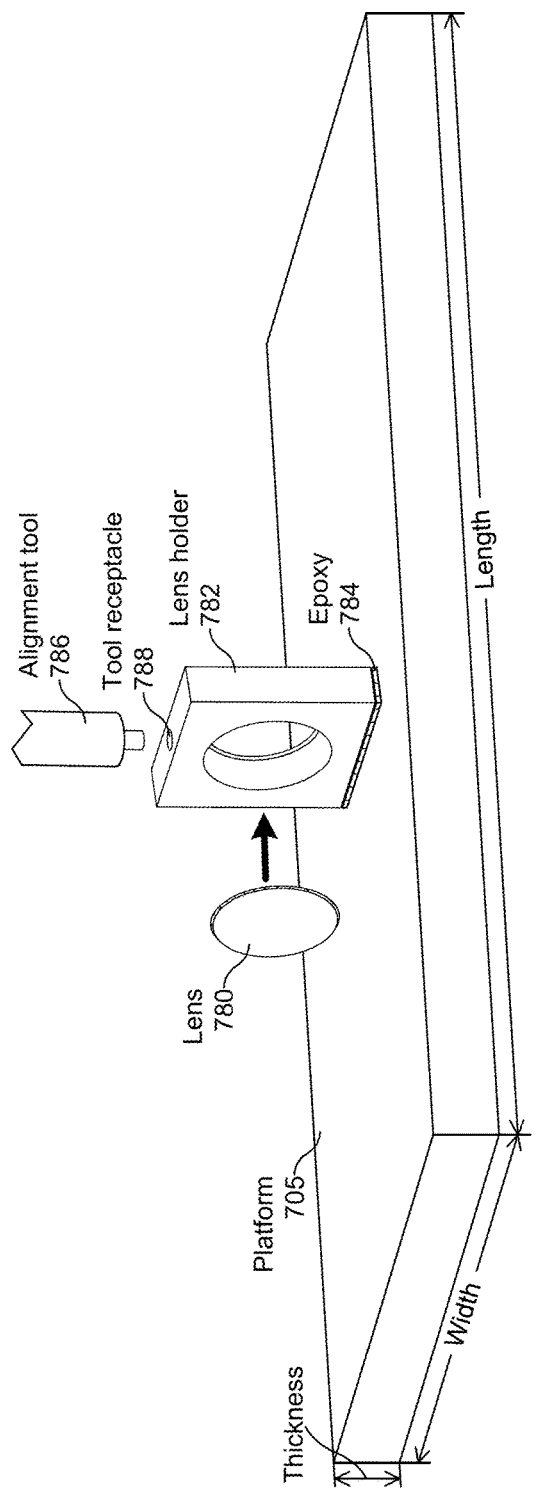
FIG. 16 illustrates an example mechanical-attachment technique based on active alignment of an optical component.

FIG. 16 illustrates an example mechanical-attachment technique based on active alignment of an optical component. An active-alignment technique may refer to the installation and attachment of an optical component onto a platform 705 using some form of electrical or optical feedback (e.g., a reading on a voltmeter or an optical-power meter). For example, the position of a lens 780 may be adjusted until a beam is aligned through an aperture or until the amount of optical power coupled into an optical fiber is maximized. In particular embodiments, one or more optical components may be attached to platform 705 using an active-alignment technique. As an example, an optical component may be attached to a mechanical alignment tool 786 which is used to precisely adjust the location or angle of the optical component on the platform 705. Once the optical component is positioned in a desired location, the optical component may be attached to the platform 705 by any suitable attachment technique (e.g., adhesive, epoxy, welding, brazing, soldering, or mechanical fastening).

In the example of FIG. 16, an optomechanical lens assembly is prepared by first attaching a lens 780 to a lens holder 782. As an example, in a separate assembly operation away from the platform 705, the lens 780 (which may be a seed-laser lens, a pump-laser lens, or a focusing lens) may be epoxied into an aluminum lens holder 782. Next, the optomechanical lens assembly may be temporarily attached to an alignment tool 786 (e.g., by screwing an end of the alignment tool 786 into a threaded tool receptacle 788). The alignment tool 786 may be coupled to a mechanical positioning fixture (e.g., a multi-axis alignment stage configured to translate or adjust the angle of the lens holder 782). The alignment of the lens 780 may be adjusted with the mechanical positioning fixture while making near-field or far-field measurements (e.g., with a camera or other viewing device) that provide feedback to help optimize the lens alignment. The position or angular alignment of the optomechanical assembly may be adjusted until the lens 780 is positioned in a desired location (e.g., the position of the lens 780 may be adjusted until an optical beam achieves a desired alignment, collimation, or focusing or until a particular amount of light is coupled into an optical fiber). For example, the lens 780 may be moved to optimize the coupling of combined beam 752 into the gain fiber 760 or to optimize the alignment or collimation of the seed-laser beam 714 or the pump-laser beam 734. A layer of epoxy 784 may be applied between the platform 705 and the lens holder 782, and when the epoxy 784 is cured, the alignment tool 786 may be removed, leaving the optomechanical assembly (including the lens 780 and the lens holder 782) attached to the platform 705.

In particular embodiments, a platform 705 may have any suitable length, width, diameter, or thickness. As an example, a platform 705 may have a length, width, or diameter of approximately 10 mm, 20 mm, 50 mm, 100 mm, or 200 mm, and a platform 705 may have a thickness of approximately 0.1 mm, 0.5 mm, 1 mm, 2 mm, 5 mm, or 10 mm. As another example, a platform 705 may be made from silicon or polysilicon and have dimensions of approximately 60 mm×40 mm×1 mm. As another example, a platform 705 may be made from Invar or aluminum oxide and have dimensions of approximately 80 mm×80 mm×4 mm.

Figure 17:
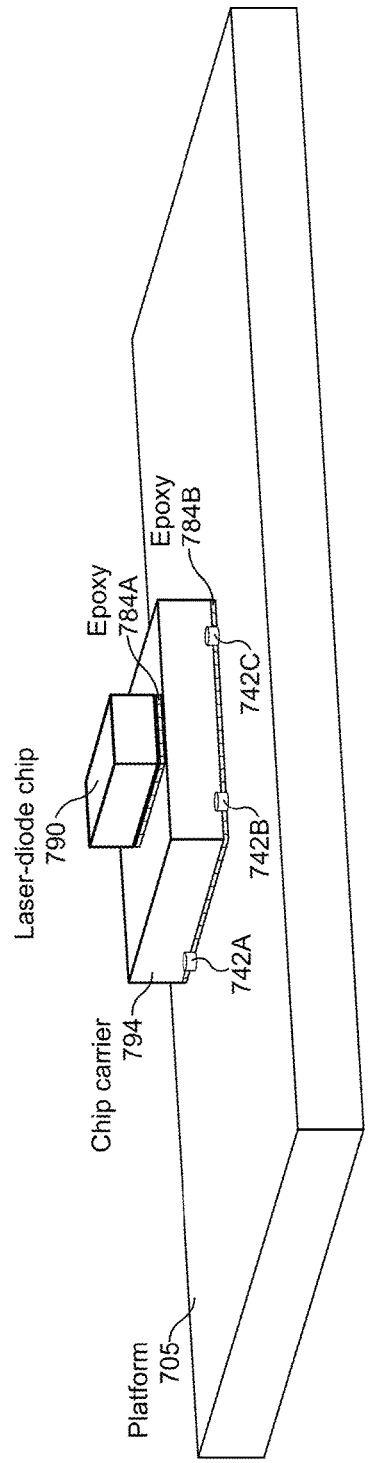
FIG. 17 illustrates an example mechanical-attachment technique based on passive alignment of an optical component.

FIG. 17 illustrates an example mechanical-attachment technique based on passive alignment of an optical component. In particular embodiments, a platform 705 may include one or more registration features 742 which are used to passively align or position an optical component on the platform 705. Rather than applying an active-alignment technique as illustrated in FIG. 16, an optical component may be passively positioned and attached to the platform 705 using one or more registration features 742. In particular embodiments, a registration feature 742 (which may be referred to as a mechanical registration feature, an alignment feature, or a positioning feature) may refer to a mechanical element used to precisely define the location of an optical component on a platform 705. A registration feature 742 may include a bump, protrusion, or hard stop that extends above a top plane of the platform 705, or a registration feature 742 may include a hole or slot that extends below a top plane of the platform 705. A registration feature 742 may have any suitable size, such as for example a length, width, height, thickness, or diameter of approximately 0.05 mm, 0.1 mm, 0.5 mm, 1 mm, or 5 mm. A registration feature 742 may have any suitable shape, such as for example, a circular, elliptical, square, or rectangular shape. As an example, a registration feature 742 may be round with a 0.5-mm diameter and may extend above the plane of the platform 705 by 0.5 mm.

In particular embodiments, one or more optical components may be attached to a platform 705 using a passive-alignment technique. A passive-alignment technique may refer to the installation and attachment of an optical component onto a platform 705 using mechanical alignment features and without the use of electrical or optical feedback to position the optical component. As an example, an optical component (or a holder or mount that the optical component is attached to) may be pushed up against one or more registration features 742, and then the optical component may be attached to the platform 705. In particular embodiments, a platform 705 may include one or more mechanical registration features 742 configured to define a fixed position on the platform 705 for one or more of a seed laser diode 710, a seed-laser lens 720, an isolator 722, a seed-laser detector 716, a pump laser diode 730, a pump-laser lens 740, a pump-laser detector 736, an optical-beam combiner 750, a focusing lens 754, an input end 768 of a gain fiber 760, an optical filter, or any other suitable optical element. In FIG. 15, the registration features 742 provide hard stops that define the location of the pump laser diode 730 with respect to the platform 705. In FIG. 17, the laser-diode chip 790 is attached to the chip carrier 794, and the chip carrier 794 is positioned on the platform 705 based on the registration features 742A, 742B, and 742C. The laser-diode chip 790 may be attached to the chip carrier 794 (by a layer of epoxy 784A) in a separate assembly operation, and then the laser-diode-chip-carrier assembly may be attached to the platform 705 (by a layer of epoxy 784B) in a location defined by the three registration features 742A, 742B, and 742C.

In particular embodiments, a registration feature 742 may include a dowel pin or a locating pin that is press-fit into the platform 705 so that a portion of the pin extends above the top plane of the platform 705. As an example, an optomechanical assembly may include two holes (or a hole and a slot) which mate with two dowel pins which are press fit into the platform 705. The two dowel pins define a precise location for the optomechanical assembly, and the optomechanical assembly may be attached to the platform 705 using epoxy (or any other suitable attachment technique). In FIG. 17, the three registration features 742A, 742B, and 742C may be dowel pins which are press fit into the platform 705 so that part of each pin extends above the top plane of the platform 705. As an example, a layer of epoxy 784B may be applied to the chip carrier 794 or platform 705, and then the chip carrier 794 may be placed on the platform 705. A mechanical force may be applied to the chip carrier 794 so that one edge is in contact with or pushed against registration feature 742A and another edge is in contact with or pushed against registration features 742B and 742C. In particular embodiments, a registration feature 742 may include a hole or slot in the platform 705 into which a dowel pin or locating pin is inserted. For example, an optomechanical assembly may include two dowel pins press fit into the bottom surface of the assembly, and each dowel pin may be inserted into a hole or slot in the platform 705.

In particular embodiments, one or more registration features 742 may be formed by a machining operation. For example, a platform 705 may be made from a plate of metal or ceramic, and the plate may be machined to form one or more registration features 742. The plate may be machined using a milling machine that removes material from the top surface of the plate, except for the areas where registration features 742 are to be located. For example, removing approximately 0.5 mm of the top surface may form registration features that extend approximately 0.5 mm above the surface of the platform 705.

In particular embodiments, one or more registration features 742 may be formed by photolithography or microfabrication. As an example, the platform 705 may be made from silicon, polysilicon, or any other suitable semiconductor or silicon-based material, and one or more registration features 742 may be produced through a semiconductor microfabrication process applied to the platform 705. The locations of the registration features 742 may be precisely defined using lithography, and the registration features 742 may be formed by etching. For example, the top surface of the platform 705 may be coated with a layer of photoresist that is then exposed to UV light transmitted through a mask that defines the locations of the registration features 742. Portions of the photoresist are removed based on the mask pattern. Then, the surface of the platform 705 is etched to remove some of the material from the surface and form the registration features 742. In particular embodiments, a microfabrication process may produce registration features 742 with any suitable dimensional or positioning accuracy, such as for example, an accuracy of less than or equal to 10 nm, 20 nm, 50 nm, 100 nm, 0.5 μm, 1 μm, 5 μm, or 10 μm.

In particular embodiments, an active-alignment technique or a passive-alignment technique may be used to position and attach any suitable optical component to a platform 705. As an example, all the optical components in a pre-amplifier assembly 700 may be actively aligned, all the optical components may be passively aligned, or a combination of active and passive alignment techniques may be used in attaching optical components to a platform 705. In FIG. 15, the seed laser diode 710, the isolator 722, the pump laser diode 730, the combiner 750, and the input end 768 of the gain fiber 760 may be attached to the platform 705 using a passive-alignment technique. The seed-laser lens 720, the pump-laser lens 740, and the focusing lens 754 may be attached to the platform 705 using an active-alignment technique. As an example, the seed-laser lens 720 may be attached to a mechanical positioning fixture which adjusts the position of the seed-laser lens 720 until the collimation, focusing, or alignment of the seed-laser beam 714 is optimized. As another example, the position of the focusing lens 754 may be adjusted until the coupling of the seed-laser beam 714 or pump-laser beam 734 into the gain fiber 760 is maximized, and then the focusing lens 754 may be attached to the platform 705.

In particular embodiments, a platform 705 may be contained within an enclosure that includes a feedthrough for optical gain fiber 760. As an example, after a pre-amplifier assembly 700 is built, the assembly (including the platform 705 and the optical components attached to the platform 705) may be installed into an enclosure that protects the optical components from contaminants. The enclosure may be an airtight or watertight structure that prevents water vapor, liquid water, dirt, dust, or other contaminants from getting inside the enclosure. The enclosure may be configured to be purged with an inert gas (e.g., dry air, nitrogen, or argon) and sealed. The enclosure may include a feedthrough that allows the gain fiber 760 to exit from the enclosure. The feedthrough may be an airtight or watertight feedthrough that allows the fiber to exit but still maintains a seal. The enclosure may also include one or more feedthroughs that allow electrical wire or cables to enter or exit the enclosure.

Figure 18:
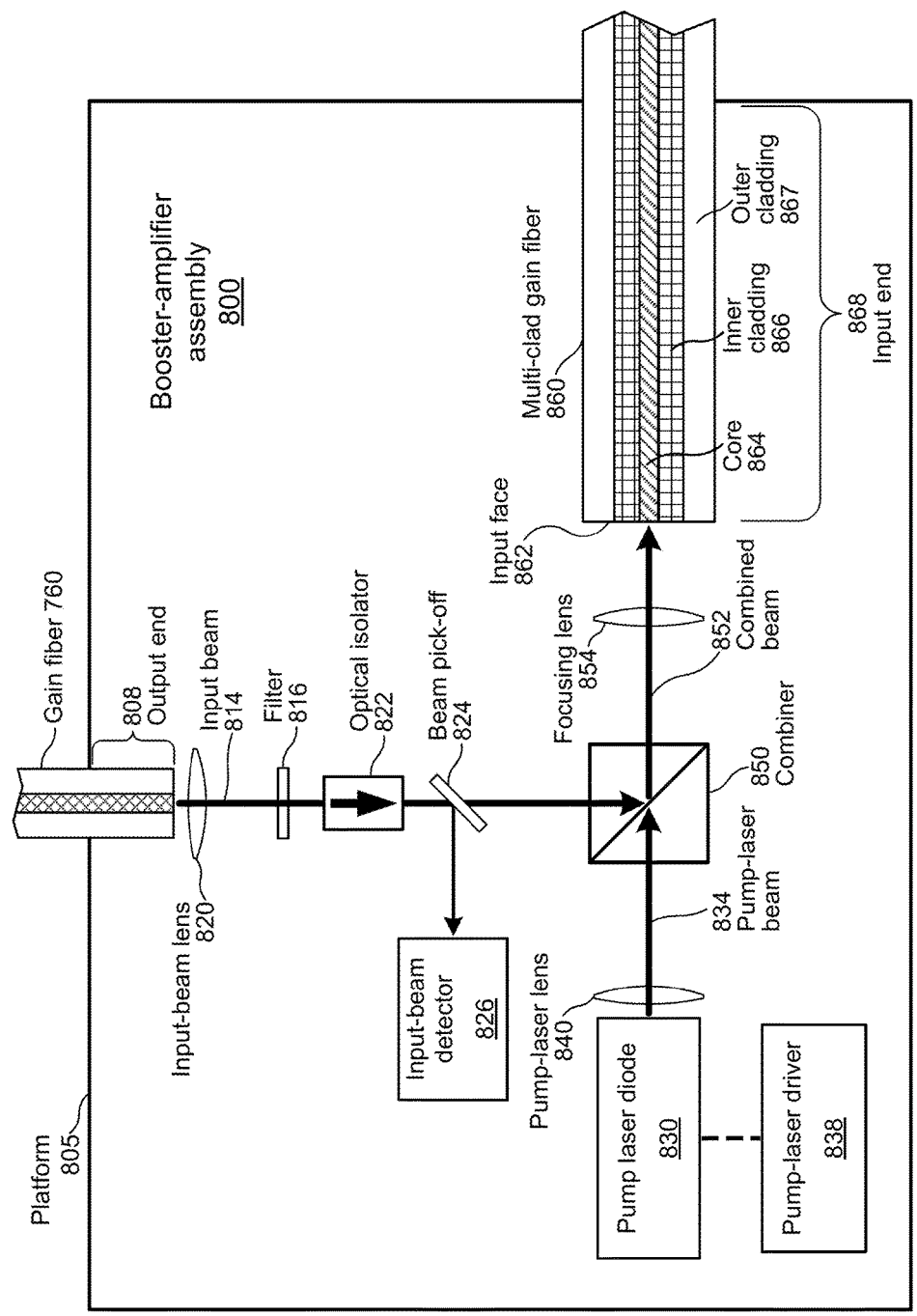
FIG. 18 illustrates a top view of an example free-space booster-amplifier assembly.

FIG. 18 illustrates a top view of an example free-space booster-amplifier assembly 800. The booster-amplifier assembly 800 illustrated in FIG. 18 may be referred to as a fiber laser, fiber laser with free-space components, free-space amplifier, booster amplifier, power amplifier, amplifier, laser system, laser, or light source, and the booster-amplifier assembly 800 may be part of a light source 110 of a lidar system 100. In FIG. 18, input beam 814, pump-laser beam 834, and combined beam 852 may each be a free-space optical beam. Additionally, input-beam lens 820, filter 816, optical isolator 822, beam pick-off 824, pump-laser lens 840, combiner 850, and focusing lens 854 may each be a free-space optical component. In particular embodiments, a booster-amplifier assembly 800 may be similar to a pre-amplifier assembly 700 or may include one or more optical components which are similar to those of a pre-amplifier assembly 700.

In particular embodiments, a booster-amplifier assembly 800 may include an output end 808 of a gain fiber 760. The gain fiber 760 may come from another amplifier assembly (e.g., another booster-amplifier assembly or a pre-amplifier assembly 700), and the output end 808 may be configured to produce input beam 814 (e.g., input beam 814 is the output beam from the gain fiber 760 as well as the input beam to the booster-amplifier assembly 800). The input beam 814 may be a free-space beam that includes light from a laser diode (e.g., seed laser diode 710 of pre-amplifier assembly 700) that is amplified while propagating through the gain fiber 760.

In particular embodiments, a booster-amplifier assembly 800 may include an input-beam lens 820 (which may be referred as a collimating lens) configured to collect, collimate, or focus a free-space input beam 814 from the gain fiber 760. The input beam 814 may be emitted from the gain fiber 760 into a diverging cone shape, and the input-beam lens 820 may collect and collimate the input beam 814 to produce a collimated free-space optical beam. The input-beam lens 820 may include a single spherical or aspheric lens. The input-beam lens 820 may be similar to seed-laser lens 720, pump-laser lens 740, or focusing lens 754 described and illustrated herein.

In particular embodiments, a booster-amplifier assembly 800 may include a pump laser diode 830 configured to produce a free-space pump-laser beam 834. The pump laser diode 830 in FIG. 18 may be similar to the pump laser diode 730 in FIG. 15. The pump laser diode 830 may be any suitable type of laser diode configured to produce light at a wavelength between approximately 900 nm and approximately 1000 nm. The pump laser diode 830 may include a laser-diode chip that directly emits a free-space optical beam (e.g., pump-laser beam 834) from a front facet of the pump laser diode 830.

In particular embodiments, a booster-amplifier assembly 800 may include a pump-laser driver 838 configured to supply electrical current to a pump laser diode 830. Additionally, the pump-laser driver 838 may provide temperature control for the pump laser diode 830. The pump-laser driver 838 in FIG. 18 may be similar to the pump-laser driver 738 described and illustrated herein. In particular embodiments, a booster-amplifier assembly 800 may include a pump-laser detector (not illustrated in FIG. 18), which may be similar to pump-laser detector 736 described and illustrated herein. A pump-laser detector may be configured to receive light emitted from a back facet of the pump laser diode 830 and provide an electrical signal corresponding to the received light to the pump-laser driver 838.

In particular embodiments, a booster-amplifier assembly 800 may include a pump-laser lens 840 configured to collect, collimate, or focus a free-space pump-laser beam 834 emitted by pump laser diode 830. The pump-laser lens 840, which may be similar to pump-laser lens 740 described and illustrated herein, may include one or more spherical lenses, cylindrical lenses, aspheric lenses, GRIN lenses, or any suitable combination thereof. As an example, the pump-laser lens 840 may include a fast-axis collimating lens and a slow-axis collimating lens.

In particular embodiments, a booster-amplifier assembly 800 may include an optical filter 816 configured to remove ASE from the input beam 814. The input beam 814, when it exits the output end 808 of the gain fiber 760, may include light that was amplified by the gain material of the gain fiber 760 as well as ASE produced by the gain material or residual pump light that was not absorbed by the gain material. The free-space optical filter 816 may be a bandpass filter configured to transmit the amplified light over a particular wavelength range and reflect or absorb light outside that wavelength range. As an example, the booster-amplifier assembly 800 may be configured to amplify light at approximately 1550 nm, and the filter 816 may transmit light from 1548 nm to 1552 nm. ASE light produced by the gain material in the gain fiber 760 may have a spectrum that extends from approximately 1520 nm to 1600 nm, and the filter 816 may remove most of the ASE from the input beam 814 that is located outside the 1548-1552 nm wavelength range. Additionally, residual light from a pump laser may have a wavelength in the 900-1000 nm range, and the filter 816 may remove most of the residual pump light from the input beam 814. The filter 816 in FIG. 18 may be similar to filter 630, 630A, or 630B described and illustrated herein.

In particular embodiments, a booster-amplifier assembly 800 may include an optical isolator 822. The optical isolator 822 in FIG. 18 may be similar to the optical isolator 722 described and illustrated herein. The optical isolator 822 may be configured to transmit the input beam 814 and prevent light from propagating back to the gain fiber 760.

In particular embodiments, a booster-amplifier assembly 800 may include a beam pick-off 824 and an input-beam detector 826 configured to detect a portion of input beam 814 reflected from the beam pick-off 824. A beam pick-off 824 may be configured to transmit most of the input beam 814 and reflect a small portion (e.g., ≤5%, ≤1%, or ≤0.1%) of the input beam 814 to an input-beam detector 826. As an example, the beam pick-off 824 may be a plate beam splitter that reflects approximately 0.5% of incident light at approximately 1548-1552 nm (and transmits approximately 99.5% of the incident light). The input-beam detector 826 may include a PN or PIN photodiode (e.g., an InGaAs PIN photodiode).

In particular embodiments, an input-beam detector 826 may be used to monitor the power or energy of the input beam 814 or to monitor the performance of the preceding amplifier stage (e.g., pre-amplifier assembly 700). As an example, a decrease in the power or energy of the input beam 814 may indicate a problem with or a failure of the pre-amplifier assembly 700. Additionally, a decrease in the power or energy of the input beam 814 may cause damage to the gain fiber 860 or degradation in the performance of the booster-amplifier assembly 800. For example, if the input beam 814 does not have enough optical power to properly seed or saturate the gain material in the gain fiber 860, then the gain fiber 860 may exhibit self-lasing or self-pulsing (which may damage the gain fiber 860) or the amplified pulses produced at the output of the gain fiber 860 may include excessive amounts of optical noise. The input-beam detector 826 may be coupled to the pump-laser driver 838, and if the power or energy of the input beam 814 decreases below a particular threshold value, then the pump-laser driver 838 may shut down or reduce the drive current supplied to the pump laser diode 830 (e.g., to prevent damage to the multi-clad gain fiber 860 caused by having too little power in the input beam 814). Additionally or alternatively, the pump-laser driver 838 may send a notification (e.g., to controller 150) indicating that there is a problem with the preceding amplifier stage.

In particular embodiments, a booster-amplifier assembly 800 may include a beam combiner 850 configured to combine the input beam 814 and the pump-laser beam 834 into a combined beam 852. The combiner 850 in FIG. 18 may be similar to combiner 750 described and illustrated herein. As an example, the combiner 850 may be a dichroic beam splitter cube or plate configured to reflect the input beam 814 (e.g., light at approximately 1530-1560 nm) and transmit the pump-laser beam 834 (e.g., light at approximately 920-980 nm) to produce the free-space combined beam 852. The input beam 814 and the pump-laser beam 834 may be collimated free-space beams, and the combined beam 852 may include the input beam 814 and the pump-laser beam 834 overlapped so that they are substantially coaxial or coaligned.

In particular embodiments, a booster-amplifier assembly 800 may include a focusing lens 854 configured to focus a combined beam 852. Additionally, a booster-amplifier assembly 800 may include a multi-clad gain fiber 860 having an input end 868 configured to receive a focused beam. As an example, the focusing lens 854 may receive the combined beam 852 from the combiner 850 and may focus the combined beam 852 onto an input face 862 of the multi-clad gain fiber 860. The input face 862 of the multi-clad gain fiber 860 may be configured to receive a focused beam produced by the focusing lens 854. The focused beam may be coupled into the multi-clad gain fiber 860 through the input face 862 and may then propagate through the gain fiber 860. The light coupled into the gain fiber 860 may include light from the pump-laser beam 834 and light from the input beam 814. The focusing lens 854 in FIG. 18 may be similar to focusing lens 754 described and illustrated herein. The input face 862 and input end 868 in FIG. 18 may be similar to input face 762 and input end 768, respectively, described and illustrated herein.

In particular embodiments, the input face 862 may be a cleaved or polished surface of the gain fiber 860. The input face 862 may be cleaved or polished so that it is substantially normal to the combined beam 852, or the input face 862 may be cleaved or polished at an angle so that it is angled with respect to the combined beam 852. In particular embodiments, the input face 862 may include an AR coating having a low optical reflectivity at a wavelength of the input beam 814 nm or the pump laser 830. As an example, the input face 862 may be cleaved or polished, and then a dielectric coating may be deposited onto the surface of the input face 862. The dielectric coating may be an AR coating with a low optical reflectivity (e.g., R<1%) at the input-beam wavelength (e.g., 1545-1555 nm) or at the pump-laser wavelength (e.g., 940-980 nm). In particular embodiments, the input end 868 of gain fiber 860 may be lensed. For example, the input face 862 may be shaped, tapered, or rounded to act as a lens so that the combined beam 852 is received and focused into the gain fiber 860.

In particular embodiments, a booster-amplifier assembly 800 may include a multi-clad gain fiber 860 having an input end 868, an input face 862, a core 864, an inner cladding 866, and an outer cladding 867. The input end 868 of the gain fiber 860 may refer to a length of the end of the gain fiber 860 that is part of, attached to, located above, or contained within a platform 805 of the booster-amplifier assembly 800. As an example, the gain fiber 860 may include a 2-6 meter length of optical fiber, and a 1-100 mm end portion of the gain fiber 860 may be attached to the platform 805 and may be referred to as the input end 868 of the gain fiber 860. The input end 868 of the gain fiber 860 may be attached to or located on or above the platform 805, and the remaining length of the gain fiber 860 may be located outside of or beyond the boundaries of the platform 805.

In particular embodiments, a booster-amplifier assembly 800 may include a multi-clad gain fiber 860 that includes two or more cladding layers. In particular embodiments, a booster-amplifier assembly 800 may include a dual-clad gain fiber (which may be referred to as double-clad fiber or double-clad gain fiber) having a core 864, an inner cladding 866, and an outer cladding 867. In the example of FIG. 18, the multi-clad gain fiber 860 is a dual-clad gain fiber with two layers of cladding (inner cladding 866 and outer cladding 867). The core 864, the inner cladding 866, and the outer cladding 867 may each include or be made from a glass material. As an example, the core 864 may include a silica glass doped with gain material, and the inner cladding 866 and outer cladding 867 may each include a silica glass. Additionally, the core 864, the inner cladding 866, or the outer cladding 867 may be doped with a material to change the refractive index. As an example, the outer cladding 867 may be a silica glass doped with fluorine to decrease the refractive index of the glass. As another example, the core 864 or inner cladding 866 may be a silica glass doped with germanium to increase the refractive index of the glass. In particular embodiments, a booster-amplifier assembly 800 may include a triple-clad gain fiber having a core and three cladding layers. The core and the three cladding layers may each include or be made from a glass material (e.g., silica, which may be doped with a material to change the refractive index). Rather than having one or more cladding layers which are made from a polymer material (e.g., acrylate or fluoroacrylate), a multi-clad gain fiber 860 may have an all-glass design where the core is made from glass doped with a gain material, and the two or more cladding layers are each made from a glass material. A gain fiber that includes a cladding made from polymer may be susceptible to degradation associated with exposure to elevated temperatures (e.g., the degradation may cause unwanted absorption of pump light in the polymer region of the gain fiber). An all-glass multi-clad gain fiber 860 may be able to operate for thousands of hours without experiencing significant performance degradation associated with elevated temperatures.

In particular embodiments, a multi-clad gain fiber 860 may include a jacket or outer layer of protective material configured to provide mechanical protection for the core and cladding layers. As an example, the outermost cladding layer of a multi-clad gain fiber 860 may be coated with a polymer material which provides mechanical protection but is not configured to transmit or guide the light that propagates through the gain fiber 860.

In the example of FIG. 18, the combined beam 852 includes the input beam 814 and the pump-laser beam 834. The light from the input beam 814 that is coupled into the multi-clad gain fiber 860 is guided (as a single-mode or multi-mode beam) by the core 864, and the light from the pump-laser beam 834 is guided (as a multi-mode beam) by the inner cladding 866. For example, the inner cladding 866 may have a lower refractive index than the core 864, which provides index guiding so the light from the input beam 814 is confined to propagate primarily in the core 864. Similarly, the outer cladding 867 may have a lower refractive index than the inner cladding 866, so that the light from the pump-laser beam 834 is confined to propagate primarily in the inner cladding 866 and core 864. The core 864 or a portion of the inner cladding 866 around the core may be doped with gain material (e.g., rare-earth dopants) which absorbs the pump-laser light and provides gain for the input-beam light.

In particular embodiments, a free-space amplifier assembly with a multi-clad gain fiber 860 may allow for the optimization of beam parameters (e.g., beam size, divergence, focusing, or numerical aperture (NA)) of a pump-laser beam 834. Since a free-space amplifier assembly uses a free-space combiner 850 (rather than a fiber-based combiner, such as pump WDM 650), the parameters of the pump-laser beam 834 are not constrained by having to send the pump light through a fiber-based combiner. As a result, the beam parameters of the pump-laser beam 834 may be designed to optimize or maximize the coupling of the pump-laser beam 834 into the multi-clad gain fiber 860. For example, in the booster-amplifier assembly of FIG. 18, the focal length or location of the pump-laser lens 840 or the focusing lens 854 may be selected so that the focused pump-laser beam 834 that is incident on the input face 862 has an NA that substantially matches the NA associated with the inner cladding 866.

In particular embodiments, a booster-amplifier assembly 800 may include a platform 805 (which may be referred to as a mounting platform, a micro-bench, an optical bench, a micro-optical bench, or a silicon optical bench), where one or more optical components are mechanically attached to the platform 805. In the example of FIG. 18, one or more of the following free-space optical components may be mechanically attached to the platform 805: output end 808 of gain fiber 760, input-beam lens 820, pump laser diode 830, pump-laser lens 840, beam combiner 850, focusing lens 854, optical isolator 822, beam pick-off 824, input-beam detector 826, and input end 868 of multi-clad gain fiber 860. Additionally, an optical assembly (e.g., a combination of two or more optical components) may be attached to a platform 805. The platform 805 in FIG. 18 may be similar to the platform 705 described and illustrated herein.

In particular embodiments, one or more optical components may be mechanically attached to a platform 805 by any suitable attachment technique, such as for example, by bonding with an adhesive or epoxy, welding, brazing, soldering, mechanical fastening, or any suitable combination thereof. In particular embodiments, one or more optical components may be directly or indirectly attached to a platform 805. In particular embodiments, a platform 805 may be made from or may include any suitable material, such as for example, glass, a ceramic material, a semiconductor material, metal, carbon fiber, or any suitable combination thereof. As an example, the material for a platform 805 may be selected to have a relatively low CTE or a relatively high thermal conductivity.

In particular embodiments, an active-alignment technique or a passive-alignment technique may be used to position and attach any suitable optical component to a platform 805. As an example, all the optical components in a booster-amplifier assembly 800 may be actively aligned, all the optical components may be passively aligned, or a combination of active and passive alignment techniques may be used in attaching optical components to a platform 805. As an example, the focusing lens 854 may be actively aligned (e.g., positioned to maximize the amount of input-beam light or pump-laser light that is coupled into the gain fiber 860) and then attached to the platform 805. As another example, the output end 808 of gain fiber 760 may be attached to the platform 805 using a passive-alignment technique where a holder that contains the output end 808 is attached to the platform 805 based on one or more registration features which are part of the platform 805.

In particular embodiments, a platform 805 may be contained within an enclosure that includes one or more feedthroughs for gain fiber 760 and multi-clad gain fiber 860. As an example, the booster-amplifier assembly 800 (including the platform 805 and the optical components attached to the platform 705) may be installed into an enclosure that protects the optical components from contaminants.

Figure 19:
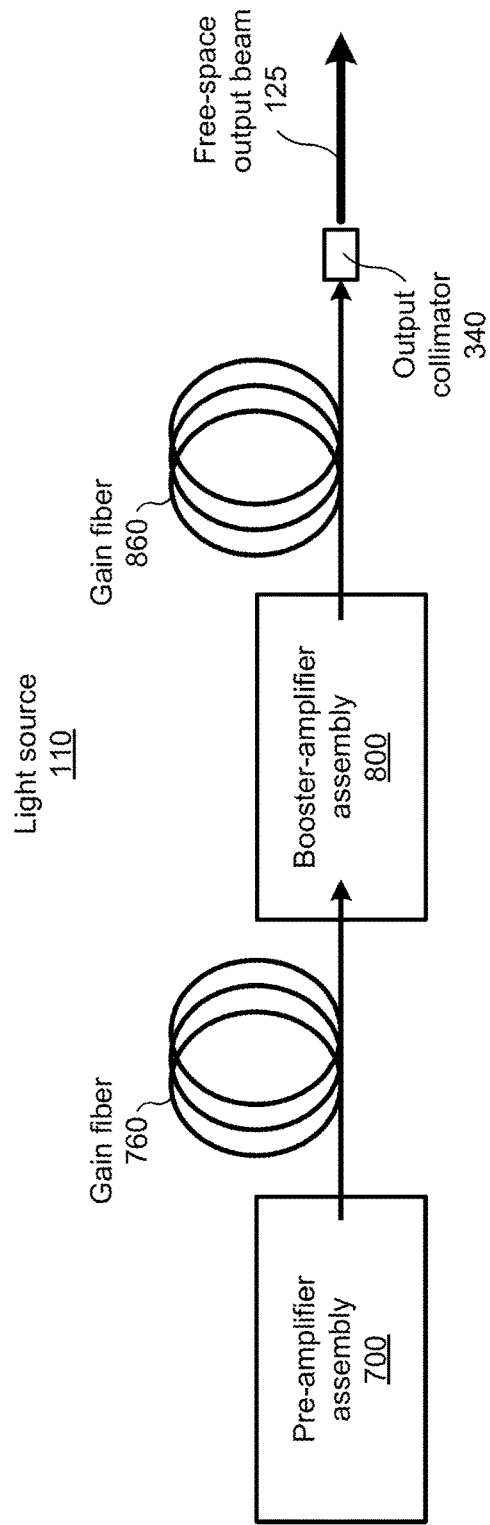
FIG. 19 illustrates an example light source that includes a free-space pre-amplifier assembly and a free-space booster-amplifier assembly.

FIG. 19 illustrates an example light source 110 that includes a free-space pre-amplifier assembly 700 and a free-space booster-amplifier assembly 800. In particular embodiments, a pre-amplifier assembly 700 or a booster-amplifier assembly 800 may be part of a light source 110 of a lidar system 100. As an example, a lidar system 100 may include a scanner 120, and a pre-amplifier assembly 700 or a booster-amplifier assembly 800 may provide amplified optical pulses to the scanner 120. In FIG. 19, the pre-amplifier assembly 700 sends seed-laser pulses and pump-laser light to the gain fiber 760. The gain fiber 760 amplifies the seed-laser pulses and sends the amplified pulses to the booster-amplifier assembly 800. The booster-amplifier assembly 800 combines the received pulses with pump-laser light and couples the combined light into the gain fiber 860. The pulses of light are further amplified while traveling through the gain fiber 860. The gain fiber 860 (or one or more optical components coupled to an output end of the gain fiber 860, such as for example, a filter, isolator, or a cladding power stripper) may be terminated at an output collimator 340 which produces a collimated free-space output beam 125. The free-space output beam 125 includes amplified optical pulses which may be sent to a scanner 120. In particular embodiments, an output collimator 340 may include or may be combined with one or more other optical components, such as for example, a filter, an isolator, or a cladding power stripper. As an example, the output collimator 340 in FIG. 19 may be an isolator/collimator assembly that includes an isolator together with a collimator.

In particular embodiments, a light source 110 of a lidar system 100 may include one or more pre-amplifier assemblies 700 or one or more booster-amplifier assemblies 800. In the example of FIG. 19, the light source 110 includes one pre-amplifier assembly 700 coupled to one booster-amplifier assembly 800, and the gain fiber 860 from the booster-amplifier assembly 800 is terminated at an output collimator 340 which produces a free-space output beam 125. In particular embodiments, a light source 110 may include one pre-amplifier assembly 700 coupled to two or more booster-amplifier assemblies 800. For example, a light source 110 may include three amplifier stages arranged in series: a pre-amplifier assembly 700 which is coupled to a first booster-amplifier assembly 800, which in turn is coupled to a second booster-amplifier assembly 800. The second booster-amplifier assembly 800 may be terminated at an output collimator 340 which produces a free-space output beam 125.

In particular embodiments, a free-space output beam 125 produced by a booster-amplifier assembly 800 may have one or more of the following optical characteristics: a wavelength between approximately 1400 nm and approximately 1600 nm; a pulse duration less than or equal to 100 nanoseconds; a duty cycle less than or equal to 10%; a pulse energy greater than or equal to 100 nanojoules; and a peak power greater than or equal to 100 watts. As an example, the optical pulses from the gain fiber 760 supplied to the booster-amplifier assembly 800 may have a pulse duration of approximately 4 ns, a pulse repetition frequency of approximately 600 kHz, and a pulse energy of approximately 0.1 µJ. The booster-amplifier assembly may further amplify the pulses to produce optical pulses in the free-space output beam 125 having a pulse duration of approximately 4 ns, a pulse repetition frequency of approximately 600 kHz, and a pulse energy of approximately 4 µJ (corresponding to a peak power of approximately 1,000 watts).

In particular embodiments, a pre-amplifier assembly 700 may include one or more optical components which are located remotely from or which are not attached to platform 705. Similarly, a booster-amplifier assembly 800 may include one or more optical components which are located remotely from or which are not attached to platform 805. As an example, seed laser diode 710 may not be attached to platform 705, and the light from seed laser diode 710 may be delivered to the platform 705 by an optical fiber. An end of the optical fiber may be attached to the platform 705, and the seed-laser lens 720 may be used to collect and collimate the seed-laser light emitted from the output face of the optical fiber. As another example, pump laser diode 730 may not be attached to platform 705, and the pump-laser light may be delivered to the platform 705 by optical fiber. An end of the optical fiber may be attached to the platform 705, and the pump-laser lens 740 may collect and collimate the pump-laser light emitted from the output face of the optical fiber. As another example, pump laser diode 830 may not be attached to platform 805, and the pump-laser light may be delivered to the platform 805 by optical fiber.

In particular embodiments, a pre-amplifier assembly 700 or a booster-amplifier assembly 800 may include a pump laser diode that produces pump light that co-propagates with input light that is amplified by the amplifier assembly. In the example of FIG. 15, light from pump laser diode 730 co-propagates along the gain fiber 760 with light from the seed laser diode 710 (e.g., the pump light propagates through the gain fiber 760 in the same direction as the seed-laser light). Similarly, in the example of FIG. 18, light from the pump laser diode 830 co-propagates along the gain fiber 860 with the light from input beam 814. In particular embodiments, a pre-amplifier assembly 700 or a booster-amplifier assembly 800 may include a pump laser diode that produces pump light that counter-propagates with respect to input light that is amplified by the amplifier assembly. As an example, a pre-amplifier assembly 700 may include a seed laser diode 710, a seed-laser lens 720, an optical isolator 722, a focusing lens 754, or an input end 768 of a gain fiber 760. The pre-amplifier assembly 700 may not include a pump laser diode 730, pump-laser lens 740, or combiner 750. The pump laser diode 730 may be located at an output end 808 of the gain fiber 760, and light from the pump laser diode 730 may be coupled into the output end 808 and may counter-propagate with respect to the seed-laser light (e.g., the pump light propagates in the opposite direction of the seed-laser light). As another example, a booster-amplifier assembly 800 may not include a pump laser diode 830, pump-laser lens 840, or combiner 850. The pump laser diode 830 may be located at an output end of the gain fiber 860, and light from the pump laser diode 830 may counter-propagate with respect to light from the input beam 814.

In particular embodiments, a pump laser diode for an amplifier assembly with counter-propagating pump light may be located at a subsequent amplifier assembly. As an example, a pre-amplifier assembly 700 may not include a pump laser diode 730 attached to a platform 705 of the pre-amplifier assembly. The pump laser diode 730 and pump-laser lens 740 may be attached to a platform 805 of a subsequent amplifier assembly (e.g., booster-amplifier assembly 800) that the output end 808 of gain fiber 760 is connected to, and light from the pump laser diode 730 may be coupled into the output end of the gain fiber 760. As an example, a combiner (similar to combiner 750 or combiner 850) may be configured to transmit the input beam 814 and reflect light from the pump laser diode 730. The pump-laser beam 734 may be reflected toward the output end 808, and the input-beam lens 820 may be configured to focus the pump-laser beam 734 into the gain fiber 760.

In particular embodiments, a pre-amplifier assembly 700 or a booster-amplifier assembly 800 may include a semiconductor optical amplifier (SOA). As an example, rather than using a gain fiber pumped by a pump laser diode, a free-space pre-amplifier assembly 700 may include a SOA configured to amplify light produced by a seed laser diode 710. A SOA may refer to an optical amplifier that uses a semiconductor device to provide an optical gain medium, and a SOA may be electrically pumped by supplying electrical current to the SOA. A SOA may have a structure that is similar to a laser diode and may include one or more semiconductor materials (e.g., InP, InGaAs, InGaAsP, or InAlGaAs) configured to act as an optical waveguide and provide optical gain. The waveguide may extend from a front facet to a back facet of a SOA and may guide light that is coupled into and amplified by the SOA. When electrical current is supplied to a SOA, the SOA may provide optical gain for input light that propagates along the SOA waveguide. For example, light from a seed laser (e.g., light at 1500-1600 nm wavelength) may be coupled into a SOA through a front facet, and the light may be amplified as it propagates from the front facet to the back facet.

In particular embodiments, the front facet or back facet of a SOA may include an AR coating to reduce the reflectivity of the facet so that the SOA acts as an optical amplifier rather than a laser. The waveguide of a SOA may be tilted or angled with respect to the front or back facet to further reduce the reflectivity of light at the facets (e.g., light propagating along the waveguide within a SOA that is reflected at a facet may not be coupled back into the waveguide due to the angled waveguide). In particular embodiments, the waveguide of a SOA may have a flared or tapered structure where the size of the waveguide increases towards the back facet of the SOA. The increase in waveguide size decreases the power density of the amplified light at the back facet which reduces the possibility of causing optical damage to the back facet. In particular embodiments, a SOA may have a length (e.g., a distance between the front and back facets) between approximately 100 µm and approximately 10 mm.

In particular embodiments, the electrical drive current supplied to a SOA may include DC current or pulsed current. As an example, a seed laser may produce optical pulses that are coupled into a SOA. The current supplied to the SOA may be a substantially constant DC current, or the current supplied to the SOA may be pulsed at a pulse frequency that matches the pulse repetition frequency of the seed laser (e.g., the SOA current is pulsed so that optical gain is only provided when a seed-laser pulse is present). As another example, a seed laser may produce CW light (e.g., non-pulsed light with a substantially constant output power), and the current supplied to the SOA may be pulsed to produce amplified optical pulses at the output of the SOA. When current is supplied to the SOA, the CW light may be amplified by the SOA, and when little or no current is supplied to the SOA, there may be no optical gain present, and the CW light may be absorbed by the SOA.

In particular embodiments, a free-space pre-amplifier assembly 700 with a SOA may include one or more of the following optical components: seed laser diode 710, seed-laser detector 716, seed-laser driver 718, seed-laser lens 720, optical isolator 722, optical filter 816, focusing lens 754, a SOA, and an output lens (e.g., to collect, collimate, or focus the amplified light produced by the SOA). For example, a seed-laser lens 720 may collect, collimate, or focus light emitted by the seed laser diode 710, and a focusing lens (e.g., similar to focusing lens 754 in FIG. 15) may focus the light from the seed laser diode 710 onto the front facet of a SOA. The light from the seed laser diode 710 may then be coupled into the SOA and amplified as it propagates along a waveguide within the SOA. The amplified light emitted from the back facet of the SOA may be received and collimated by an output lens to produce a collimated free-space output beam. The output lens, which may be similar to lens 820 in FIG. 18, may produce a collimated free-space beam that is sent to another amplifier stage (e.g., booster-amplifier assembly 800 illustrated in FIG. 18). A pre-amplifier assembly 700 with a SOA may include a filter (e.g., similar to filter 816 in FIG. 18) located after the SOA and configured to remove ASE from the output beam (e.g., ASE produced by the SOA). A pre-amplifier assembly 700 with a SOA may not include a pump laser diode, pump-laser lens, pump-laser detector, combiner, or gain fiber.

In particular embodiments, a pre-amplifier assembly 700 with a SOA may include one or more of the following optical components mechanically attached to a platform 705: a SOA, seed laser diode 710, seed-laser lens 720, optical isolator 722, filter 816, focusing lens 754, and an output lens. As an example, a light source 110 of a lidar system 100 may include a seed laser diode 710 that produces a free-space beam and a seed-laser lens 720 that collimates the seed-laser beam. The light source 110 may also include a focusing lens 754 that focuses the seed-laser beam into the waveguide of a SOA. In particular embodiments, a booster-amplifier assembly 800 may include a pre-amplifier assembly 700 with a SOA. As an example, a seed laser diode 710, seed-laser lens 720, focusing lens 754, or a SOA may be attached to a platform 805 of a booster-amplifier assembly 800. The amplified pulses emitted from the back facet of the SOA may be collimated by an input-beam lens 820 to produce a free-space input beam 814. The input beam 814 may be combined with light from a pump laser diode 830, and the combined beam 852 may be coupled into a gain fiber (e.g., similar to gain fiber 760 in FIG. 15 or gain fiber 860 in FIG. 18).

Figure 20:
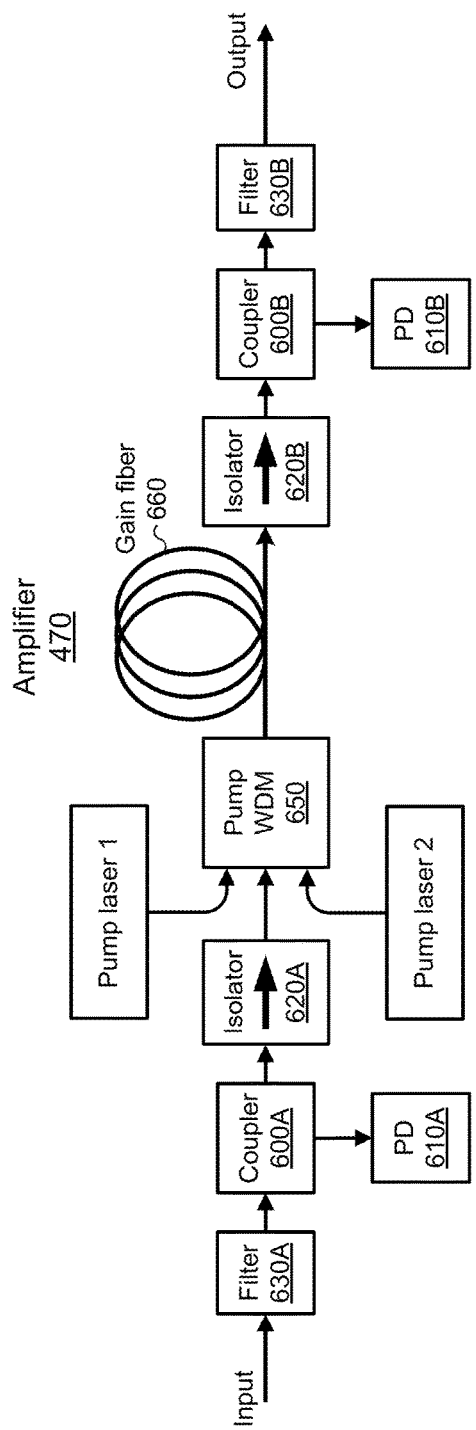
FIG. 20 illustrates an example fiber-optic amplifier with two pump laser diodes.

FIG. 20 illustrates an example fiber-optic amplifier 470 with two pump laser diodes (pump laser 1 and pump laser 2). The fiber-optic amplifier 470 illustrated in FIG. 20 may be part of a light source 110 of a lidar system 100. The fiber-optic amplifier 470 illustrated in FIG. 20 may be similar to the fiber-optic amplifier 470 illustrated in FIG. 13 or may include one or more fiber-optic components similar to those of amplifier 470 illustrated in FIG. 11, FIG. 13, or FIG. 14. As an example, filter 630A, coupler 600A, photodiode 610A, isolator 620A, or gain fiber 660 illustrated in FIG. 20 may be similar to the corresponding optical components in FIG. 13. Additionally, isolator 620B, coupler 600B, photodiode 610B, or filter 630B illustrated in FIG. 20 may be similar to the corresponding optical components in FIG. 13. The amplifier 470 in FIG. 20 may be a booster amplifier or a power amplifier, and the gain fiber 660 in FIG. 20 may be multi-clad gain fiber (e.g., similar to multi-clad gain fiber 860 in FIG. 18). The output of amplifier 470 in FIG. 20 may be coupled to another amplifier or may be coupled to an output collimator that produces a free-space output beam.

In particular embodiments, light from two or more pump lasers in a fiber-optic amplifier 470 may be combined together with input light using a pump WDM 650. In FIG. 20, after passing through the filter 630A, coupler 600A, and isolator 620A, the input light is combined with light from pump laser 1 and pump laser 2 by pump WDM 650. A pump WDM 650 may include a (N+1)×1 fiber-optic combiner which combines light from N pump lasers with an input signal and sends the combined pump-signal light to an output port (e.g., a fiber-optic cable that may be spliced to gain fiber 660). A (N+1)×1 fiber-optic combiner is a (N+2)-port fiber-optic device with N pump-input ports for N respective pump lasers, one signal-input port, and one output port. As an example, a (2+1)×1 combiner is a four-port device that combines input light (received at a first port) with light from two pump lasers (received at second and third ports, respectively), and sends the combined light out a fourth port (which may be coupled or spliced to gain fiber 660). As another example, a fiber-optic amplifier 470 may include three or four pump lasers which are combined with input light by a (3+1)×1 combiner or a (4+1)×1 combiner, respectively.

The pump WDM 650 in FIG. 20 is a (2+1)×1 combiner which combines light from the two pump lasers with the input light and sends the combined light to the gain fiber 660. Pump laser 1 and pump laser 2 may each propagate to the pump WDM 650 via a multi-mode fiber-optic cable, and the input signal may propagate along a single-mode fiber-optic cable. The output fiber-optic cable from a pump WDM 650 may be a multi-clad fiber where the input light propagates primarily along the core, and the pump light propagates primarily in a cladding layer. As an example, the output fiber-optic cable from a pump WDM 650 may be a double-clad fiber which is spliced to a double-clad gain fiber.

In particular embodiments, a fiber-optic amplifier 470 may include two or more pump lasers, and light from the two or more pump lasers may be co-propagating or counter-propagating with respect to input light that is amplified by the amplifier 470. As an example, a pump WDM 650 may be located at an output end of gain fiber 660, and light from two or more pump lasers may counter-propagate along the gain fiber 660 with respect to the input light. In FIG. 20, light from the two pump lasers (pump laser 1 and pump laser 2) co-propagates along the gain fiber 660 with the input light. In particular embodiments, a fiber-optic amplifier 470 may include one or more co-propagating pump lasers and one or more counter-propagating pump lasers. The fiber-optic amplifier in FIG. 13 includes a co-propagating pump laser 640A and a WDM 650A located at an input end of gain fiber 660 and a counter-propagating pump laser 640B and a WDM 650B located at an output end of gain fiber 660. If pump laser 640A and pump laser 640B operate at different wavelengths, then a spectral filter may be used to prevent residual or back-reflected light from one pump laser from damaging or destabilizing the other pump laser. For example, if pump laser 640A operates at 920 nm and pump laser 640B operates at 950 nm, then the light from pump laser 640A may be transmitted through a filter that transmits 920-nm light and blocks the residual 950-nm light from pump laser 640B. Similarly, the light from pump laser 640B may be transmitted through a filter that transmits 950-nm light and blocks 920-nm light.

Figure 21:
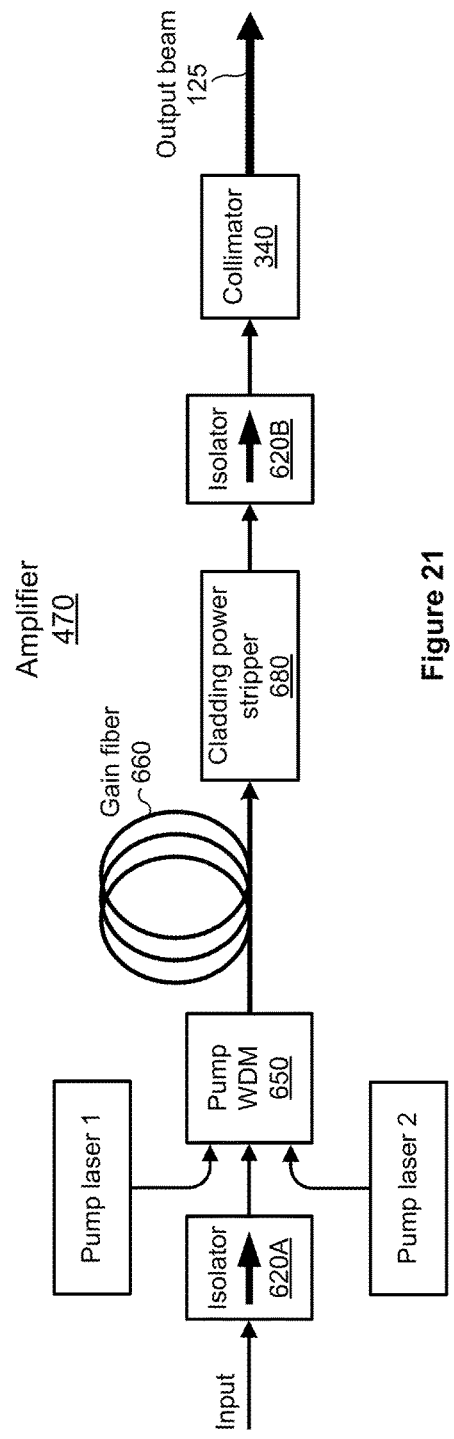
FIG. 21 illustrates an example fiber-optic booster amplifier with two pump laser diodes.

FIG. 21 illustrates an example fiber-optic booster amplifier 470 with two pump laser diodes (pump laser 1 and pump laser 2). The booster amplifier 470 in FIG. 21 may be part of a light source 110 of a lidar system 100, and the output beam 125 may be sent to a scanner 120 of the lidar system 100. The booster amplifier 470 illustrated in FIG. 21 may be similar to the booster amplifier 470 illustrated in FIG. 14 or may include one or more fiber-optic components similar to those of amplifier 470 illustrated in FIG. 11, FIG. 13, FIG. 14, or FIG. 20. As an example, isolator 620A, gain fiber 660, or isolator 620B in FIG. 21 may be similar to the corresponding optical components in FIG. 13 or FIG. 20. The cladding power stripper 680 or collimator 340 in FIG. 21 may be similar to the corresponding optical components in FIG. 14. The pump WDM 650 in FIG. 21 may be a (2+1)×1 fiber-optic combiner similar to the pump WDM 650 in FIG. 20.

In FIG. 20 or FIG. 21, the input light may include optical pulses received from a previous amplifier stage or from a seed laser. As an example, the input light may include pulses of light having a wavelength between approximately 1400 nanometers and approximately 1600 nanometers, a pulse duration less than or equal to 100 nanoseconds, or a duty cycle less than or equal to 10%. In FIG. 21, the amplifier 470 is terminated at output collimator 340, and the output collimator 340 may produce a free-space output beam 125 that includes amplified optical pulses. Pump laser 1 or pump laser 2 in FIG. 20 or FIG. 21 may each be similar to pump laser 640 in FIG. 11 or FIG. 14 or may be similar to pump laser 640A or 640B in FIG. 13. As an example, pump laser 1 and pump laser 2 may each be a fiber-coupled laser diode with an operating wavelength between approximately 900 nm and 1000 nm. Additionally, pump laser 1 and pump laser 2 may each be configured to produce any suitable amount of average optical pump power, such as for example, approximately 100 mW, 500 mW, 1 W, 2 W, 5 W, 10 W, 15 W, or 20 W of pump power.

Figure 22:
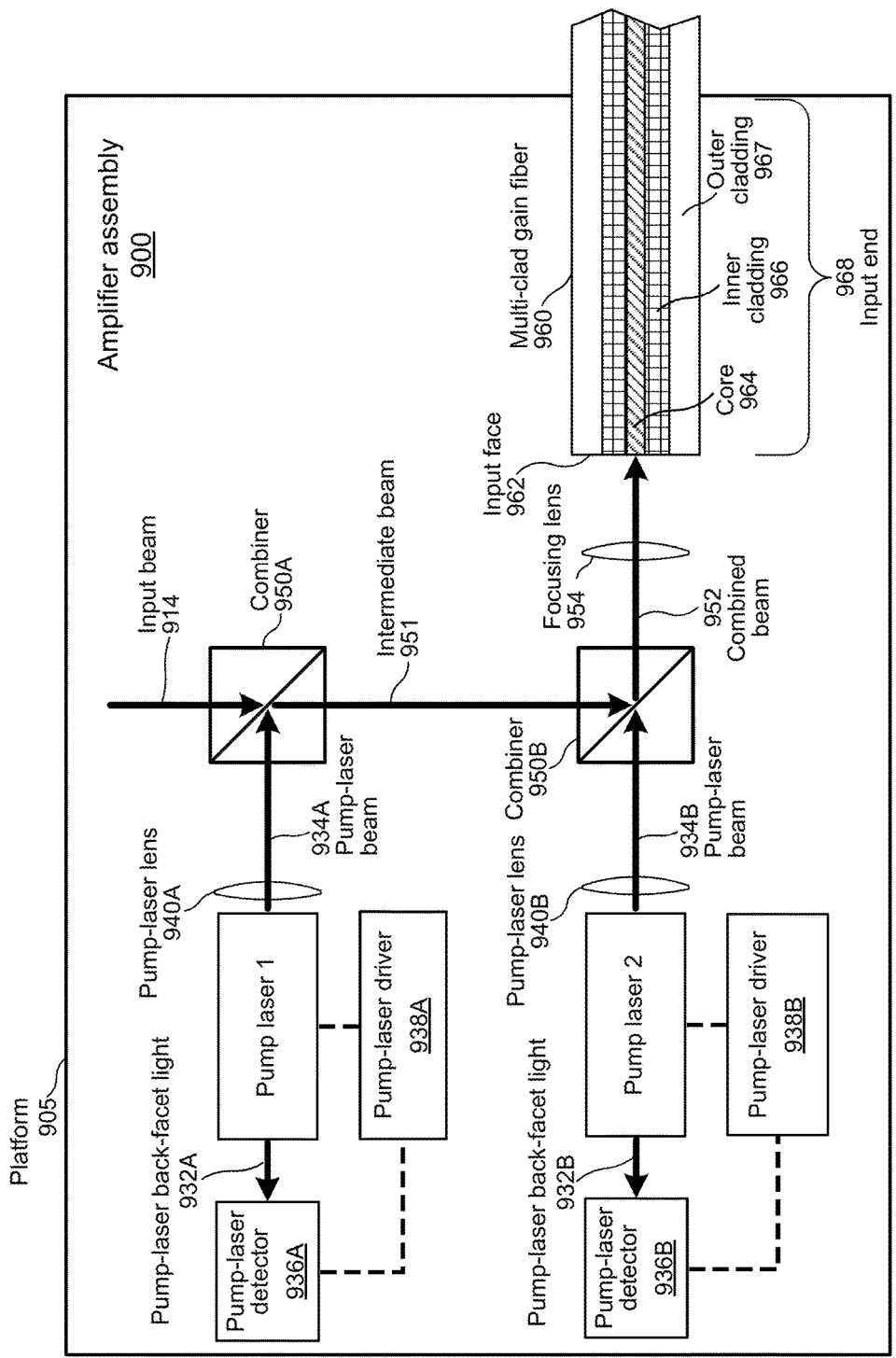
FIG. 22 illustrates a top view of an example free-space amplifier assembly with two pump laser diodes.

FIG. 22 illustrates a top view of an example free-space amplifier assembly 900 with two pump laser diodes (pump laser 1 and pump laser 2). The free-space amplifier assembly 900 in FIG. 22 may be part of a light source 110 of a lidar system 100. In particular embodiments, a free-space amplifier assembly 900 may include two or more pump laser diodes. The amplifier assembly 900 in FIG. 22 includes two pump laser diodes which are combined with input beam 914, and then the combined free-space beam 952 is coupled into a multi-clad gain fiber 960. The multi-clad gain fiber 960 may include gain material (e.g., rare-earth dopants) that absorbs the pump light from the two pump laser diodes and provides optical gain for the light from input beam 914. The free-space amplifier assembly 900 illustrated in FIG. 22 may be similar to the free-space booster-amplifier assembly 800 in FIG. 18 or may include one or more free-space optical components similar to those of amplifier assembly 700 in FIG. 15 or amplifier assembly 800 in FIG. 18. In particular embodiments, the fiber-optic amplifier 470 in FIG. 20 or FIG. 21 or the free-space amplifier assembly 900 in FIG. 22 may each be referred to as an optical amplifier with multi-wavelength pumping or an optical amplifier with multiple pump lasers.

The free-space input beam 914 in FIG. 22 may include pulses of light having one or more wavelengths between approximately 1400 nm and approximately 1600 nm, a pulse duration less than or equal to 100 nanoseconds, or a duty cycle less than or equal to 10%. In particular embodiments, free-space input beam 914 may be supplied to amplifier assembly 900 by a seed laser diode or by a gain fiber from a previous amplifier stage. As an example, an amplifier assembly 900 may include a free-space seed laser diode (e.g., similar to seed laser diode 710 in FIG. 15) configured to supply the free-space input beam 914. The amplifier assembly 900 may also include a lens (e.g., similar to seed-laser lens 720 in FIG. 15) configured to collimate or focus the input beam 914. As another example, an amplifier assembly 900 may include a fiber-coupled seed laser diode (e.g., similar to laser diode 440 in FIG. 8). An output end of a fiber-optic cable from the fiber-coupled seed laser diode may be attached to the platform 905 and may supply the free-space input beam 914. As another example, the output end of a gain fiber (e.g., similar to output end 808 of gain fiber 760 in FIG. 18) may be attached to the platform 905 and may supply the free-space input beam 914. The amplifier assembly 900 may also include a lens (similar to input-beam lens 820 in FIG. 18) configured to collimate or focus the input beam 914.

Pump laser 1 or pump laser 2 in FIG. 22 may each be similar to pump laser diode 730 in FIG. 15 or pump laser diode 830 in FIG. 18. As an example, pump laser 1 and pump laser 2 may each be a free-space pump laser diode with an operating wavelength between approximately 900 nm and 1000 nm. Additionally, pump laser 1 and pump laser 2 may be configured to produce free-space pump-laser beam 934A and free-space pump-laser beam 934B, respectively, each beam having any suitable amount of average optical pump power, such as for example, approximately 100 mW, 500 mW, 1 W, 2 W, 5 W, 10 W, 15 W, or 20 W of pump power. In FIG. 22, pump-laser lens 940A (which is configured to collimate or focus the light emitted by pump laser 1) and pump-laser lens 940B (which is configured to collimate or focus the light emitted by pump laser 2) may each be similar to pump-laser lens 740 in FIG. 15 or pump-laser lens 840 in FIG. 18.

In particular embodiments, an amplifier assembly 900 may include one or more pump-laser drivers (which may be similar to pump-laser driver 738 in FIG. 15 or pump-laser driver 838 in FIG. 18). In FIG. 22, pump-laser driver 938A supplies drive current to pump laser 1, and pump-laser driver 938B supplies drive current to pump laser 2. In particular embodiments, an amplifier assembly 900 may include one or more pump-laser detectors (which may be similar to pump-laser detector 736 in FIG. 15). In FIG. 22, pump laser 1 may emit pump-laser back-facet light 932A which may be detected by a pump-laser detector 936A, and the pump-laser detector 936A may send an electrical signal corresponding to the detected light to pump-laser driver 938A. Similarly, pump laser 2 may emit pump-laser back-facet light 932B which may be detected by a pump-laser detector 936B, and the pump-laser detector 936B may send an electrical signal corresponding to the detected light to pump-laser driver 938B.

In particular embodiments, an amplifier assembly 900 may include two or more beam combiners (which may be similar to combiner 750 in FIG. 15 or combiner 850 in FIG. 18). In FIG. 22, combiner 950A combines the input beam 914 with the pump-laser beam 934A to produce an intermediate beam 951. The input beam 914 and the pump-laser beam 934A may be collimated free-space beams, and the intermediate beam 951 may include the input beam 914 and the pump-laser beam 934A overlapped so that they are substantially coaxial or coaligned. In FIG. 22, combiner 950B combines the intermediate beam 951 with the pump-laser beam 934B to produce the combined free-space beam 952. The combined beam 952 may include three free-space beams (input beam 914, pump-laser beam 934A, and pump-laser beam 934B) overlapped so that they are substantially coaxial or coaligned. The combined beam 952 is focused into the multi-clad gain fiber 960 by the focusing lens 954.

In particular embodiments, combiner 950A or combiner 950B may each be a dichroic beam splitter cube or a dichroic beam splitter plate. As an example, combiner 950A may be a dichroic beam splitter cube configured to transmit the input beam 914 (e.g., light with a 1500-1600 nm wavelength) and reflect the pump-laser beam 934A (e.g., light with a 900-1000 nm wavelength). As another example, combiner 950B may be a dichroic beam splitter cube configured to transmit the pump-laser beam 934B and reflect the intermediate beam 951. For example, if input beam 914 has a wavelength of 1540-1560 nm, pump-laser beam 934A has a wavelength of 940-990 nm, and pump-laser beam 934B has a wavelength of 900-940 nm, then combiner 950B may transmit light at 900-940 nm and may reflect light at 940-990 nm and 1540-1560 nm.

In particular embodiments, combiner 950A or combiner 950B may each be configured to reflect or transmit light at any suitable wavelength. As an example, in FIG. 22, combiner 950A is configured to transmit the input beam 914 (which may include light having a wavelength within the 1500-1600 nm range) and reflect the pump-laser beam 934A (which may include light have a wavelength within the 900-1000 nm range). As another example, combiner 950A may be configured to transmit the pump-laser beam 934A and reflect the input beam 914. As another example, combiner 950B may be configured to transmit the pump-laser beam 934B and reflect the intermediate beam 951 (as illustrated in FIG. 22), or combiner 950B may be configured to transmit the intermediate beam 951 and reflect the pump-laser beam 934B.

In particular embodiments, input beam 914, pump-laser beam 934A, and pump-laser beam 934B may have any suitable arrangement or may be combined in any suitable order. In the example of FIG. 22, the input beam 914 is first combined with the pump-laser beam 934A, and then the intermediate beam 951 (which includes the input beam 914 and the pump-laser beam 934A) is combined with the pump-laser beam 934B. As another example, pump-laser beams 934A and 934B may first be combined together (e.g., using a combiner that transmits light at 900-940 nm and reflects light at 940-990 nm, or vice versa), and then the combined pump-laser beams may be combined with input beam 914 (e.g., using a combiner that transmits light at 900-990 nm and reflects light at 1540-1560 nm, or vice versa).

In particular embodiments, combiner 950A or combiner 950B may be a polarizing optical element (which may be referred to as a polarization combiner), such as for example, a polarizing beam splitter (PBS) cube configured to combine two beams having orthogonal polarizations into a single output beam. As an example, in FIG. 22, the input beam 914 may be horizontally polarized, and the pump-laser beam 934A may be vertically polarized. Combiner 950A may be a PBS cube that transmits the horizontally polarized input beam 914 and reflects the vertically polarized pump-laser beam 934A. As another example, in FIG. 22, the input beam 914 and the pump-laser beam 934A may both be vertically polarized, and the pump-laser beam 934B may be horizontally polarized. Combiner 950A may be a dichroic beam splitter cube, and combiner 950B may be a PBS cube that reflects the vertically polarized input beam 914 and pump-laser beam 934A and transmits the horizontally polarized pump-laser beam 934B. As another example, if pump-laser beams 934A and 934B are first combined together, they may be combined together using a PBS cube. Pump laser diode 1 may be configured to produce a vertically polarized pump-laser beam 934A, and pump laser diode 2 may be configured to produce a horizontally polarized pump-laser beam 934B. For example, pump laser diode 2 may be mechanically mounted at 90 degrees with respect to pump laser diode 1 so that the polarizations of pump-laser beams 934A and 934B are orthogonal. As another example, pump-laser beam 934B may be sent through a half-wave plate to rotate the polarization of the pump-laser beam 934B by 90 degrees with respect to pump-laser beam 934A. A first combiner may be a polarization combiner (e.g., a PBS cube) that combines the two orthogonally polarized pump beams, and a second combiner may be a dichroic beam splitter cube that combines the two 900-1000 nm pump beams with a 1500-1600 nm input beam 914 (e.g., the dichroic beam splitter may reflect light at 900-1000 nm and transmit light at 1500-1600 nm, or vice versa). If the pump-laser beams 934A and 934B are combined based on their orthogonal polarizations (and not based on their different wavelengths, as with a dichroic beam splitter), then the pump laser diode 1 and pump laser diode 2 may operate at substantially the same wavelength (e.g., 940 nm±4 nm).

In particular embodiments, an amplifier assembly 900 may include a multi-clad gain fiber 960 (which may include a core 964, inner cladding 966 nm, and outer cladding 967), and the input end 968 of the multi-clad gain fiber 960 may be attached to platform 905. The multi-clad gain fiber 960 illustrated in FIG. 22 may be similar to the multi-clad gain fiber 860 in FIG. 18. The multi-clad gain fiber 960 may be an erbium-doped gain fiber or an erbium/ytterbium-doped gain fiber. The multi-clad gain fiber 960 may have an all-glass design where the core 964 is made from glass doped with a gain material, and the inner cladding 966 and outer cladding 967 are each made from a glass material (e.g., silica glass doped with a material to alter the refractive index). The focusing lens 954 may focus the combined beam 952 onto the input face 962 of the gain fiber 960, and the focused beam may be coupled into the gain fiber 960 through the input face 962. The light from the input beam 914 that is coupled into the multi-clad gain fiber 960 may be guided (as a single-mode or multi-mode beam) by the core 964, and the light from pump-laser beams 934A and 934B may be guided (as multi-mode beams) by the inner cladding 966. The core 964 or a portion of the inner cladding 966 around the core may be doped with gain material (e.g., rare-earth dopants) which absorbs the light from the pump-laser beams 934A and 934B and provides gain for the light from the input beam 914.

In particular embodiments, amplifier assembly 900 may include one or more optical components similar to optical isolator 722, optical isolator 822, filter 816, or beam pick-off 824 and input-beam detector 826, as described herein. As an example, input beam 914 may pass through an optical isolator, filter, or a beam pick-off (which sends a portion of input beam 914 to an input-beam detector). As another example, pump-laser beam 934 or pump-laser beam 934B may pass through an optical isolator or filter.

In particular embodiments, an amplifier assembly 800 may include a platform 905 (which may be similar to platform 705 or platform 805 described and illustrated herein) where one or more optical components are mechanically attached to the platform 905. In the example of FIG. 22, one or more of the following free-space optical components may be mechanically attached to the platform 905: pump laser 1, pump laser 2, pump-laser lens 940A, pump laser lens 940B, combiner 950A, combiner 950B, focusing lens 954, and the input end 968 of the multi-clad gain fiber 960. Additionally, any other suitable optical component (e.g., an isolator, filter, or beam pick-off) or an optical assembly (e.g., a combination of two or more optical components) may be attached to a platform 905.

In particular embodiments, one or more optical components may be mechanically attached to a platform 905 by any suitable attachment technique, such as for example, by bonding with an adhesive or epoxy, welding, brazing, soldering, mechanical fastening, or any suitable combination thereof. In particular embodiments, one or more optical components may be directly or indirectly attached to a platform 905. In particular embodiments, an active-alignment technique or a passive-alignment technique may be used to position and attach any suitable optical component to a platform 905. As an example, all the optical components in an amplifier assembly 900 may be actively aligned, all the optical components may be passively aligned, or a combination of active and passive alignment techniques may be used in attaching optical components to a platform 905. In particular embodiments, a platform 905 may be made from or may include any suitable material, such as for example, glass, a ceramic material, a semiconductor material, metal, carbon fiber, or any suitable combination thereof. As an example, the material for a platform 905 may be selected to have a relatively low CTE or a relatively high thermal conductivity.

In particular embodiments, an amplifier assembly may include two or more pump lasers. As an example, a fiber-optic amplifier with multiple pump lasers (e.g., similar to amplifier 470 in FIG. 20 or FIG. 21) may include three pump lasers which are combined with input light by a (3+1)×1 combiner. Each pump laser may have approximately the same operating wavelength, or two or more of the pump lasers may have different operating wavelengths. As another example, a free-space amplifier with multiple pump lasers (e.g., similar to amplifier assembly 900 in FIG. 22) may include three pump lasers which are combined with an input beam 914 using three combiners (similar to combiner 950A or 950B in FIG. 22). In particular embodiments, an amplifier that includes two or more pump lasers may provide higher pump power to a gain fiber (as compared to an amplifier with a single pump laser), may provide redundant pump-laser sources in case one of the pump lasers fails, or may allow the pump lasers to operate at lower power levels (which may extend the lifetime of the pump lasers).

In particular embodiments, a free-space amplifier assembly 900 may include two or more pump lasers that produce co-propagating or counter-propagating pump light. As an example, pump laser 1 and pump laser 2 may be configured as counter-propagating pump lasers. A platform 905 of amplifier assembly 900 may include a focusing lens and an input end 968 of gain fiber 960. For example, a seed laser diode 710 and a SOA may be attached to platform 905 of amplifier assembly 900 and may be configured to produce input beam 914 which is focused into the input end 968 of gain fiber 960 by a focusing lens 954. Pump laser 1, pump-laser lens 940A, combiner 950A, pump laser 2, pump-laser lens 940B, or combiner 950B may be located at an output end of gain fiber 960. Pump laser 1 and pump laser 2 may be located at an output end of gain fiber 960, and the light from pump laser 1 and pump laser 2 may counter-propagate with respect to the light from input beam 914 that propagates along the gain fiber 960. In the example of FIG. 22, pump laser 1 and pump laser 2 are configured to co-propagate with the light from input beam 914. In particular embodiments, a free-space amplifier assembly 900 with multiple pump lasers may include one or more co-propagating pump lasers and one or more counter-propagating pump lasers. For example, pump laser 1, pump-laser lens 940A, and combiner 950A may be attached to platform 905 along with the input end 968 of gain fiber 960, and pump laser 2, pump-laser lens 940B, and combiner 950B may be located at an output end of gain fiber 960. In particular embodiments, if pump laser 1 and pump laser 2 operate at different wavelengths, then a spectral filter may be used to prevent residual or back-reflected light from one pump laser from damaging or destabilizing the other pump laser. For example, if pump laser 1 operates at 920 nm and pump laser 2 operates at 950 nm, then the light from pump laser 1 may be transmitted through a filter that transmits 920-nm light and blocks the residual 950-nm light from pump laser 2. Similarly, the light from pump laser 2 may be transmitted through a filter that transmits 950-nm light and blocks 920-nm light.

Figure 23:
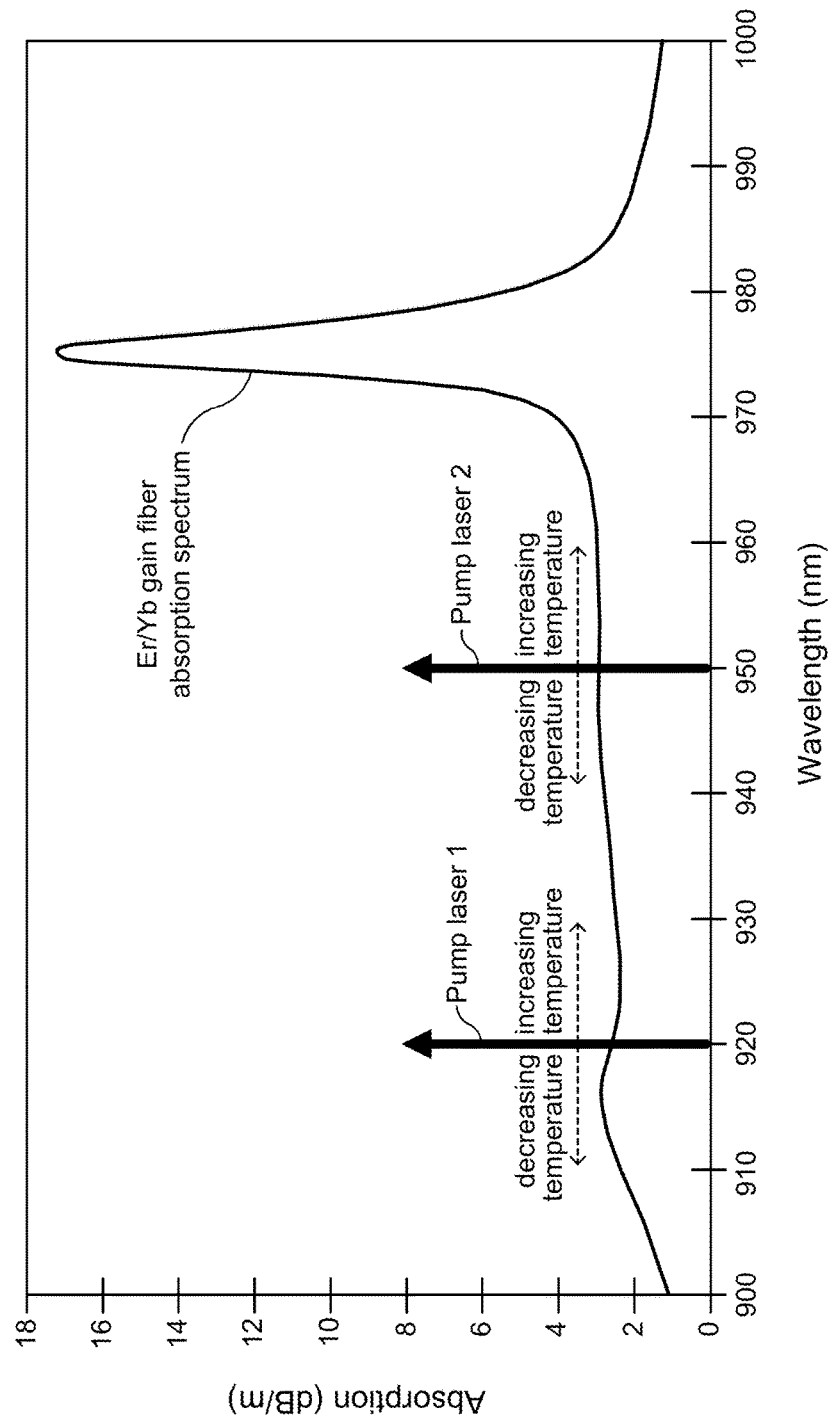
FIG. 23 illustrates an example absorption spectrum for an erbium/ytterbium gain fiber.

FIG. 23 illustrates an example absorption spectrum for an erbium/ytterbium gain fiber. The absorption spectrum represents the wavelength dependence of the absorption of pump light, in units of dB per meter of erbium/ytterbium gain fiber. For example, light from a 925-nm pump laser may experience an absorption of approximately 2.5 dB/m while propagating through a gain fiber (e.g., gain fiber 660, gain fiber 760, gain fiber 860, or gain fiber 960), and light from a 976-nm pump laser may experience an absorption of approximately 17 dB/m. As another example, light from a pump laser with a 940-nm operating wavelength may experience an absorption of approximately 3 dB/m, and for a 3.33-meter length of gain fiber, the total absorption at 940 nm is approximately 10 dB (e.g., approximately 90% of the pump light is absorbed while propagating through a 3.33-meter gain fiber). The absorption spectrum in FIG. 23 has a relatively small absorption peak around 915 nm, a relatively large absorption peak around 976 nm, and a region between 920 nm and 970 nm with some moderate variation in absorption.

In particular embodiments, a gain fiber with an absorption that varies with wavelength (e.g., an absorption spectrum similar to that illustrated in FIG. 23) may be configured to receive pump light from two or more pump lasers (e.g., pump laser 1 and pump laser 2 illustrated in FIG. 20, FIG. 21, or FIG. 22) and provide optical gain for an optical signal propagating through the gain fiber. The pump lasers may each produce pump light with a wavelength between approximately 900 nm and approximately 1000 nm, and the optical signal that is amplified may have a wavelength between approximately 1400 nm and approximately 1600 nm. In FIG. 23, pump laser 1 has an operating wavelength of approximately 920 nm, and pump laser 2 has an operating wavelength of approximately 950 nm. The light from pump laser 1 and pump laser 2 may be combined together, and the combined 920-nm/950-nm pump-laser light may be coupled into a gain fiber to provide optical gain for a 1500-1600 nm optical signal (e.g., pulses of light at approximately 1550 nm).

In particular embodiments, an optical amplifier may include a first pump laser diode configured to produce pump light having a first amount of optical power at a first wavelength and a second pump laser diode configured to produce pump light having a second amount of optical power at a second wavelength. The two pump lasers may operate at different wavelengths or may operate at approximately the same wavelength. In particular embodiments, two pump lasers which operate at different wavelengths may refer to two pump lasers having operating wavelengths at a particular operating temperature (e.g., 25° C.) that differ by greater than or equal to any suitable amount, such as for example, 5 nm, 10 nm, 20 nm, 30 nm, 40 nm, 50 nm, or 80 nm. As an example, two pump lasers having different wavelengths may refer to pump laser 1 producing 930-nm light at a 25° C. operating temperature and pump laser 2 producing 940-nm light at 25° C. (which corresponds to a 10-nm wavelength difference). As the temperature changes, the wavelengths of the two pump lasers may shift, and the wavelength difference between the pump-laser wavelengths may remain approximately constant. As an example, at 25° C., pump laser 1 may produce light at 920 nm, and pump laser 2 may produce light at 940 nm (corresponding to a 20-nm wavelength difference). If the temperature changes to 70° C., the wavelength of pump laser 1 may shift to approximately 935 nm, and the wavelength of pump laser 2 may shift to approximately 955 nm (which still corresponds to a 20-nm wavelength difference). In particular embodiments, two pump lasers which operate at the same wavelength may refer to two pump lasers having operating wavelengths at a particular operating temperature that differ by less than or equal to any suitable amount (e.g., less than or equal to 1 nm, 2 nm, 4 nm, or 8 nm). As an example, two pump lasers having approximately the same operating wavelength may refer to each pump laser producing light between approximately 938 nm and approximately 942 nm when operating at a particular temperature (e.g., 25° C.).

In particular embodiments, the operating wavelengths of the pump lasers in an optical amplifier with multiple pump lasers may be approximately the same. As an example, in FIG. 20, FIG. 21, or FIG. 22, pump laser 1 and pump laser 2 may operate at approximately the same wavelength (e.g., 940 nm±2 nm). In particular embodiments, the operating wavelengths of the pump lasers in an optical amplifier with multiple pump lasers may be different. As an example, in FIG. 20, FIG. 21, or FIG. 22, pump laser 1 and pump laser 2 may operate at different wavelengths. For example, pump laser 1 may produce pump light at a wavelength between approximately 900 nm and approximately 940 nm, and pump laser 2 may produce pump light between approximately 940 nm and approximately 990 nm. As another example, pump laser 1 may produce light at approximately 920 nm, and pump laser 2 may produce light at approximately 950 nm (as illustrated in FIG. 23). In particular embodiments, two or more pump lasers in an optical amplifier may operate in two or more corresponding wavelength ranges which may be non-overlapping or overlapping. As an example, pump laser 1 may operate in a 900 nm to 940 nm wavelength range, and pump laser 2 may operate in a non-overlapping wavelength range of 940 nm to 990 nm. As the temperature of pump laser 1 changes, the operating wavelength of pump laser 1 may shift within the 900-940 nm wavelength range. Similarly, as the temperature of pump laser 2 changes, the operating wavelength of pump laser 2 may shift within the 940-900 nm wavelength range. As another example, pump laser 1 may operate in a 900 nm to 950 nm wavelength range, and pump laser 2 may operate in an overlapping wavelength range of 940 nm to 990 nm. As the temperature changes, the wavelength of pump laser 1 may shift within the 900-950 nm wavelength range, and the wavelength of pump laser 2 may shift within the 940-990 nm wavelength range.

In particular embodiments, an optical amplifier, a light source 110, or a lidar system 100 may include a controller configured to adjust the amount of optical power produced by pump laser 1 and pump laser 2. Adjusting the amount of optical power produced by a pump laser may include adjusting the electrical current supplied to the pump laser. As an example, lidar system 100 may include a controller 150 which may control the amount of electrical current supplied to pump laser 1 and pump laser 2. In FIG. 22, a controller may be coupled to pump-laser driver 938A and may send an electrical signal to the pump-laser driver 938A to set or adjust the electrical current that is supplied to pump laser 1. Similarly, a controller may be coupled to pump-laser driver 938B and may send an electrical signal to the pump-laser driver 938B to set or adjust the electrical current that is supplied to pump laser 2. In particular embodiments, the output power of a pump laser may vary with the electrical current supplied to the pump laser. As an example, the output power and electrical current may be positively correlated so that an increase in electrical current results in an increase in output power. For example, pump laser 1 may produce approximately 5 W of output power with a 7-amp electrical current, and pump laser 1 may produce approximately 10 W of output power with a 12-amp electrical current.

In particular embodiments, the amount of optical power produced by pump laser 1 or pump laser 2 may be adjusted to any suitable value between approximately 0 watts and approximately 20 watts. As an example, the electrical current supplied to pump laser 1 may be adjusted so that the amount of optical power produced by pump laser 1 may be varied between 0 watts and any suitable maximum operating power, such as for example, a maximum operating power of approximately 1 W, 2 W, 5 W, 10 W, 15 W, or 20 W. Similarly, the electrical current supplied to pump laser 2 may be adjusted so that the amount of optical power produced by pump laser 2 may be varied between 0 watts and approximately 1 W, 2 W, 5 W, 10 W, 15 W, 20 W, or any other suitable maximum operating power. The electrical currents supplied to pump laser 1 and pump laser 2 may be independently adjusted so that the amount of optical power produced by each pump laser is also independently adjustable. The electrical current supplied to pump laser 1 or pump laser 2 may be adjustable between any suitable values, such as for example, between a minimum current of 0 amperes (or, 0 amps) and a maximum current of approximately 1 amp, 2 amps, 5 amps, 10 amps, 15 amps, or 20 amps.

In particular embodiments, the wavelength of light produced by a pump laser diode may vary with temperature by between approximately +0.1 nanometers per degree Celsius (nm/° C.) and approximately +0.5 nm/° C. As an example, the operating wavelength of pump laser 1 or pump laser 2 may vary with a temperature change of the pump laser by approximately +0.3 nm/° C. If pump laser 1 operates at approximately 920 nm at 25° C., then the wavelength of pump laser 1 may shift to approximately 923 nm if the temperature of pump laser 1 increases by 10° C. to 35° C. If pump laser 2 operates at approximately 950 nm at 25° C., then the wavelength of pump laser 2 may shift to approximately 944 nm if the temperature of pump laser 2 decreases by 20° C. to 5° C. The temperature-dependent wavelength shifts of pump laser 1 and pump laser 2 are illustrated by the dashed arrows in FIG. 23. If the temperature decreases, then the wavelengths of pump laser 1 and pump laser 2 shift to shorter wavelengths. If the temperature increases, then the wavelengths of pump laser 1 and pump laser 2 shift to longer wavelengths.

In particular embodiments, a pump laser diode of an optical amplifier may be passively cooled by being thermally coupled to a heat sink. Passive cooling may refer to dissipation of heat from a pump laser diode by thermal contact with a heat sink and without the use of an active temperature-stabilization component (e.g., a TEC). As an example, pump laser 1 or pump laser 2 in FIG. 20, FIG. 21, or FIG. 22 may be in thermal contact with a heat sink, and pump laser 1 or pump laser 2 may not include or may not be mounted on a TEC. With passive cooling, the operating temperature of pump laser 1 or pump laser 2 may not be stabilized to a fixed value, and as the ambient temperature of the amplifier, light source 110, or lidar system 100 changes, the operating temperature of pump laser 1 or pump laser 2 may also change. To dissipate heat produced by a pump laser diode, the pump laser diode may be in thermal contact with a heat sink that receives heat from the pump laser diode. As an example, pump laser 1 or pump laser 2 in FIG. 20 or FIG. 21 may be packaged in a metal case that is in thermal contact with a heat sink, such as for example, a part of amplifier 470, light source 110, or lidar system 100 that conducts or dissipates heat (e.g., a thermal mass, a metal block, a metal panel, a heat pipe, a heat spreader, a heat sink, or a fan). As another example, pump laser 1 or pump laser 2 in FIG. 22 may be mechanically attached to and in thermal contact with platform 905. The platform 905 may be made from a material with a relatively high thermal conductivity, and excess heat produced by pump laser 1 or pump laser 2 may flow into the platform 905. Additionally, the platform 905 may be in thermal contact with a heat sink or thermally conductive object that receives or dissipates heat from the platform 905.

In particular embodiments, passive cooling of a pump laser diode may refer to dissipation of heat from a pump laser diode by thermal contact with a heat sink where the pump laser diode is not directly coupled to an active temperature-stabilization component. As an example, a pump laser diode may be mounted to and may be directly thermally coupled to a chip carrier which in turn is attached to and thermally coupled to a platform (e.g., platform 705, platform 805, or platform 905). The platform may receive excess heat from the pump laser diode through the chip carrier. The platform may be thermally coupled to a heat sink (e.g., a thermal mass, a metal block, a metal panel, a heat pipe, a heat spreader, or a fan) that receives or dissipates excess heat from the platform (including heat from the pump laser diode). In particular embodiments, a platform may be thermally coupled to an active temperature-stabilization component. For example, platform 905 may be attached or coupled to a TEC which operates to maintain the platform 905 at a substantially constant temperature. The pump lasers attached to the platform 905 may be passively cooled by being thermally coupled to the platform 905, and the TEC may be used to remove excess heat from the platform 905 or to maintain the platform 905 at a substantially constant temperature. As another example, platform 905 may be attached or coupled to a TEC which is activated if a temperature reaches, exceeds, or goes below a particular threshold temperature (e.g., −20° C., −10° C., 0° C., 30° C., 40° C., 50° C., 60° C., or 70° C.). For example, if the temperature of platform 905 reaches or exceeds 45° C., then the TEC may be activated to keep the platform temperature at or below 45° C. Similarly, if the temperature of platform 905 reaches or goes below −10° C., then the TEC or a heating element may be activated to keep the platform temperature at or above −10° C.

In particular embodiments, the amount of optical power provided by each pump laser in an optical amplifier with multiple pump lasers may be adjusted based at least in part on an absorption spectrum of the optical gain fiber. For example, the amount of optical power provided by pump laser 1 and pump laser 2 in FIG. 20, FIG. 21, or FIG. 22 may be adjusted based on an absorption spectrum similar to that in FIG. 23. As illustrated in FIG. 23, an erbium/ytterbium gain fiber has a fairly broad absorption spectrum that varies with wavelength. Additionally, gain fiber from different manufacturers, different production batches of gain fiber, or different sections of gain fiber may exhibit variations in the absorption spectrum. For example, the absorption at 925 nm may vary between 2 dB/m and 3 dB/m for different erbium/ytterbium gain fibers. In particular embodiments, an absorption spectrum for a particular section of gain fiber may be characterized to account for absorption variation with wavelength as well as any batch-to-batch variations in the absorption spectrum. An optical amplifier that includes that particular section of gain fiber may be configured to adjust the optical power provided by each pump laser based at least in part on the particular absorption spectrum. Additionally, if the absorption spectrum changes or shifts with temperature, then the amount of optical power provided by each pump laser may be adjusted based on the temperature dependence of the pump-laser wavelengths or the temperature dependence of the absorption spectrum of the gain fiber.

In particular embodiments, the amount of optical power produced by pump laser 1 or pump laser 2 may be adjusted in response to a wavelength change of pump laser 1 or pump laser 2, where the wavelength change is associated with a change in the temperature of pump laser 1 or pump laser 2. As an example, if pump laser 1 and pump laser 2 are operating at 920 nm and 950 nm, respectively, a controller may set the current to the pump lasers so they both produce approximately the same output power (e.g., 5 watts). If the ambient temperature changes, then the wavelengths of pump laser 1 and pump laser 2 may shift (e.g., by approximately +0.3 nm/° C.), and the amount of absorption of the two pump lasers may change. The controller may adjust the output power of pump laser 1 or pump laser 2 based on the wavelength shifts and based on the absorption spectrum of the gain fiber. As an example, if the wavelength of pump laser 1 shifts to a part of the absorption spectrum with a lower absorption value, then the controller may decrease the amount of power produced by pump laser 1 or may increase the amount of power produced by pump laser 2. The power of pump laser 1 may be decreased since the lower absorption value of the pump-laser light corresponds to a reduction in the absorption efficiency of the gain fiber. Additionally, to compensate for the reduced absorption or power of pump laser 1, the power of pump laser 2 may be increased. As another example, if the wavelength of pump laser 1 shifts to a part of the absorption spectrum with an increased absorption value, then the controller may increase the amount of power produced by pump laser 1 or may decrease the amount of power produced by pump laser 2. The power of pump laser 1 may be increased since the increase in absorption represents an increase in the absorption efficiency of the gain fiber, and the power of pump laser 2 may be decreased to compensate for the increased absorption or power of pump laser 1.

In particular embodiments, pumping a gain fiber with multiple pump lasers operating at multiple wavelengths may be used to mitigate the effects of pump-laser wavelength drift associated with temperature changes. Rather than actively stabilizing the temperature of the pump lasers (e.g., using a TEC) to keep the operating wavelengths substantially fixed, the pump lasers may be passively cooled (and their wavelengths may be allowed to shift with temperature), which may simplify the design or complexity of an optical amplifier or reduce its cost or power consumption. As the temperature changes and the pump-laser wavelengths shift (e.g., by approximately +0.3 nm/° C.), a controller may dynamically adjust the power of the pump lasers, based at least in part on the absorption spectrum of the gain fiber, to optimize the pumping of the gain fiber. Each pump laser may be configured to produce up to approximately 12 watts, and in most operating conditions, the pump lasers may be operated below such a maximum operating power value. By operating the pump lasers at reduced output powers (and correspondingly reduced electrical currents), the pump lasers may operate in a more efficient manner and may produce less excess waste heat. Additionally, the lifetime of the pump lasers may be extended since they are being operated below a maximum operating power or current. By operating the pump lasers at reduced output power and adjusting the output power of each of the pump lasers, the performance or efficiency of an optical amplifier may be improved. Additionally, the pump lasers may be less susceptible to problems with thermal runaway in which a pump laser may be damaged or its performance may degrade if the temperature increases.

In particular embodiments, an optical amplifier may include one or more temperature sensors configured to measure a temperature of pump laser 1, a temperature of pump laser 2, a temperature of the optical amplifier, or a temperature of lidar system 100. As an example, a temperature sensor (e.g., a thermistor or a thermocouple) may be located near or may be thermally coupled to pump laser 1 or pump laser 2. The temperature sensor may measure a temperature of a block, mount, or chip carrier that pump laser 1 or pump laser 2 is attached to or thermally coupled to. As another example, a temperature sensor may be attached to or located near a part of an optical amplifier or lidar system 100. A temperature sensor may monitor the air temperature or an ambient temperature within an optical amplifier enclosure or a lidar-system enclosure, or a temperature sensor may be attached to part of an optical amplifier or part of a lidar system 100. For example, a temperature sensor may be attached to a part of amplifier 470 in FIG. 20 or FIG. 21, or a temperature sensor may be attached to a platform 905 of amplifier assembly 900 in FIG. 22.

In particular embodiments, an optical amplifier may include a single temperature sensor or may include multiple temperature sensors. For example, an optical amplifier may include one temperature sensor, and the temperature-dependent wavelength variation of pump laser 1 and pump laser 2 may be determined based on the temperature reading from the one temperature sensor. As another example, an optical amplifier may include one temperature sensor that monitors the temperature of pump laser 1 and another temperature sensor that monitors the temperature of pump laser 2. The temperature-dependent wavelength variation of each pump laser may be determined based on its associated temperature sensor.

In particular embodiments, the amount of optical power produced by pump laser 1 and pump laser 2 may be adjusted in response to a change in a temperature of pump laser 1, a change in a temperature of pump laser 2, or a change in a temperature of the optical amplifier. As an example, an optical amplifier (e.g., amplifier 470 in FIG. 20 or FIG. 21 or amplifier assembly 900 in FIG. 22) may include one temperature sensor. The amount of optical power produced by pump laser 1 may be adjusted in response to a temperature change determined from the temperature sensor. Similarly, the amount of optical power produced by pump laser 2 may be adjusted in response to a temperature change determined from the temperature sensor. As another example, an optical amplifier may include a first temperature sensor thermally coupled to pump laser 1 and a second temperature sensor thermally coupled to pump laser 2. The amount of optical power produced by pump laser 1 may be adjusted in response to a temperature change determined from the first temperature sensor. Similarly, the amount of optical power produced by pump laser 2 may be adjusted in response to a temperature change determined from the second temperature sensor. In particular embodiments, a temperature sensor may be electrically coupled to a pump-laser driver (e.g., pump-laser driver 938A or 938B in FIG. 22) or a controller, and the pump-laser driver or controller may receive or monitor a signal from the temperature sensor. As an example, a pump-laser driver or controller may determine that a temperature change has occurred (e.g., based on an electrical signal received from a temperature sensor), and the pump-laser driver or controller may adjust the current supplied to a pump laser in response to the temperature change.

In particular embodiments, the amounts of optical power produced by pump laser 1 and pump laser 2 may be adjusted in a reverse or opposite manner. As an example, if the amount of optical power produced by pump laser 1 is increased, then the amount of optical power produced by pump laser 2 may be decreased or may remain unchanged. Similarly, if the amount of optical power produced by pump laser 1 is decreased, then the amount of optical power produced by pump laser 2 may be increased or may remain unchanged. As another example, if pump laser 1 and pump laser 2 are each operating with an output optical power of approximately 5 W, then in response to an increase in the temperature of pump laser 1 or pump laser 2, a controller may increase the output power of pump laser 1 (e.g., to 6 W) and may decrease the output power of pump laser 2 (e.g., to 4 W). Similarly, in response to a decrease in the temperature of pump laser 1 or pump laser 2, a controller may decrease the output power of pump laser 1 and may increase the output power of pump laser 1. Increasing or decreasing the output power of a pump laser may include increasing or decreasing the electrical current supplied to the pump laser. For example, a controller may send a signal or instruction to a pump-laser driver to increase or decrease the electrical current.

In particular embodiments, adjusting the amount of optical power produced by a pump laser may include increasing the amount of optical power, decreasing the amount of optical power, or leaving the amount of optical power substantially unchanged. As an example, in response to an increase or decrease in the temperature of pump laser 1 or pump laser 2, a controller may increase or decrease the output power of pump laser 1 and may keep the output power of pump laser 2 substantially unchanged. As another example, if pump laser 1 and pump laser 2 are each operating with an output optical power of approximately 5 W, then in response to a decrease in the temperature of pump laser 1 or pump laser 2, a controller may increase the output power of pump laser 1 (e.g., to 7 W) and may leave the output power of pump laser 2 unchanged at 5 W.

Figures 24, 25:
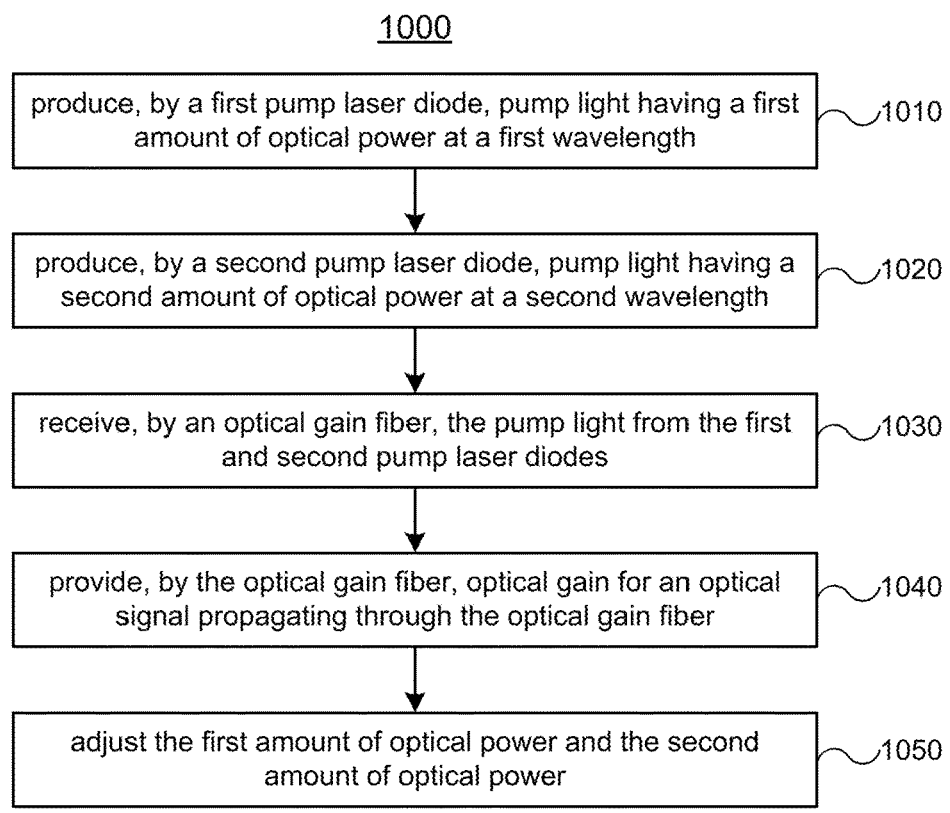
FIG. 24 illustrates an example lookup table for adjusting pump-laser current based on temperature.
FIG. 25 illustrates an example method for adjusting the optical power provided by pump lasers in an optical amplifier.

FIG. 24 illustrates an example lookup table for adjusting pump-laser current based on temperature. A lookup table may be determined during a factory calibration procedure and may be used to set the current or the output power of a pump laser based on a temperature reading. In particular embodiments, the amounts of optical power produced by pump laser 1 and pump laser 2 may be adjusted based on a lookup table. A lookup table may include drive currents for the pump lasers of an optical amplifier and one or more temperature values. For example, a lookup table may include temperature values for pump laser 1 and pump laser 2 along with corresponding drive current values for pump laser 1 and pump laser 2. The lookup table in FIG. 24 provides the electrical drive currents for pump laser 1 and pump laser 2 at different temperatures from 0° C. to 70° C. The temperature may correspond to the temperature of pump laser 1 or pump laser 2, a temperature of another part of the optical amplifier (e.g., a temperature of platform 905), or a temperature of the lidar system 100. As an example, if the temperature of pump laser 1 is 50° C., then the drive current for pump laser 1 may be set to 4 amps. If the temperature of pump laser 1 decreases to 40° C., then the drive current for pump laser 1 may be increased to 5 amps. As another example, if the temperature of platform 905 is 10° C., then the drive currents for pump laser 1 and pump laser 2 may be set to 8 amps and 3 amps, respectively. If the platform temperature increases to 20° C., then the drive currents for pump laser 1 and pump laser 2 may be changed to 7 amps and 4 amps, respectively.

In particular embodiments, the current settings for pump laser 1 and pump laser 2 may be adjusted in a reverse or opposite manner. As an example, from the lookup table in FIG. 24, as the temperature changes from 0° C. to 70° C., the current settings for pump laser 1 decrease from 8 amps to 2 amps, and the current settings for pump laser 2 increase from 2 amps to 8 amps. For some temperature changes, the values for pump-laser current in a lookup table may remain unchanged. For example, in FIG. 24, if the temperature changes from 0° C. to 10° C., the current for pump laser 1 remains fixed at 8 amps, while the current for pump laser 2 changes from 2 amps to 3 amps. In particular embodiments, a lookup table may include any suitable number of temperature and current entries with any suitable temperature interval between successive entries. As an example, a lookup table may include successive temperature values in increments of approximately 10° C. (as illustrated in FIG. 24), 5° C., 1° C., 0.5° C., or 0.1° C. In particular embodiments, setpoint values for pump-laser currents may be determined by interpolating between two adjacent setpoint values in a lookup table. As an example, based on FIG. 24, if the temperature is 25° C., then the currents for pump laser 1 and pump laser 2 may be set to approximately 6.5 amps and 4.5 amps, respectively.

In particular embodiments, an optical amplifier may include two or more pump laser diodes, where each pump laser diode emits light from a back facet that is received by a corresponding pump-laser detector (which may be referred to as a back-facet detector or a back-facet monitor). As an example, pump laser 1 and pump laser 2 in FIG. 20 or FIG. 21 may each include a pump-laser detector configured to receive back-facet light. In FIG. 22, back-facet light 932A from pump laser 1 is received by pump-laser detector 936A, and back-facet light 932B from pump laser 2 is received by pump-laser detector 936B. In particular embodiments, a controller may adjust the amount of optical power produced by a pump laser based at least in part on an electrical signal received from a pump-laser detector. As an example, in FIG. 22, the optical power produced by pump laser 1 and pump laser 2 may be adjusted based on electrical signals from pump-laser detector 936A and pump-laser detector 936B, respectively. The electrical signal from a pump-laser detector may correspond to the amount of back-facet light received by the detector, which in turn may correspond to the amount of optical power produced by the pump laser. For example, the electrical signal from pump-laser detector 936A may correspond to the optical power of pump-laser back-facet light 932A, which in turn may correspond to the optical power of pump-laser beam 934A.

In particular embodiments, a controller may adjust the amount of electrical current supplied to a pump laser based at least in part on an electrical signal received from a pump-laser detector. As an example, rather than supplying a substantially constant current to a pump laser, a controller may be configured to maintain a substantially constant output power from the pump laser by adjusting the pump-laser current in response to changes in the pump-laser detector signal. As a pump laser ages or as its performance degrades, it may produce less optical power for a particular current, and the controller may increase the current to the pump laser to maintain a substantially constant signal from the pump-laser detector (which may correspond to a substantially constant pump-laser output power). For example, a relatively new pump laser may produce 8 W of output power with a pump-laser current of 9 amps, and after 1,000 hours of operation, 10 amps of current may be required to produce the same 8-W output power. In particular embodiments, a controller may adjust the current to a pump laser based on a lookup table that relates a temperature with a pump-laser detector signal. If the temperature changes, rather than adjusting the current to a particular value based on the temperature, the controller may instead adjust the pump-laser current until a particular pump-laser detector signal is reached (which corresponds to a particular pump-laser output power).

In particular embodiments, the amount of optical power produced by one or more pump lasers may be adjusted in response to a change in an amount of residual pump light detected at or near an output end of an optical gain fiber. Rather than setting the pump-laser power or current based on a temperature measurement, the pump-laser power or current may be set based at least in part on a measurement of the power of residual pump light. Residual pump light may refer to pump light that reaches the output of a gain fiber without being absorbed while propagating through the gain fiber. The residual pump light may correspond to approximately 10%, 5%, 2%, 1%, 0.5%, 0.1%, or any other suitable percentage of the pump power at the input of a gain fiber. As an example, if the pump power at the input of a gain fiber is 10 W, approximately 9.8 W of the pump light may be absorbed by the gain fiber, and there may be approximately 200 mW of residual pump light, which corresponds to 2% of the input pump power.

In particular embodiments, the amount of residual pump light at the output end of a gain fiber may be determined using one or more detectors configured to receive at least part of the residual pump light. The residual pump light may include a combination of residual light from pump laser 1 and pump laser 2. The output end of a gain fiber (e.g., gain fiber 660 in FIG. 20 or FIG. 21, or gain fiber 960 in FIG. 22) may include one or more detectors configured to detect at least a portion of the residual pump light from pump laser 1 or pump laser 2. As an example, a coupler or filter located at the output end of a gain fiber may direct at least part of the residual pump light to one or more detectors (e.g., one filter may transmit light from pump laser 1 and block or reflect light from pump laser 2). As another example, a cladding power stripper located at the output end of a gain fiber may remove residual pump light from the gain fiber, and at least part of the residual light may be received by one or more detectors (e.g., a detector may include a filter that transmits light from pump laser 1 and blocks or reflects light from pump laser 2). As another example, one or more detectors may be coupled to one of the pump ports of a (N+1)×1 fiber-optic combiner, and the detectors may be used to detect residual pump light. For example, an optical amplifier may include two pump lasers located at opposite ends of a gain fiber (e.g., a co-propagating pump laser and a counter-propagating pump laser). The light from each pump laser may be combined with input light to be amplified using a (2+1)×1 fiber-optic combiner, and a detector may be coupled to the other pump port of the combiner. The detector may be used to detect residual pump light from the pump laser located at the opposite end of the gain fiber.

In particular embodiments, the output end of a gain fiber may include one detector (e.g., a silicon, germanium, or InGaAs PN or PIN photodiode) that receives at least part of the residual light and produces an electrical signal that corresponds to the amount of received residual light. For example, a silicon photodiode may be used to detect residual pump light, and the silicon photodiode (which may detect light between approximately 400 nm and approximately 1100 nm) may not be sensitive to the amplified light which may have a wavelength in the 1400-1600 nm range. In particular embodiments, the output end of a gain fiber may include two or more detectors configured to receive at least part of the residual light. As an example, an optical amplifier may include two pump lasers (e.g., pump laser 1 and pump laser 2), and two detectors may be located at or near the output end of the gain fiber. One detector may be configured to receive at least part of the residual light from pump laser 1, and the other detector may be configured to receive at least part of the residual light from pump laser 2. As an example, pump laser 1 and pump laser 2 may operate at different wavelengths, and each detector may include a filter that transmits light from one pump laser and blocks light from the other pump laser. For example, pump laser 1 may operate at a wavelength that varies from approximately 915 nm to approximately 935 nm as the temperature varies between 0° C. and 70° C., and pump laser 2 may operate from approximately 940 nm to approximately 960 nm. The output end of the gain fiber may include a first detector with a filter that transmits 915-935 nm light and blocks 940-960 nm light so that the detector receives light from pump laser 1. The output end of the gain fiber may include a second detector with a filter that blocks 915-935 nm light and transmits 940-960 nm light so that the detector receives light from pump laser 2. Using two detectors with filters may allow the residual light from pump laser 1 and the residual light from pump laser 2 to be detected or monitored separately. Additionally, using two detectors with filters may allow the absorption in the gain fiber of light from pump laser 1 and pump laser 2 to be monitored separately.

In particular embodiments, adjusting the amount of pump-laser power for an optical amplifier with two or more pump lasers may include increasing or decreasing the power of a pump laser based on a change in the amount of residual pump light for one or more of the pump lasers. As an example, for an optical amplifier with two pump lasers (e.g., pump laser 1 and pump laser 2), if the amount of residual pump light associated with pump laser 1 increases, then the power of pump laser 1 may be decreased. An increase in residual pump light may indicate that the wavelength of pump laser 1 has shifted to a wavelength with a lower absorption in the gain fiber, and the power of pump laser 1 may be reduced since a lower absorption corresponds to a reduced absorption efficiency of the gain fiber. Additionally or alternatively, if the amount of residual pump light associated with pump laser 1 increases, then the power of pump laser 2 may be increased to compensate for the reduced absorption of pump laser 1. As another example, if the amount of residual pump light associated with pump laser 1 decreases, then the power of pump laser 1 may be increased. A decrease in residual pump light may indicate that pump laser 1 has shifted to a higher-absorption wavelength, and the power of pump laser 1 may be increased to take advantage of the increased absorption efficiency of the gain fiber. Additionally or alternatively, if the amount of residual pump light associated with pump laser 1 decreases, then the power of pump laser 2 may be decreased to compensate for the increased absorption of pump laser 1.

In particular embodiments, the amount of optical power produced by one or more pump lasers may be adjusted in response to a change in an amount of power of an optical signal after propagating through an optical gain fiber. As an example, an optical signal that propagates through a gain fiber may include optical pulses at 1500-1600 nm which are amplified while propagating through the gain fiber. A portion of the amplified optical signal at the output end of the gain fiber may be received by a detector (e.g., similar to PD 610B in FIG. 20). If the power of the amplified optical signal decreases, then the power of pump laser 1 or pump laser 2 may be increased to increase the optical gain in the gain fiber (which may result in a corresponding increase in the power of the amplified optical signal). If the power of the amplified optical signal increases, then the power of pump laser 1 or pump laser 2 may be decreased to decrease the optical gain in the gain fiber.

In particular embodiments, an optical amplifier may include two or more pump laser diodes, and a controller may be configured to determine whether a pump laser diode has failed or is beginning to fail. As an example, an optical amplifier, a light source 110, or a lidar system 100 may include a controller configured to monitor or determine the health status of the pump lasers of the optical amplifier. If a pump laser is beginning to fail or has failed, then the optical power produced by the pump laser (at a particular pump-laser current) may decrease, or the current necessary to produce a particular output power may increase. As an example, a pump laser that is operating normally (e.g., the pump laser is not failing) may produce approximately 8 W of output power for a 10-amp pump-laser current. If the output power of the pump laser drops below a threshold value (e.g., if the output power drops below 7 W for a 10-amp pump current), then this may be an indication that the pump laser is beginning to fail. For a particular pump current, a decrease in the output power of a pump laser by a particular amount (e.g., a decrease with respect to a normal output power of greater than 5%, 10%, 20%, 40%, or any other suitable percentage) may indicate that the pump laser is beginning to fail. A decrease in the output power of a pump laser diode from 8 W to 7 W (for a particular pump-laser current) corresponds to a 12.5% decrease in output power. As another example, if the pump-laser current necessary to produce 8 W of output power increases above some threshold value (e.g., above 12 amps), then the pump laser may be beginning to fail. An increase in the pump-laser current necessary to produce a particular output power (e.g., an increase with respect to a normal current value of greater than 5%, 10%, 20%, 40%, or any other suitable percentage) may indicate that the pump laser is beginning to fail. An increase in the current necessary to produce 8 W of output power from 10 amps to 12 amps corresponds to a 20% increase in the pump-laser current.

In particular embodiments, the health status of a pump laser may be determined based on an electrical signal from a detector (e.g., a pump-laser detector) that receives a portion of light emitted by the pump laser. As an example, an optical amplifier may include two pump laser diodes (e.g., pump laser 1 and pump laser 2), and a controller or a pump-laser driver may receive electrical signals from two corresponding pump-laser detectors (e.g., pump-laser detectors 936A and 936B). A pump-laser detector may generate an electrical signal based on the amount of back-facet light received from a pump laser. If a pump laser is beginning to fail, the amount of received back-facet light may decrease, and the corresponding electrical signal from the pump-laser detector may change accordingly. A controller or pump-laser driver may monitor the electrical signal from a pump-laser detector to determine whether the associated pump laser is beginning to fail. In FIG. 22, for a particular pump-laser current applied to pump laser 1, if the electrical signal from pump-laser detector 936A drops below a threshold value (or drops by a particular percentage), then this may indicate that pump laser 1 is beginning to fail. Alternatively, if the pump-laser current necessary to maintain the electrical signal from the pump-laser detector 936A at a particular level increases above a threshold value (or increases by a particular percentage), then this may indicate that pump laser 1 is beginning to fail.

In particular embodiments, if one pump laser diode in an optical amplifier has failed or is beginning to fail, then the amount of optical power produced by another pump laser diode may be increased to compensate for the failing pump laser diode. Having two or more redundant pump laser diodes may improve the reliability of an optical amplifier since the optical amplifier may still be able to operate if one pump laser fails or begins to fail. The two pump lasers in FIG. 20, FIG. 21, or FIG. 22 may act as redundant pump lasers in case one of the other pump lasers fail. Two pump lasers which operate as redundant sources of pump light may operate at different wavelengths or may operate at substantially the same wavelength. In FIG. 22, if pump laser 1 is beginning to fail, then a controller may send an instruction to pump-laser driver 938B to increase the output power of pump laser 2. As an example, pump laser 1 and pump laser 2 may each be configured to produce 5 W of pump power. If pump laser 1 begins to fail and its output power drops to 2 W, then the current supplied to pump laser 2 may be increased so that pump laser 2 produces approximately 8 W. Additionally, if pump laser 1 fails and does not produce any significant output power, then the power of pump laser 2 may be increased to approximately 10 W.

In particular embodiments, if one pump laser diode is failing, then the current or the output power of another pump laser diode may be increased above a recommended maximum operating current or power. A maximum operating current or power may be based on information in a manufacturer's data sheet or user's manual. As an example, a pump laser may have a maximum recommended operating current of 10 amps or a maximum recommended operating power of 12 watts. The pump laser may be capable of operating above those maximum recommended values, but the lifetime of the pump laser may be shortened. For example, a pump laser operating with a current of 10 amps may have an estimated lifetime of greater than 10,000 hours, and overdriving the pump laser with a current of 12 amps may reduce the estimated lifetime to less than 1,000 hours. In FIG. 22, if pump laser 1 is failing or has failed, then pump laser 2 may be operated at a current or power that is above a maximum operating current or power. Running pump laser 2 above a maximum operating value may allow the optical amplifier to continue to operate, at the expense of a possible reduction in the lifetime of pump laser 2.

In particular embodiments, a controller may be configured to send a notification that a pump laser diode has failed or is beginning to fail. As an example, in FIG. 22, if pump laser 1 is failing, a controller may send a notification indicating that the lidar system 100 should be taken in for service (e.g., to repair or replace the pump laser, the optical amplifier, or the lidar system). The controller may send a notification to a server, a controller of a vehicle in which the lidar system is installed, or an operator of the vehicle in which the lidar system is installed. For example, the controller may send a notification indicating that the lidar system or the vehicle should be taken in for service. Additionally, the controller may send an instruction to increase the current or output power of pump laser 2 to compensate for the reduced power of pump laser 1 and to allow the optical amplifier to continue to operate until the optical amplifier can be repaired or replaced.

FIG. 25 illustrates an example method 1000 for adjusting the optical power provided by pump lasers in an optical amplifier. The method may begin at step 1010, where pump light having a first amount of optical power at a first wavelength is produced by a first pump laser diode. At step 1020, pump light having a second amount of optical power at a second wavelength is produced by a second pump laser diode. In particular embodiments, the first wavelength may be different from the second wavelength, or the first and second wavelengths may be substantially the same. As an example, pump laser 1 may produce approximately 5 W of optical power at approximately 920 nm, and pump laser 2 may produce approximately 5 W of optical power at approximately 950 nm. As another example, pump laser 1 and pump laser 2 may produce light at approximately the same wavelength (e.g., 940 nm±4 nm). At step 1030, an optical gain fiber (e.g., gain fiber 660, gain fiber 760, gain fiber 860, or gain fiber 960) may receive the pump light from the first and second pump laser diodes. At step 1040, the gain fiber may provide optical gain for an optical signal propagating through the gain fiber. As an example, 900-1000 nm light from two or more pump lasers may be absorbed by gain material in the gain fiber, and an optical signal that includes 1500-1600 nm optical pulses may be amplified while propagating through the gain fiber. At step 1050, a controller (e.g., controller 150 in lidar system 100, or another processor located in the optical amplifier or the lidar system 100) may adjust the first amount of optical power produced by the first pump laser diode and the second amount of optical power produced by the second pump laser diode, at which point the method 1000 may end. In particular embodiments, the first and second amounts of optical power may be adjusted in response to measuring a change in an ambient temperature (e.g., a temperature of the optical amplifier or of the lidar system 100), a temperature of the first pump laser diode, or a temperature of the second pump laser diode. As an example, if the temperature increases, then the first amount of optical power may be increased or may remain unchanged, or the second amount of optical power may be decreased or may remain unchanged. If the temperature decreases, then the first amount of optical power may be decreased or may remain unchanged, or the second amount of optical power may be increased or may remain unchanged. In particular embodiments, the first and second amounts of optical power may be adjusted in response to determining that the first pump laser diode is beginning to fail. As an example, if pump laser 1 is beginning to fail, the amount of optical power produced pump laser 2 may be increased to compensate for the failing pump laser 1. In particular embodiments, increasing the amount of optical power produced by pump laser 2 may include operating pump laser 2 above a recommended maximum operating current or power.

Figure 26:
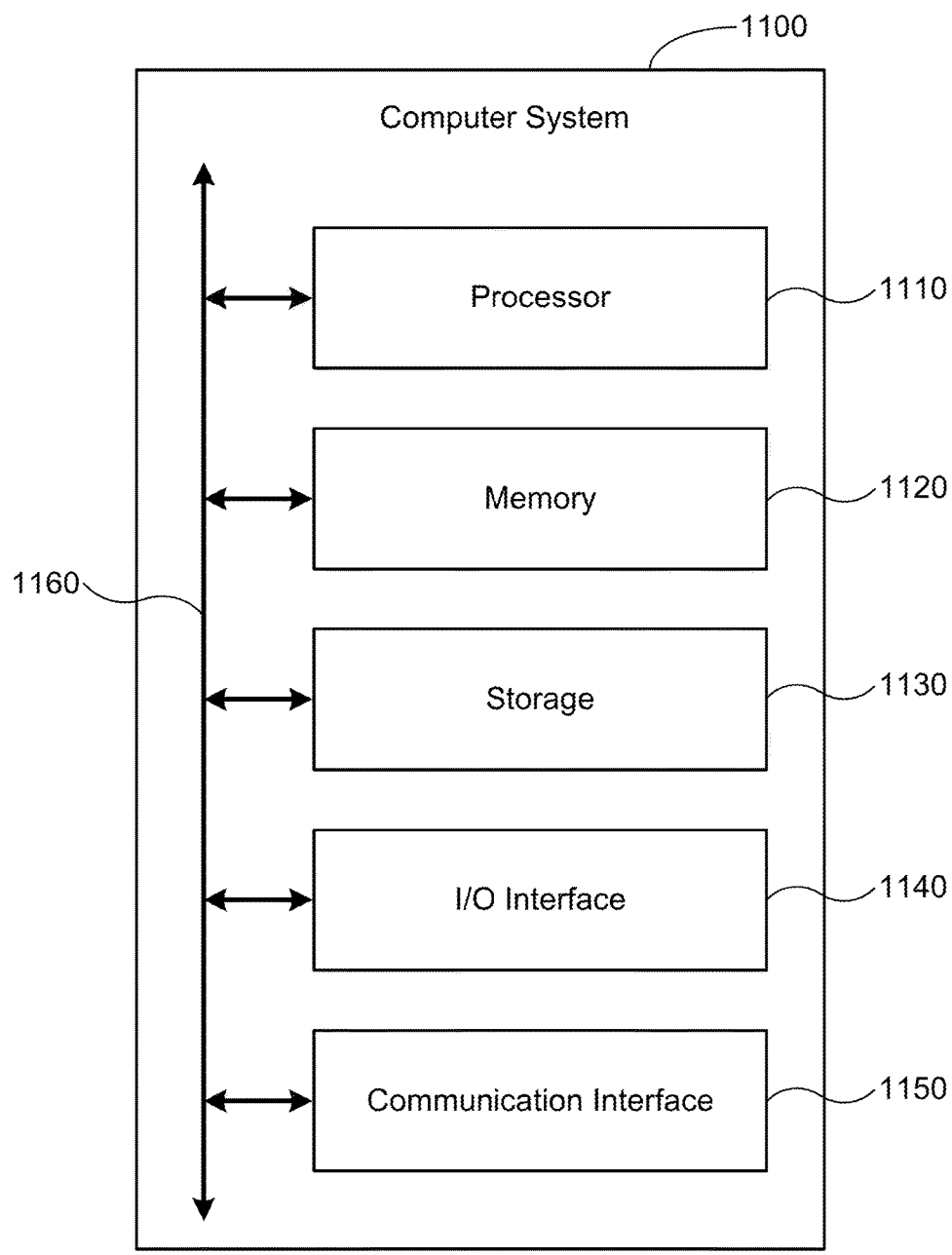
FIG. 26 illustrates an example computer system.

FIG. 26 illustrates an example computer system 1100. In particular embodiments, one or more computer systems 1100 may perform one or more steps of one or more methods described or illustrated herein. In particular embodiments, one or more computer systems 1100 may provide functionality described or illustrated herein. In particular embodiments, software running on one or more computer systems 1100 may perform one or more steps of one or more methods described or illustrated herein or may provide functionality described or illustrated herein. Particular embodiments may include one or more portions of one or more computer systems 1100. In particular embodiments, a computer system may be referred to as a processor, a controller, a computing device, a computing system, a computer, a general-purpose computer, or a data-processing apparatus. Herein, reference to a computer system may encompass one or more computer systems, where appropriate.

Computer system 1100 may take any suitable physical form. As an example, computer system 1100 may be an embedded computer system, a system-on-chip (SOC), a single-board computer system (SBC), a desktop computer system, a laptop or notebook computer system, a mainframe, a mesh of computer systems, a server, a tablet computer system, or any suitable combination of two or more of these. As another example, all or part of computer system 1100 may be combined with, coupled to, or integrated into a variety of devices, including, but not limited to, a camera, camcorder, personal digital assistant (PDA), mobile telephone, smartphone, electronic reading device (e.g., an e-reader), game console, smart watch, clock, calculator, television monitor, flat-panel display, computer monitor, vehicle display (e.g., odometer display or dashboard display), vehicle navigation system, lidar system, ADAS, autonomous vehicle, autonomous-vehicle driving system, cockpit control, camera view display (e.g., display of a rear-view camera in a vehicle), eyewear, or head-mounted display. Where appropriate, computer system 1100 may include one or more computer systems 1100; be unitary or distributed; span multiple locations; span multiple machines; span multiple data centers; or reside in a cloud, which may include one or more cloud components in one or more networks. Where appropriate, one or more computer systems 1100 may perform without substantial spatial or temporal limitation one or more steps of one or more methods described or illustrated herein. As an example, one or more computer systems 1100 may perform in real time or in batch mode one or more steps of one or more methods described or illustrated herein. One or more computer systems 1100 may perform at different times or at different locations one or more steps of one or more methods described or illustrated herein, where appropriate.

As illustrated in the example of FIG. 26, computer system 1100 may include a processor 1110, memory 1120, storage 1130, an input/output (I/O) interface 1140, a communication interface 1150, or a bus 1160. Computer system 1100 may include any suitable number of any suitable components in any suitable arrangement.

In particular embodiments, processor 1110 may include hardware for executing instructions, such as those making up a computer program. As an example, to execute instructions, processor 1110 may retrieve (or fetch) the instructions from an internal register, an internal cache, memory 1120, or storage 1130; decode and execute them; and then write one or more results to an internal register, an internal cache, memory 1120, or storage 1130. In particular embodiments, processor 1110 may include one or more internal caches for data, instructions, or addresses. Processor 1110 may include any suitable number of any suitable internal caches, where appropriate. As an example, processor 1110 may include one or more instruction caches, one or more data caches, or one or more translation lookaside buffers (TLBs). Instructions in the instruction caches may be copies of instructions in memory 1120 or storage 1130, and the instruction caches may speed up retrieval of those instructions by processor 1110. Data in the data caches may be copies of data in memory 1120 or storage 1130 for instructions executing at processor 1110 to operate on; the results of previous instructions executed at processor 1110 for access by subsequent instructions executing at processor 1110 or for writing to memory 1120 or storage 1130; or other suitable data. The data caches may speed up read or write operations by processor 1110. The TLBs may speed up virtual-address translation for processor 1110. In particular embodiments, processor 1110 may include one or more internal registers for data, instructions, or addresses. Processor 1110 may include any suitable number of any suitable internal registers, where appropriate. Where appropriate, processor 1110 may include one or more arithmetic logic units (ALUs); may be a multi-core processor; or may include one or more processors 1110.

In particular embodiments, memory 1120 may include main memory for storing instructions for processor 1110 to execute or data for processor 1110 to operate on. As an example, computer system 1100 may load instructions from storage 1130 or another source (such as, for example, another computer system 1100) to memory 1120. Processor 1110 may then load the instructions from memory 1120 to an internal register or internal cache. To execute the instructions, processor 1110 may retrieve the instructions from the internal register or internal cache and decode them. During or after execution of the instructions, processor 1110 may write one or more results (which may be intermediate or final results) to the internal register or internal cache. Processor 1110 may then write one or more of those results to memory 1120. One or more memory buses (which may each include an address bus and a data bus) may couple processor 1110 to memory 1120. Bus 1160 may include one or more memory buses. In particular embodiments, one or more memory management units (MMUs) may reside between processor 1110 and memory 1120 and facilitate accesses to memory 1120 requested by processor 1110. In particular embodiments, memory 1120 may include random access memory (RAM). This RAM may be volatile memory, where appropriate. Where appropriate, this RAM may be dynamic RAM (DRAM) or static RAM (SRAM). Memory 1120 may include one or more memories 1120, where appropriate.

In particular embodiments, storage 1130 may include mass storage for data or instructions. As an example, storage 1130 may include a hard disk drive (HDD), a floppy disk drive, flash memory, an optical disc, a magneto-optical disc, magnetic tape, or a Universal Serial Bus (USB) drive or a combination of two or more of these. Storage 1130 may include removable or non-removable (or fixed) media, where appropriate. Storage 1130 may be internal or external to computer system 1100, where appropriate. In particular embodiments, storage 1130 may be non-volatile, solid-state memory. In particular embodiments, storage 1130 may include read-only memory (ROM). Where appropriate, this ROM may be mask ROM (MROM), programmable ROM (PROM), erasable PROM (EPROM), electrically erasable PROM (EEPROM), flash memory, or a combination of two or more of these. Storage 1130 may include one or more storage control units facilitating communication between processor 1110 and storage 1130, where appropriate. Where appropriate, storage 1130 may include one or more storages 1130.

In particular embodiments, I/O interface 1140 may include hardware, software, or both, providing one or more interfaces for communication between computer system 1100 and one or more I/O devices. Computer system 1100 may include one or more of these I/O devices, where appropriate. One or more of these I/O devices may enable communication between a person and computer system 1100. As an example, an I/O device may include a keyboard, keypad, microphone, monitor, mouse, printer, scanner, speaker, camera, stylus, tablet, touch screen, trackball, another suitable I/O device, or any suitable combination of two or more of these. An I/O device may include one or more sensors. Where appropriate, I/O interface 1140 may include one or more device or software drivers enabling processor 1110 to drive one or more of these I/O devices. I/O interface 1140 may include one or more I/O interfaces 1140, where appropriate.

In particular embodiments, communication interface 1150 may include hardware, software, or both providing one or more interfaces for communication (such as, for example, packet-based communication) between computer system 1100 and one or more other computer systems 1100 or one or more networks. As an example, communication interface 1150 may include a network interface controller (NIC) or network adapter for communicating with an Ethernet or other wire-based network or a wireless NIC (WNIC); a wireless adapter for communicating with a wireless network, such as a WI-FI network; or an optical transmitter (e.g., a laser or a light-emitting diode) or an optical receiver (e.g., a photodetector) for communicating using fiber-optic communication or free-space optical communication. Computer system 1100 may communicate with an ad hoc network, a personal area network (PAN), an in-vehicle network (IVN), a local area network (LAN), a wide area network (WAN), a metropolitan area network (MAN), or one or more portions of the Internet or a combination of two or more of these. One or more portions of one or more of these networks may be wired or wireless. As an example, computer system 1100 may communicate with a wireless PAN (WPAN) (such as, for example, a BLUETOOTH WPAN), a WI-FI network, a Worldwide Interoperability for Microwave Access (WiMAX) network, a cellular telephone network (such as, for example, a Global System for Mobile Communications (GSM) network), or other suitable wireless network or a combination of two or more of these. As another example, computer system 1100 may communicate using fiber-optic communication based on 100 Gigabit Ethernet (100 GbE), 10 Gigabit Ethernet (10 GbE), or Synchronous Optical Networking (SONET). Computer system 1100 may include any suitable communication interface 1150 for any of these networks, where appropriate. Communication interface 1150 may include one or more communication interfaces 1150, where appropriate.

In particular embodiments, bus 1160 may include hardware, software, or both coupling components of computer system 1100 to each other. As an example, bus 1160 may include an Accelerated Graphics Port (AGP) or other graphics bus, a controller area network (CAN) bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local bus (VLB), or another suitable bus or a combination of two or more of these. Bus 1160 may include one or more buses 1160, where appropriate.

In particular embodiments, various modules, circuits, systems, methods, or algorithm steps described in connection with the implementations disclosed herein may be implemented as electronic hardware, computer software, or any suitable combination of hardware and software. In particular embodiments, computer software (which may be referred to as software, computer-executable code, computer code, a computer program, computer instructions, or instructions) may be used to perform various functions described or illustrated herein, and computer software may be configured to be executed by or to control the operation of computer system 1100. As an example, computer software may include instructions configured to be executed by processor 1110. In particular embodiments, owing to the interchangeability of hardware and software, the various illustrative logical blocks, modules, circuits, or algorithm steps have been described generally in terms of functionality. Whether such functionality is implemented in hardware, software, or a combination of hardware and software may depend upon the particular application or design constraints imposed on the overall system.

In particular embodiments, a computing device may be used to implement various modules, circuits, systems, methods, or algorithm steps disclosed herein. As an example, all or part of a module, circuit, system, method, or algorithm disclosed herein may be implemented or performed by a general-purpose single- or multi-chip processor, a digital signal processor (DSP), an ASIC, a FPGA, any other suitable programmable-logic device, discrete gate or transistor logic, discrete hardware components, or any suitable combination thereof. A general-purpose processor may be a microprocessor, or, any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In particular embodiments, one or more implementations of the subject matter described herein may be implemented as one or more computer programs (e.g., one or more modules of computer-program instructions encoded or stored on a computer-readable non-transitory storage medium). As an example, the steps of a method or algorithm disclosed herein may be implemented in a processor-executable software module which may reside on a computer-readable non-transitory storage medium. In particular embodiments, a computer-readable non-transitory storage medium may include any suitable storage medium that may be used to store or transfer computer software and that may be accessed by a computer system. Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs (e.g., compact discs (CDs), CD-ROM, digital versatile discs (DVDs), blue-ray discs, or laser discs), optical disc drives (ODDs), magneto-optical discs, magneto-optical drives, floppy diskettes, floppy disk drives (FDDs), magnetic tapes, flash memories, solid-state drives (SSDs), RAM, RAM-drives, ROM, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

In particular embodiments, certain features described herein in the context of separate implementations may also be combined and implemented in a single implementation. Conversely, various features that are described in the context of a single implementation may also be implemented in multiple implementations separately or in any suitable sub-combination. Moreover, although features may be described above as acting in certain combinations and even initially claimed as such, one or more features from a claimed combination may in some cases be excised from the combination, and the claimed combination may be directed to a sub-combination or variation of a sub-combination.

While operations may be depicted in the drawings as occurring in a particular order, this should not be understood as requiring that such operations be performed in the particular order shown or in sequential order, or that all operations be performed. Further, the drawings may schematically depict one more example processes or methods in the form of a flow diagram or a sequence diagram. However, other operations that are not depicted may be incorporated in the example processes or methods that are schematically illustrated. For example, one or more additional operations may be performed before, after, simultaneously with, or between any of the illustrated operations. Moreover, one or more operations depicted in a diagram may be repeated, where appropriate. Additionally, operations depicted in a diagram may be performed in any suitable order. Furthermore, although particular components, devices, or systems are described herein as carrying out particular operations, any suitable combination of any suitable components, devices, or systems may be used to carry out any suitable operation or combination of operations. In certain circumstances, multitasking or parallel processing operations may be performed. Moreover, the separation of various system components in the implementations described herein should not be understood as requiring such separation in all implementations, and it should be understood that the described program components and systems may be integrated together in a single software product or packaged into multiple software products.

Various embodiments have been described in connection with the accompanying drawings. However, it should be understood that the figures may not necessarily be drawn to scale. As an example, distances or angles depicted in the figures are illustrative and may not necessarily bear an exact relationship to actual dimensions or layout of the devices illustrated.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes or illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend.

The term "or" as used herein is to be interpreted as an inclusive or meaning any one or any combination, unless expressly indicated otherwise or indicated otherwise by context. Therefore, herein, the expression "A or B" means "A, B, or both A and B." As another example, herein, "A, B or C" means at least one of the following: A; B; C; A and B; A and C; B and C; A, B and C. An exception to this definition will occur if a combination of elements, devices, steps, or operations is in some way inherently mutually exclusive.

As used herein, words of approximation such as, without limitation, "approximately, "substantially," or "about" refer to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skill in the art recognize the modified feature as having the required characteristics or capabilities of the unmodified feature. In general, but subject to the preceding discussion, a numerical value herein that is modified by a word of approximation such as "approximately" may vary from the stated value by ±0.5%, ±1%, ±2%, ±3%, ±4%, ±5%, ±10%, ±12%, or ±15%.

As used herein, the terms "first," "second," "third," etc. may be used as labels for nouns that they precede, and these terms may not necessarily imply a particular ordering (e.g., a particular spatial, temporal, or logical ordering). As an example, a system may be described as determining a "first result" and a "second result," and the terms "first" and "second" may not necessarily imply that the first result is determined before the second result.

As used herein, the terms "based on" and "based at least in part on" may be used to describe or present one or more factors that affect a determination, and these terms may not exclude additional factors that may affect a determination. A determination may be based solely on those factors which are presented or may be based at least in part on those factors. The phrase "determine A based on B" indicates that B is a factor that affects the determination of A. In some instances, other factors may also contribute to the determination of A. In other instances, A may be determined based solely on B.

What is claimed is:

1. A laser system comprising:
a seed laser diode configured to produce a free-space seed-laser beam, wherein the seed laser diode is thermally coupled to a thermoelectric cooler configured to stabilize a temperature of the seed laser diode;
a pump laser diode configured to produce a free-space pump-laser beam;
an optical-beam combiner configured to combine the seed-laser and pump-laser beams into a combined free-space beam;
a focusing lens configured to focus the combined beam;
an optical gain fiber comprising an input end configured to receive the focused beam; and a mounting platform, wherein one or more of the optical-beam combiner, the focusing lens, and the input end of the optical gain fiber are mechanically attached to the mounting platform.

2. The laser system of claim 1, wherein:
the pump laser diode is a first pump laser diode; and
the laser system further comprises:
a second pump laser diode; and
a pump-laser optical-beam combiner configured to combine light from the first pump laser diode and light from the second pump laser diode to form the free-space pump-laser beam.

3. The laser system of claim 2, wherein:
the laser system further comprises a half-wave plate configured to rotate a polarization of the light from the second pump laser diode to be approximately orthogonal to a polarization of the light from the first pump laser diode; and
the pump-laser optical-beam combiner is a polarization combiner configured to combine the orthogonally polarized light from the first and second pump laser diodes.

4. The laser system of claim 1, wherein the pump laser diode is thermally coupled to a thermoelectric cooler configured to stabilize a temperature of the pump laser diode.

5. The laser system of claim 1, wherein the pump laser diode is mechanically attached to the platform, wherein the pump laser diode is passively cooled by being thermally coupled to the platform.

6. The laser system of claim 1, wherein the platform is in thermal contact with a thermally conductive object configured to receive or dissipate heat from the platform.

7. The laser system of claim 1, wherein the platform is thermally coupled to a thermoelectric cooler configured to remove excess heat from the platform or maintain the platform at a substantially constant temperature.

8. The laser system of claim 1, wherein the platform is thermally coupled to a thermoelectric cooler (TEC), wherein when a temperature of the platform reaches or exceeds a particular maximum temperature, the TEC is activated to keep the temperature of the platform at or below the particular maximum temperature.

9. The laser system of claim 1, wherein the platform is thermally coupled to a heating element, wherein when a temperature of the platform reaches or goes below a particular minimum temperature, the heating element is activated to keep the temperature of the platform at or above the particular minimum temperature.

10. The laser system of claim 1, wherein the optical gain fiber comprises a section of relay fiber and a gain-fiber section, wherein the relay fiber is configured to receive the focused beam and convey light from the seed-laser beam and pump-laser beam to the gain-fiber section.

11. The laser system of claim 10, wherein the relay fiber comprises a fiber Bragg grating configured to reflect a portion of the light from the pump-laser beam back to the pump laser diode.

12. The laser system of claim 1, further comprising a seed-laser detector configured to receive light emitted from a back facet of the seed laser diode.

13. The laser system of claim 1, further comprising a pump-laser detector configured to receive light emitted from a back facet of the pump laser diode.

14. The laser system of claim 1, wherein:
the seed laser diode is mechanically attached to the mounting platform;
the pump laser diode is mechanically attached to the mounting platform; and
the laser system further comprises:
a seed-laser lens configured to collimate the seed-laser beam; and
a pump-laser lens configured to collimate the pump-laser beam.

15. The laser system of claim 1, wherein the mounting platform comprises a glass, ceramic, semiconductor, or metal material having a relatively low coefficient of thermal expansion or a relatively high thermal conductivity.

16. The laser system of claim 1, wherein the mounting platform comprises one or more mechanical registration features configured to define a fixed position on the mounting platform for each of one or more of the seed laser diode, the pump laser diode, the optical-beam combiner, the focusing lens, and the input end of the optical gain fiber.

17. The laser system of claim 1, wherein each of the optical-beam combiner, the focusing lens, and the input end of the optical gain fiber are mechanically attached to the mounting platform using either a passive-alignment technique or an active-alignment technique.

18. The laser system of claim 1, wherein one or more of the optical-beam combiner, the focusing lens, and the input end of the optical gain fiber are mechanically attached to the mounting platform by epoxy, solder, or one or more mechanical fasteners.

19. The laser system of claim 1, wherein:
the seed laser diode is configured to produce light at a wavelength between approximately 1400 nm and approximately 1600 nm; and
the pump laser diode is configured to produce light at a wavelength between approximately 900 nm and approximately 1000 nm.

20. The laser system of claim 1, wherein the seed laser diode is configured to be operated in a pulsed mode wherein the seed-laser beam comprises optical pulses having a pulse duration less than or equal to 100 nanoseconds and a duty cycle less than or equal to 10%.

21. The laser system of claim 1, wherein the optical gain fiber is configured to:
absorb, by a gain material of the optical gain fiber, at least part of the pump-laser portion of the received beam; and
amplify, by the gain material, the seed-laser portion of the received beam.

22. The laser system of claim 1, wherein the input end of the optical gain fiber comprises an input face with an anti-reflection coating having a low optical reflectivity at a wavelength of the seed laser diode or a wavelength of the pump laser diode.

23. The laser system of claim 1, wherein the laser system is part of a lidar system comprising a scanner and a receiver, wherein:
the laser system provides pulses of light to the scanner;
the scanner is configured to scan at least a portion of the pulses of light across a field of regard of the lidar system; and
the receiver is configured to detect at least a portion of the scanned pulses of light scattered by a target located a distance from the lidar system.

24. A laser system comprising:
a seed laser diode configured to produce a free-space seed-laser beam;
a pump laser diode configured to produce a free-space pump-laser beam;

an optical-beam combiner configured to combine the seed-laser and pump-laser beams into a combined free-space beam;
a focusing lens configured to focus the combined beam;
an optical gain fiber comprising an input end configured to receive the focused beam;
a mounting platform, wherein one or more of the optical-beam combiner, the focusing lens, and the input end of the optical gain fiber are mechanically attached to the mounting platform, wherein the seed laser diode is located remotely from the platform, and wherein light from the seed laser diode is delivered to the platform by an optical fiber, and an end of the optical fiber is mechanically attached to the platform; and
a seed-laser lens configured to collect the seed-laser light from the end of the optical fiber and produce the free-space seed-laser beam.

25. A laser system comprising:
a seed laser diode configured to produce a free-space seed-laser beam;
a pump laser diode configured to produce a free-space pump-laser beam;
an optical-beam combiner configured to combine the seed-laser and pump-laser beams into a combined free-space beam;
a focusing lens configured to focus the combined beam;
an optical gain fiber comprising an input end configured to receive the focused beam;
a mounting platform, wherein one or more of the optical-beam combiner, the focusing lens, and the input end of the optical gain fiber are mechanically attached to the mounting platform, wherein the pump laser diode is located remotely from the platform, and wherein light from the pump laser diode is delivered to the platform by an optical fiber, and an end of the optical fiber is mechanically attached to the platform; and
a pump-laser lens configured to collect the pump-laser light from the end of the optical fiber and produce the free-space pump-laser beam.

26. A laser system comprising:
a first seed laser diode configured to produce light at a first seed-laser wavelength;
a second seed laser diode configured to produce light at a second seed-laser wavelength different from the first seed-laser wavelength;
a seed-laser optical-beam combiner configured to combine the light from the first seed laser diode and the light from the second seed laser diode to form a free-space seed-laser beam;
a pump laser diode configured to produce a free-space pump-laser beam;
an optical-beam combiner configured to combine the seed-laser and pump-laser beams into a combined free-space beam;
a focusing lens configured to focus the combined beam;
an optical gain fiber comprising an input end configured to receive the focused beam; and
a mounting platform, wherein one or more of the optical-beam combiner, the focusing lens, and the input end of the optical gain fiber are mechanically attached to the mounting platform.

27. A laser system comprising:
a seed laser diode configured to produce a free-space seed-laser beam;
a pump laser diode configured to produce a free-space pump-laser beam;
an optical-beam combiner configured to combine the seed-laser and pump-laser beams into a combined free-space beam;
an optical filter located between the seed laser diode and the optical-beam combiner, wherein the optical filter is configured to transmit light at one or more wavelengths of the free-space seed-laser beam and reflect or attenuate light at one or more other wavelengths;
a focusing lens configured to focus the combined beam;
an optical gain fiber comprising an input end configured to receive the focused beam; and
a mounting platform, wherein one or more of the optical-beam combiner, the focusing lens, and the input end of the optical gain fiber are mechanically attached to the mounting platform.

28. A laser system comprising:
a seed laser diode configured to produce a free-space seed-laser beam;
a pump laser diode configured to produce a free-space pump-laser beam;
a pump-laser detector configured to receive light emitted from a back facet of the pump laser diode;
a pump-laser driver configured to:
  supply an amount of electrical current to the pump laser diode; and
  in response to detecting a decrease in a signal produced by the pump-laser detector, increase the amount of electrical current supplied to the pump laser diode;
an optical-beam combiner configured to combine the seed-laser and pump-laser beams into a combined free-space beam;
a focusing lens configured to focus the combined beam;
an optical gain fiber comprising an input end configured to receive the focused beam; and
a mounting platform, wherein one or more of the optical-beam combiner, the focusing lens, and the input end of the optical gain fiber are mechanically attached to the mounting platform.

29. The laser system of claim 28, wherein the pump-laser driver is further configured to send a notification indicating that the pump laser diode is degrading or is close to failure when the amount of electrical current supplied to the pump laser diode exceeds a particular threshold current.

\* \* \* \* \*